United States Patent [19]

Jacobs

[11] Patent Number: 4,505,551

[45] Date of Patent: Mar. 19, 1985

[54] ILLUMINATION AND LIGHT GATE UTILIZATION METHODS AND APPARATUS

[75] Inventor: John H. Jacobs, Altadena, Calif.

[73] Assignee: Transamerica Delaval Inc., Lawrenceville, N.J.

[21] Appl. No.: 98,430

[22] Filed: Nov. 29, 1979

Related U.S. Application Data

[60] Continuation of Ser. No. 925,132, Jul. 17, 1978, abandoned, which is a division of Ser. No. 776,157, Mar. 10, 1977, abandoned.

[51] Int. Cl.³ .......................... G02F 1/03; G01D 5/32; F21V 7/09
[52] U.S. Cl. .................................... 350/384; 346/108; 350/392; 350/619; 362/346
[58] Field of Search ................. 350/331 R, 334, 333, 350/356, 376–377, 392, 384, 299, 55, 169, 171, 271, 291, 293–294, 299–300; 365/234–235, ; 358/202, 204, 213, 232, 225, 241, 293, 296; 340/108, 146.3 F, 146.3 G, 146.3 MA; 250/237 R; 362/346, 298–302

[56] References Cited

U.S. PATENT DOCUMENTS

| | | | |
|---|---|---|---|
| 969,785 | 9/1910 | Kellner | 362/308 |
| 1,473,307 | 11/1923 | McGrath | 362/308 |
| 2,290,651 | 7/1942 | Peck | 358/232 |
| 2,909,972 | 10/1959 | De Lano, Jr. | 346/107 R |
| 3,020,805 | 2/1962 | Goddard | 350/270 |
| 3,430,212 | 2/1969 | Max et al. | 346/108 |
| 3,626,511 | 12/1971 | Hammer | 350/356 |
| 3,810,199 | 5/1974 | Torguet | 346/108 |
| 3,930,119 | 12/1975 | Schmidt et al. | 350/356 |
| 4,050,444 | 9/1977 | Dolamore | 350/293 |
| 4,054,364 | 10/1977 | Webster | 350/294 |
| 4,107,740 | 8/1978 | Gooley | 358/293 |
| 4,220,978 | 9/1980 | Rhyins et al. | 358/225 |

FOREIGN PATENT DOCUMENTS

| | | |
|---|---|---|
| 47835 | 3/1921 | Sweden . |
| 1120574 | 7/1968 | United Kingdom . |
| 421034 | 8/1974 | U.S.S.R. .............................. 346/108 |

OTHER PUBLICATIONS

Sincerbox, G. T., "Formation of Optical Elements by Holography", IBM Tech. Disc. Bull., 8-1967, pp. 267–268.
Clark, W. D., "Copier Printhead", IBM Tech. Disc. Bulletin, 12-1976, p. 2447.
Cutchen et al., "PLZT Electrooptic Shutters: Applications App. Optics, vol. 11, 8-1975, pp. 1866–1873.
Gilmore, W. F., "Printed Circuit Generator", IBM Tech. Disc. Bulletin, vol. 12, 12-1969, p. 922.
Muirhead et al., "Improvement in Spark Shadow Graph Technique", Rev. of Scientific Instruments, 9-1959, pp. 830–831.
King, W. B., "Unobscured Laser-Beam-Expander Pointing System with Tilted Spherical Mirrors", App. Optics, 1-1974, pp. 21–22.

*Primary Examiner*—William H. Punter
*Attorney, Agent, or Firm*—Benoit Law Corporation

[57] ABSTRACT

A method of selectively illuminating a surface, such as a light-sensitive recording medium or an information record, provides a slit traveling transversely to a longitudinal dimension thereof and images light from a source of spatially concentrated light through the slit onto the above mentioned surface anamorphically only as to a dimension of the spatially concentrated light corresponding to the longitudinal dimension of the slit. Light is further spread from the source in a plane parallel to the transverse travel of the slit and is collimated, to be projected through the slit onto the above mentioned surface and for the extent of at least a portion of the transverse travel of the slit.

176 Claims, 24 Drawing Figures

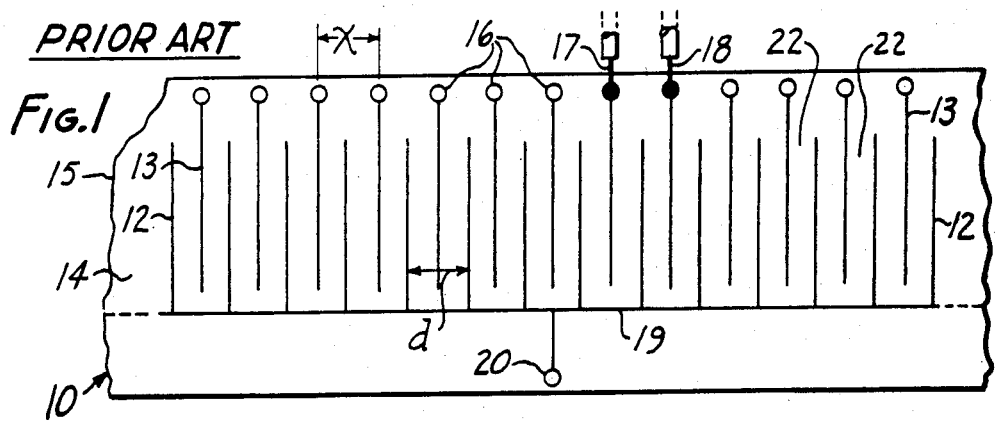
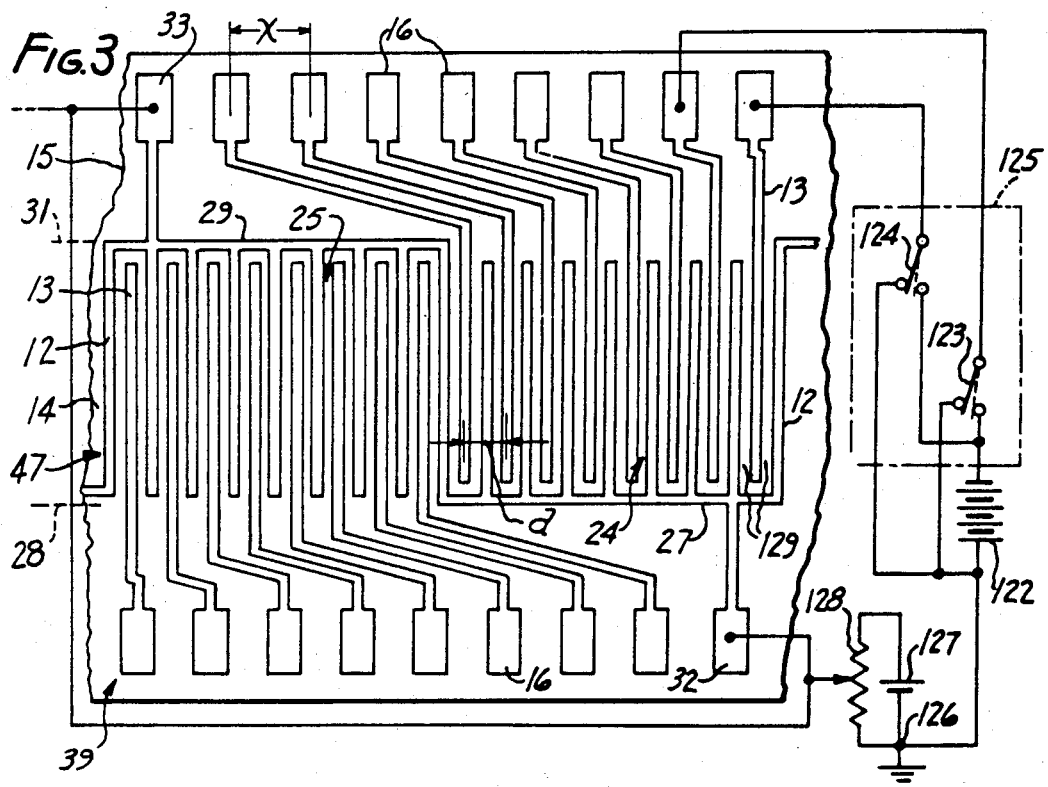

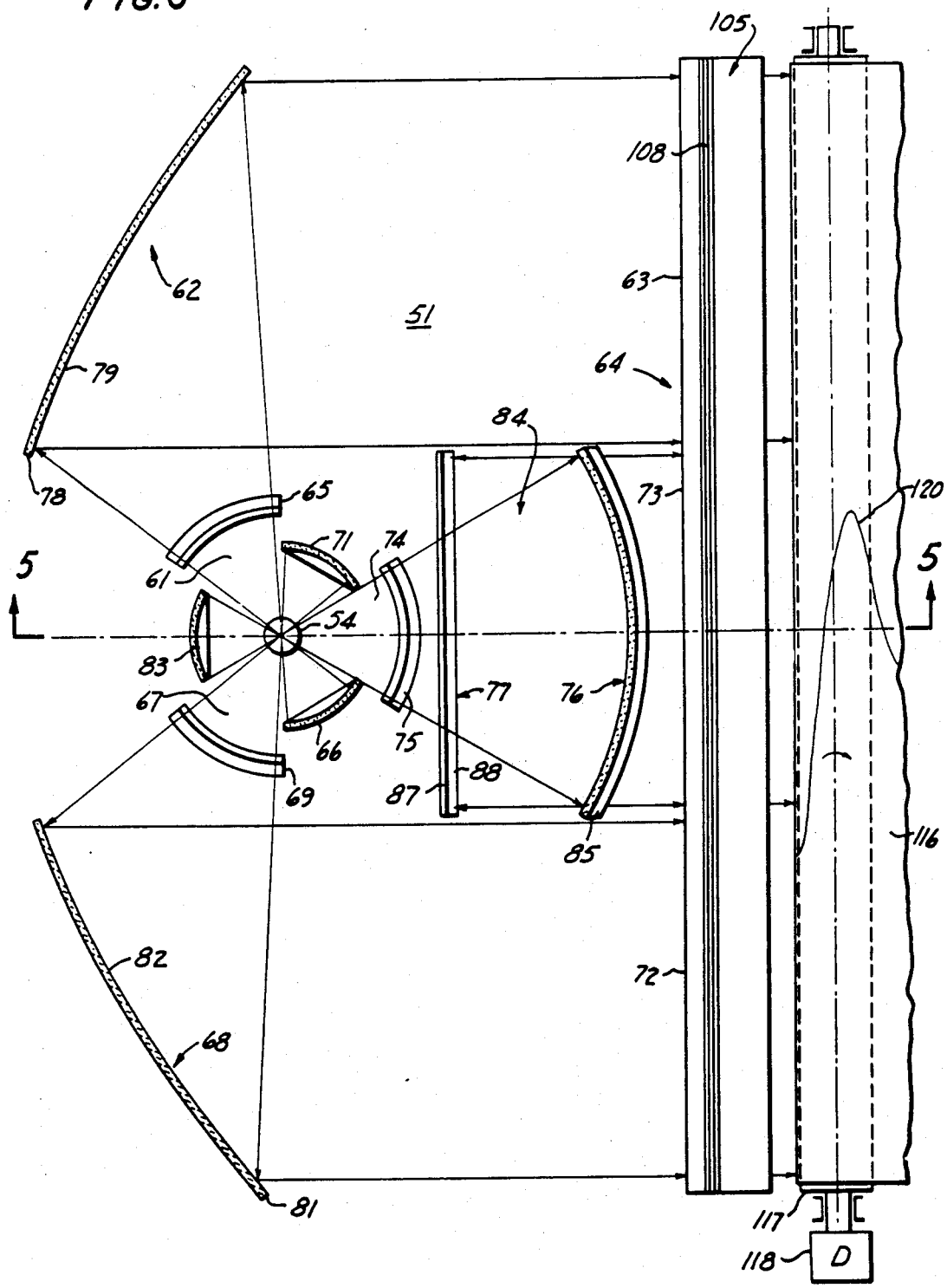

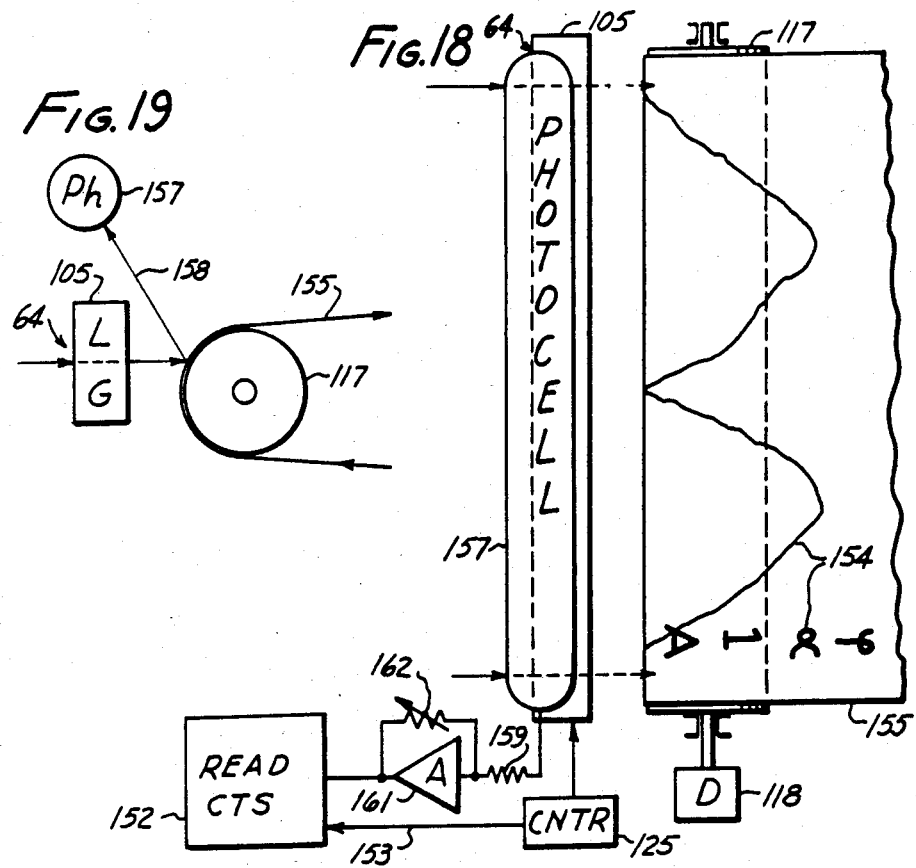
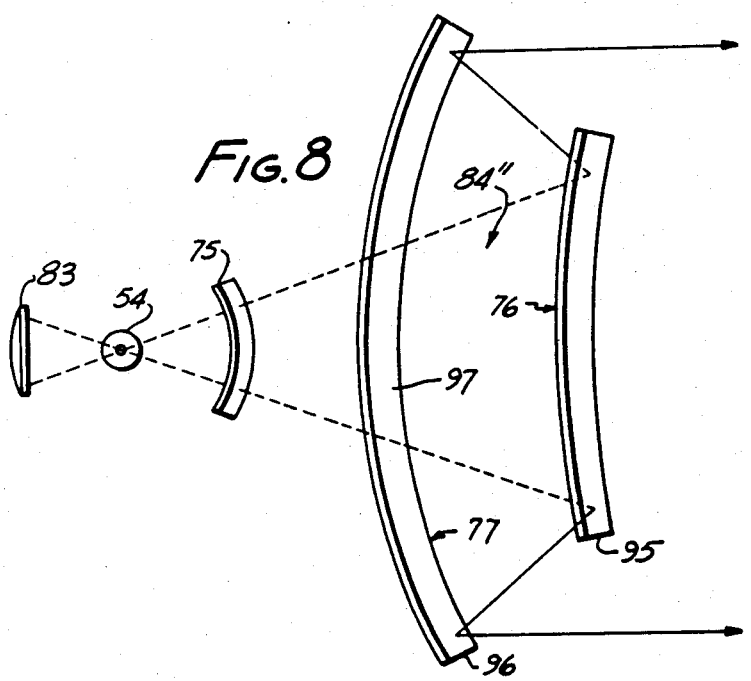

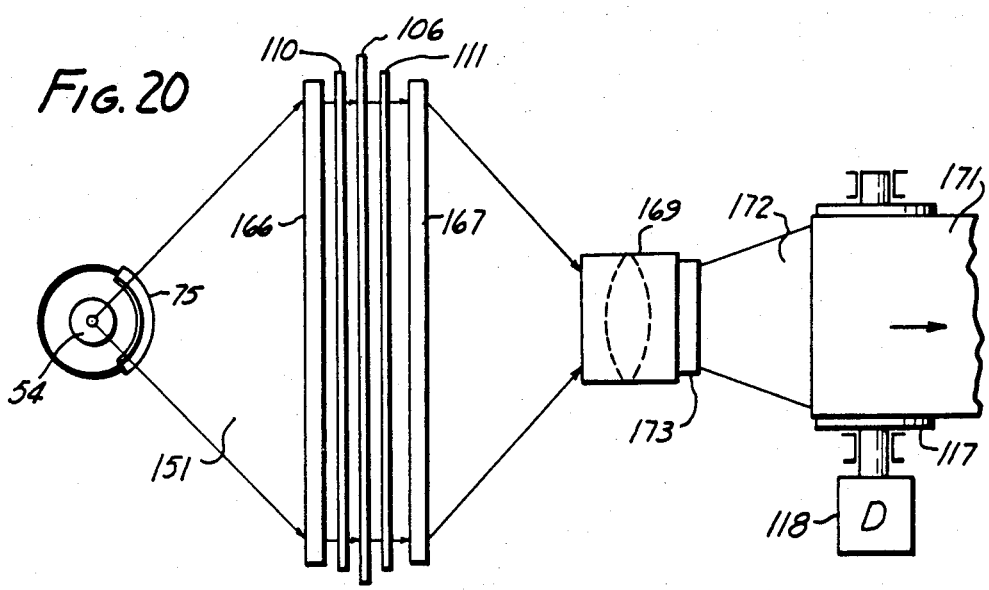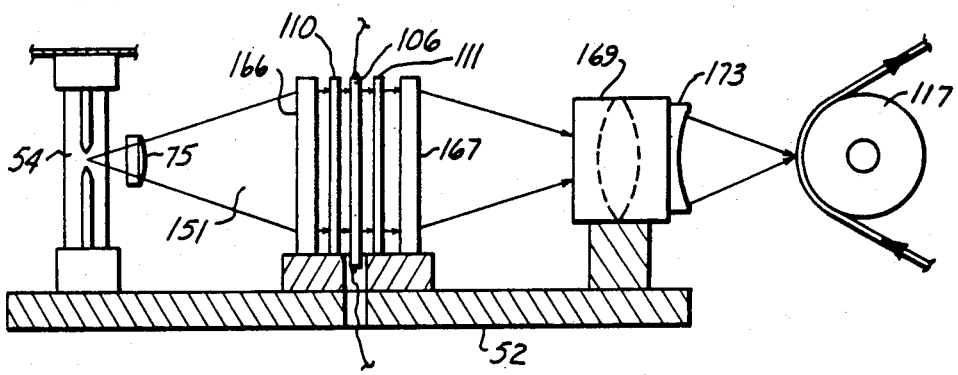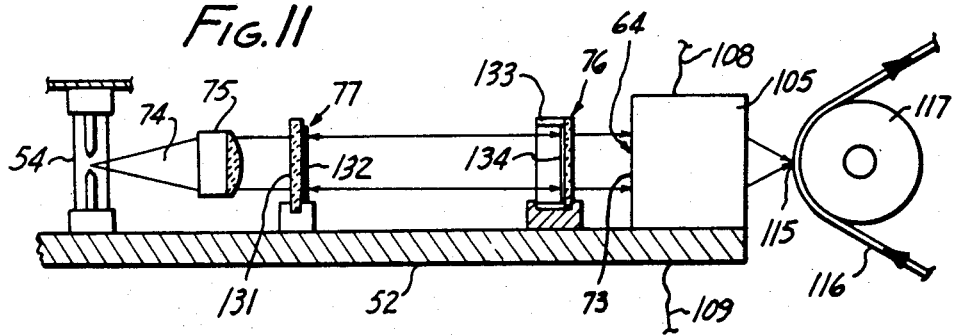

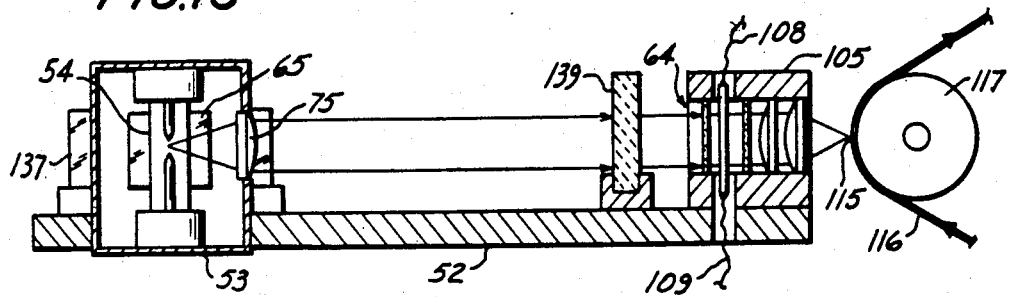
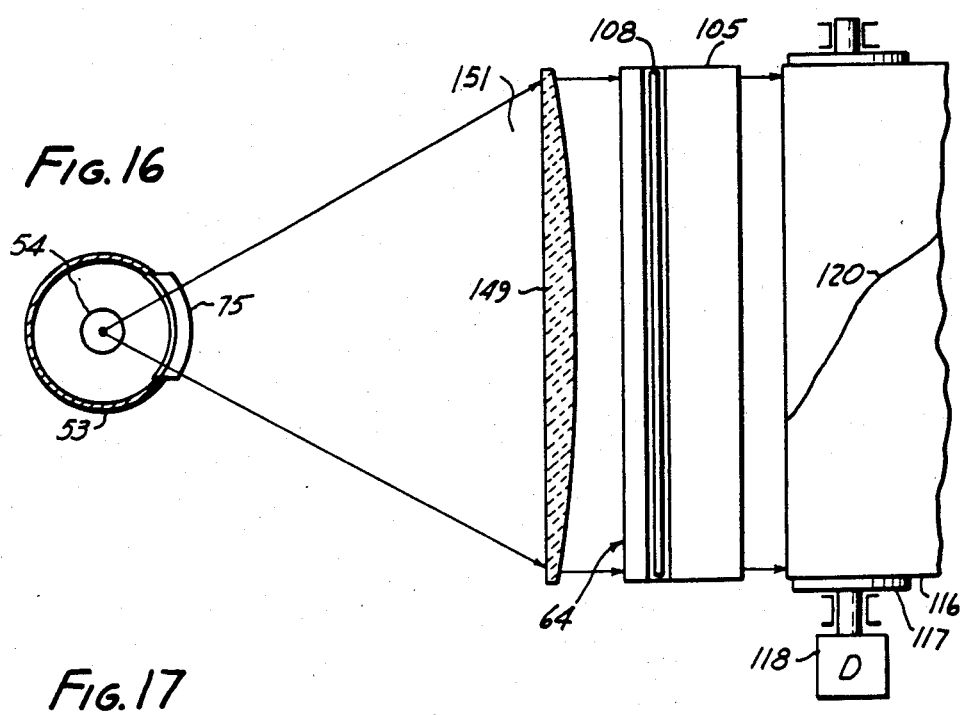
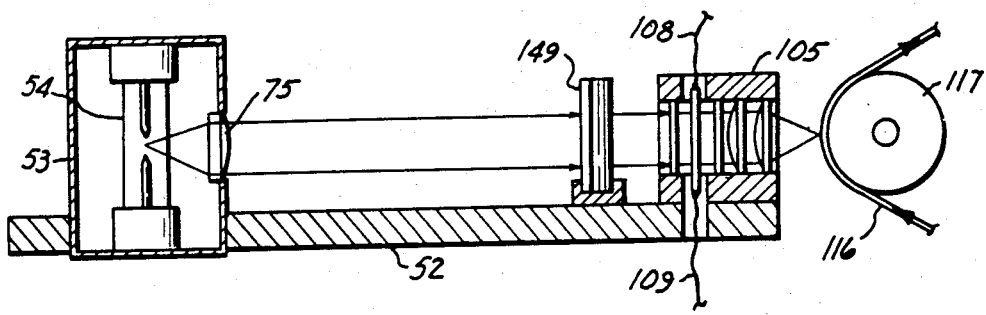

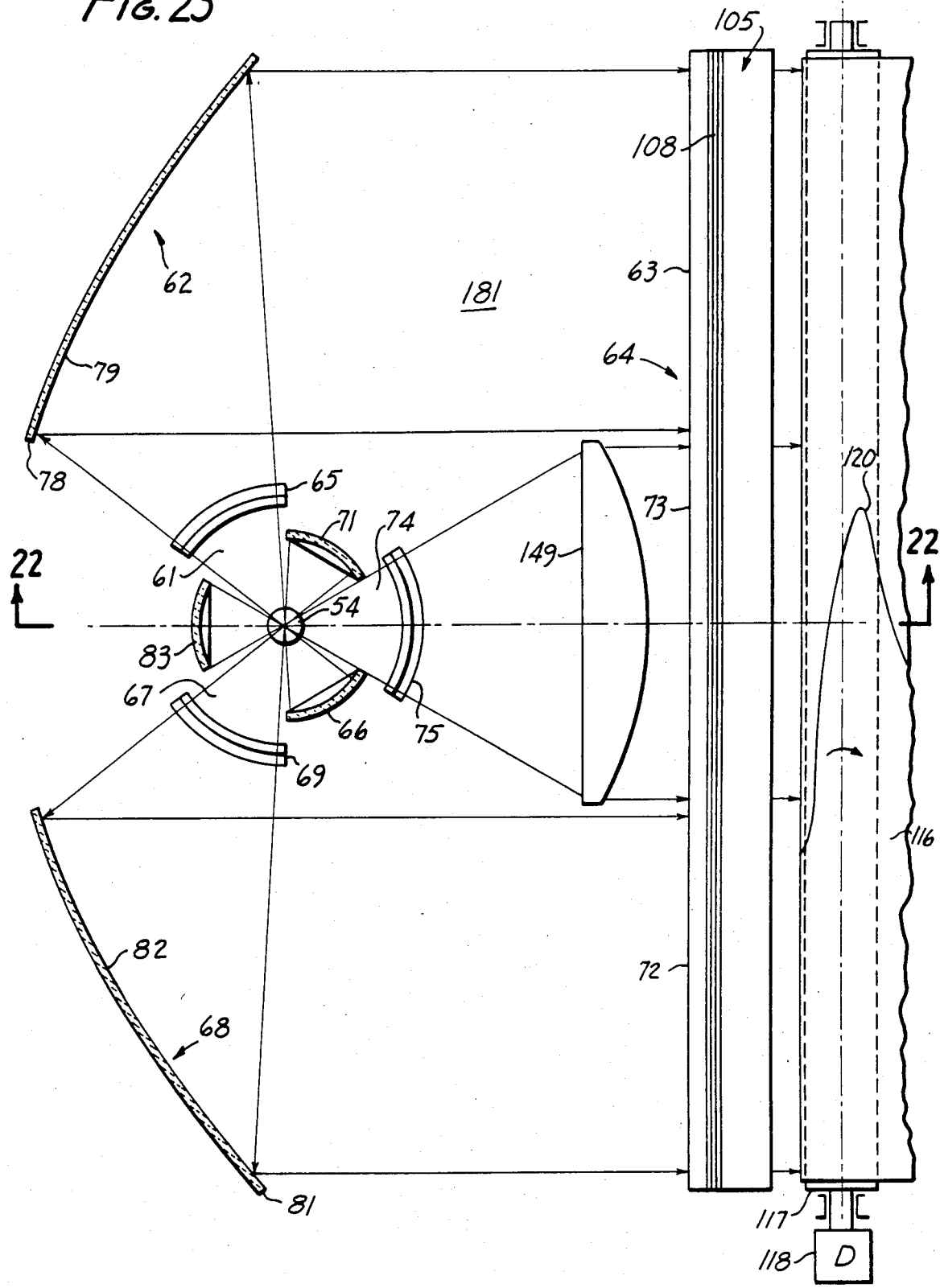

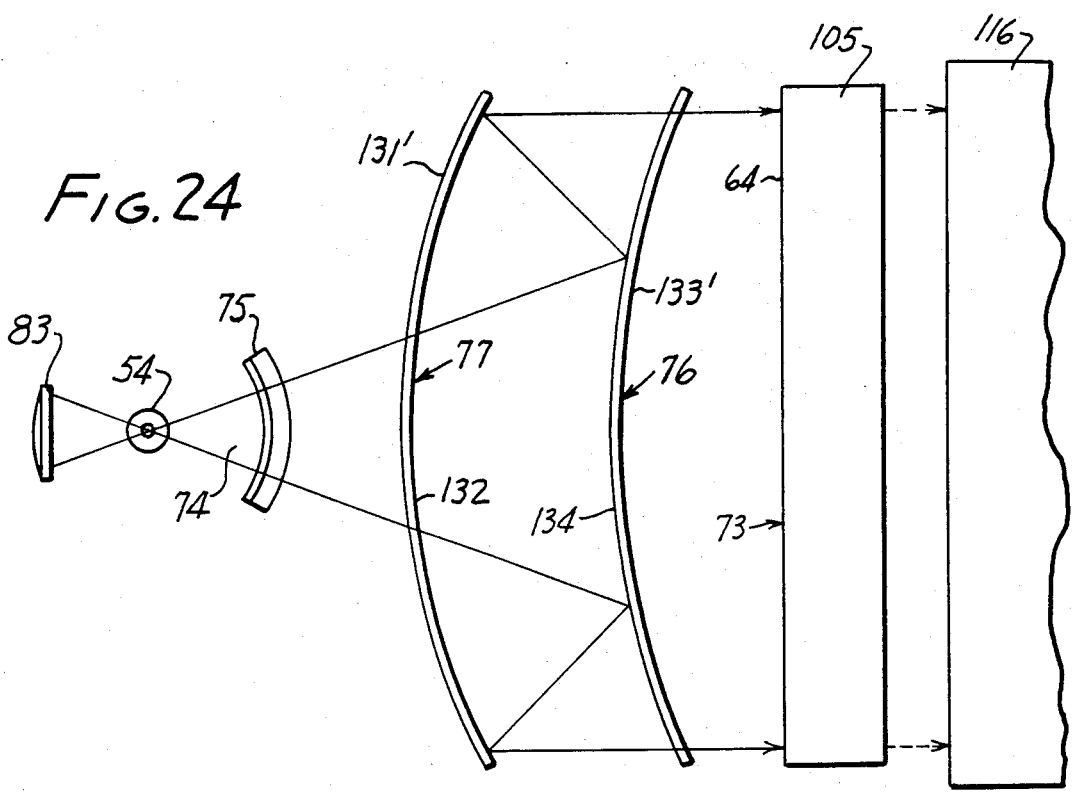

ILLUMINATION AND LIGHT GATE UTILIZATION METHODS AND APPARATUS

CROSS-REFERENCES

This is a continuation of U.S. patent application Ser. No. 925,132, filed July 17, 1978 for ILLUMINATION AND LIGHT GATE UTILIZATION METHODS AND APPARATUS, by John H. Jacobs, and now abandoned, which was a division U.S. patent application Ser. No. 776,157, filed Mar. 10, 1977, for LIGHT GATE UTILIZATION METHODS AND APPARATUS, by John H. Jacobs, and assigned to the subject assignee, and now abandoned.

BACKGROUND OF THE INVENTION

1. Field of the Invention

The subject invention relates to optics, illumination systems, electrooptical, light modulating and light gating systems, optical systems for converting a spatially concentrated light output into a band of light, to electro-optical systems for modulating a light output, light gate utilization methods and apparatus, methods and apparatus for recording varying electrical signals and methods and apparatus for reading information with the aid of light gates. Examples of such apparatus include solid state oscillographs and solid state facsimile equipment.

2. Disclosure Statement

This disclosure statement is made pursuant to the duty of disclosure imposed by law and formulated in 37 CFR 1.56(a). No representation is hereby made that information thus disclosed in fact constitutes prior art inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments subsequent in time or priority.

A review of the development of electrooptical light gate systems in light modulators and other equipment may be had from U.S. Pat. Nos. 2,591,701, 3,027,806, 3,322,485, 3,354,465, 3,454,771, 3,464,762, 3,471,863, 3,492,492, 3,499,702, 3,499,704, 3,512,864, 3,567,847, 3,582,957, 3,597,044, 3,612,656, 3,624,597, 3,644,017, 3,657,471, 3,657,707, 3,666,666, 3,699,242, 3,702,724, 3,718,723, 3,737,211, 3,781,783, 3,787,111, 3,799,647, 3,823,998, 3,867,571, 3,914,546, 3,922,485, 3,926,520, 3,930,119, 3,944,323 and 3,945,715. For information on electrooptical oscillographs and facsimile equipment, reference may also be had to German Pat. Nos. 357 299, issued Aug. 19, 1922, 492 331, issued Mar. 5, 1930 and 584 384, issued Sept. 19, 1933 and to German Published patent applications Nos. 2 321 870, published Nov. 7, 1974 and 2 322 473, published Nov. 21, 1974.

While the familiar Kerr cell naturally has spawned a multitude of proposals built on the light modulating capability of that cell, a more recent impetus in that direction has emanated from the advent of suitable light-modulating solid state materials as may be seen from U.S. Pat. Nos. 2,892,955, 2,911,370, 2,985,700, 3,144,411, 3,283,044, 3,303,133, 3,344,073, 3,429,818, 3,434,122, 3,464,924, 3,517,093, 3,531,182, 3,532,628, 3,536,625, 3,622,226, 3,630,597, 3,684,714, 3,699,044, 3,708,438, 3,728,263, 3,732,117, 3,744,875, 3,816,750, 3,826,865, 3,856,693, 3,871,745, 3,903,358, 3,917,780, 3,923,675, 3,932,313, 3,938,878 and 3,963,630 and U.S. Published patent application No. B 384,225, dated Mar. 16, 1976.

A family of ferroelectric electrooptic ceramics is known as PZT compounds with P standing for lead, Z for zirconium and T for titanium. Under the influence of an electrical field, PZT compounds become birefringent and exhibit various electrooptic properties. For instance, incoming light is resolved into two component waves propagating at different velocities and in polarization planes that are at right angles to each other. The magnitude of the effect is a function of the applied voltage and of the light frequency. Light valves and gates may be provided by placing the electrooptic ceramic between a polarizer plate and an analyzer plate.

A breakthrough occurred with the discovery that substitution of small amounts of lanthanum greatly improves ferroelectric properties. These improved compounds generally have become known as PLZT compounds, with the L standing for lanthanum.

Reference may in this respect be had to Land et al., Ferroelectric Ceramic Electrooptic Materials and Devices, 57 Proceedings IEEE No. 5, May 1969, pp. 751 to 768, Thacher et al., Ferroelectric Electrooptic Ceramics with Reduced Scattering, ED-16, IEEE Transactions on Electron Devices, No. 6, June 1969, pp. 515 to 521, Maldonado et al., Ferroelectric Ceramic Light Gates Operated in a Voltage-Controlled Mode, ED-17, IEEE Transactions on Electron Devices, No. 2, Feb. 1970, pp. 148 to 157, New Ferroelectric Ceramics Enhance Electro-Optic Performance, Design News, June 22, 1970, pp. 10 and 11, Haertling et al., Hot-Pressed (Pb, La) (Zr, Ti) $O_3$ Ferroelectric Ceramics for Electrooptic Applications, 54 Journal of the American Ceramic Society, No. 1, Jan. 1971, pp. 1 to 11, Waterworth et al., Integrated Electro-Optic Modulator Arrays, 4 Optoelectronics (1972) 339 and 340, Cutchen et al., Electrooptic Devices Utilizing Quadratic PLZT Ceramic Elements, 30, 1973 Wescon Technical Papers, Vol. 17 pp. 1 to 12, Zook, Light Beam Deflector Performance: a Comparative Analysis, 13 APPLIED OPTICS, No. 4, Apr. 1974, pp. 875 et seq., Fiber Display Features Digital Scanning, Optical Spectra, June 1974, and Cutchen et al., PLZT Electrooptic Shutters: Applications, 14 APPLIED OPTICS, No. 8, Aug. 1975, pp. 1866 to 1873.

In the course of such development, Kerr cells in such applications as constant-density trace oscillographs disclosed in U.S. Pat. No. 3,354,465 by Merritt et al., issued Nov. 21, 1967, were replaced by solid-state light valves. Indeed, solid-state shutter systems were among the first practical applications as may, for instance, be seen from U.S. Pat. No. 3,555,987, by Iben Browning, issued Jan. 19, 1971. The switching properties and modes of ferroelectric ceramic plates were recognized and published such as in the above mentioned 1969 IEEE article by Land et al., pp. 61 and 762 and FIG. 20, and proposals for practical applications such as those suggested in the above mentioned U.S. Pat. No. 3,930,119, by Schmidt et al., issued Dec. 30, 1975, naturally followed.

Similarly, PLZT electrooptic modulator arrays of the type disclosed in the above mentioned 1972 Optoelectronics letter by Waterworth et al. have been considered suitable as the light modulating agency in a solid state oscillograph. In a similar vein, a PLZT device has been considered as an electrooptic shutter in an oscillograph of the Type 5-134 and the Type 5-139 manufactured by the subject assignee. In both types of recording oscillographs, light is emitted from a recording arc lamp through cylindrical belt lenses to be reflected by mirrors, one of which may be concave. In particular, in the Type 5-139, recording oscillograph, light is projected through belt lenses onto mirrors positioned at opposite sides of the arc lamp to be reflected onto a bank of galvanometer mirrors which, in turn, reflect the light back towards the general area of the lamp and beyond that lamp onto recording oscillograph paper through a collimating lens. To realize this construction, the path of the light is folded with the light-modulating elements, namely the galvanometer mirrors, forming a reflecting or folding agency in the light path.

In the Type 5-134 installation, part of the light generated by the recording arc lamp is emitted through a first cylindrical belt lens onto a mirror which, in turn, reflects such light onto a concave further mirror which reflects the light to a grid screen at the recording paper. This light path is folded by means of the mentioned mirrors, but neither any light-modulating or deflecting galvanometer mirror nor any light-modulating or gating PLZT or other solid state device is located in the light path.

In a modification contemplated for the above mentioned modified Type 5-134 installation a second part of the light is emitted by the arc lamp through a cylindrical belt lens, variable aperture and PLZT shutter to a mirror which reflects the light passed by the shutter to galvanometer mirrors through a galvanometer lens. The light modulated or deflected by the galvanometer mirrors is projected via a recording mirror and collimating lens onto advancing recording oscillograph paper. Again, a folded light path is utilized for these purposes, with the galvanometer mirrors forming a reflecting agency in the folded light path, in order to provide part thereof. Another folded light path in the Type 5-134 installation is provided for the light of a timing lamp which is located near the recording paper transport and emits light to a mirror located in the vicinity of the galvanometer mirrors and projecting light received from the timing lamp via the recording mirror and collimating lens onto the recording paper.

These installations, of course, still operated with conventional galvanometer mirrors, leaving unsatisfied the need for a solid state recording oscillograph using a PLZT or other type of solid state light gate structure. However, the prior art was notoriously unable to overcome various obstacles, entrenched prejudices and inadequacies which remained in the way of competitive solid state oscillograph and facsimile writing and reading equipment.

This will presently be explained with the aid of the above mentioned U.S. Pat. No. 3,930,119, by Schmidt et al., issued Dec. 30, 1975. It is to be pointed out in this connection that the problems presently to be discussed are endemic to the prior art and that the Schmidt patent has been selected as a convenient basis for discussion because of its symptomatic nature and relatively recent date.

One of the prevailing problems becomes apparent from a consideration of the fact that an effective light gating action requires each electrode or at least one electrode of each electrode pair to be individually connected to its own electric energizing wire. In this respect, several electrodes per millimeter have to be provided for adequate resolution. By way of example, Schmidt et al. mention an array of 1,200 lines of 800 picture elements each. At such high densities, the requisite individual terminal for each electrode becomes larger than the electrode itself, as may be seen from FIG. 12 on page 1871 of the above mentioned Cutchen article entitled PLZT Electrooptic Shutters: Applications. Accordingly, the inevitable minimum terminal size in practice is the limiting factor of electrode density and scanning or picture element resolution.

Another problem stems from the high light intensity required for solid state light gate operations and the very high light density required for oscillography papers, particularly those of the direct-print type required for real-time printout. While arc lamps and other high-indensity or point-type light sources exist, the problem becomes acute when an elongate light gate array is to be illuminated for selective light transmission. In this respect, the above mentioned Schmidt et al. patent proposes use of a tubular light source coextensive with the longest dimension of the light gate array and providing a uniform illumination thereacross. No existing light source having such elongate, coextensive configuration and meeting the applicable collimation and light-intensity requirements could be found.

In a similar vein, the well-known light scattering properties of PLZT and other solid state light gates, coupled with the natural diffraction imposed on light flowing through a multitude of narrow light gates, impose strict requirements, including collimation in two crossed directions to avoid sideways spread of the recording or illuminated reading point and to facilitate focusing of gated light to a small spot in the direction of travel of the recording medium or the master to be read.

Such bidirectional collimation appears lacking from the Schmidt et al. proposal. No remedy for this defect could be found in the remainder of the above mentioned references or any other existing or proposed system.

In particular, Swedish Pat. No. 47835, issued as of May 8, 1917 to Nordström et al., is representative of proposals employing a rotational-symmetrical concave reflector system for ideally issuing a cylindrical bundle of light. Such rotational-symmetrical light sources are not practically usable with elongate light gate structures of practical widths. Also, the text of the Swedish patent appears to imply that the light intensity achievable with such illumination systems may be rather non-uniform across the diameter of the cylindrical bundle of light. A drawback of the latter type is also apparent from U.S. Pat. No. 1,245,512, issued Nov. 6, 1917 to J. T. Roffy. That proposal employs several reflectors in the form of different figures of rotation in an attempt to convert the output of an incandescent lamp into a cylindrical beam of light. However, Roffy in effect teaches the provision of divergent light which travels along a center portion of a hollow-cylindrical light beam and which moreover permeates the otherwise collimated portion of that beam. This, of course, would be a completely unacceptable light source for light gate structures having the above mentioned inherent light scattering and diffraction properties.

More recent attemps at light sources of the type mentioned in the Swedish patent cited above may be seen in U.S. Pat. No. 3,796,886, issued Mar. 12, 1974, to M. L. Freeman, for Radiant Energy Reflectors, and U.S. Pat. No. 4,050,775, issued Sept. 27, 1977, to J. R. Scholten, for Catoptric Lens Arrangement. Those proposals also employ rotational-symmetrical reflector systems for generating hollow-cylindrical light beams and further utilize refractive means for providing an intensive beam of light along the longitudinal axis of the hollow-cylindrical light beam.

Again, such a non-uniform light emission renders those proposals unsuitable for light gate illumination or similar purposes. This applies also to the part of the cited Scholten reference which teaches the generation of divergent light bundles.

Rotational-symmetrical concave reflectors also have been employed in conjunction with convex reflectors in order to generate collimated beams of light. Such a system has been disclosed in U.S. Pat. No. 4,054,364, issued Oct. 18, 1977 to W. P. Webster, for Apparatus for Transmitting Light through Cassegrain Optics. As, however, shown in that patent, such a system also results in a hollow-cylindrical beam of light afflicted by a low light intensity along an axial space thereof.

Existing linear reflective devices would also be unsuitable for present purposes as may, for instance, be seen from U.S. Pat. No. 4,050,444, issued Sept. 27, 1977 to P. W. Dolamore, for Reflective Device. In addition to the fact that the Dolamore reflector system was designed for receiving, rather than issuing, radiation, there is the further fact that a light source substituted for any radiation receiver in the Dolamore system would in effect obstruct an essential part of the adjacent reflective surface.

That elongate light sources of the type proposed in the above mentioned Schmidt patent present no solution in practice may also be seen from Baxter, Document Illuminator Using Elliptic and Dichroic Reflectors, IBM Technical Disclosure Bulletin, Vol. 14, No. 11 (Apr. 1972). In particular, Baxter employs two elliptic-cylinder mirrors for focusing light from two parallel elongate lamps onto a narrow strip for photoelectric document reading purposes.

Such focused light is, however, neither collimated nor otherwise suitable for illumination of or use with elongate light gate structures.

Some prior proposals have employed folded light paths in illumination systems. For instance, Muirhead and McCallum have employed parabolic and plane mirror combinations in their Improvement in Spark Shadowgraph Technique, published in The Review of Scientic Instruments (Sept. 1959), pp. 830-831. Other folded light path systems have employed a laser as a more powerful light source than a spark gap.

In particular, folded light path systems have been employed to expand the relatively narrow beam emitted by practical lasers. However, this only provides for an expansion of the laser beam by a factor on the order of four, as may be seen from King, Unobstructed Laser-Beam-Expander Pointing System with Tilted Spherical Mirrors, published in Applied Optics (Jan. 1974) p. 21. No solution to this or any of the above mentioned problems is apparent from the laser beam expanding system disclosed in U.S. Pat. No. 3,531,205, by T. A. Nussmeier, issued Sept. 29, 1970, for Light Beam Aiming Device, or from the folded light path system of U.S. Pat. No. 3,871,773, by H. E. Shaw, issued Mar. 18, 1975.

Prior systems using a partially transparent curved rotational-symmetrical reflecting surface and crossed polarizers in infinite optical image-forming apparatus, such as disclosed in U.S. Pat. No. 3,443,858, by J. La Russa, issued May 13, 1969, would be too inefficient in practice and would otherwise be unsuitable for illuminating elongate light gate structures and similar apparatus.

In consequence, prior practical electrooptical devices have remained limited to the relatively small size apparent from U.S. Pat. Nos. 2,649,027, 2,909,972 and 3,020,805.

The facts herein recited and the lack of suitable proposals in the prior art underscore the reason for the entrenched dominance of the field of oscillography by the electromechanical galvanometer for many decades. The prior-art climate in this respect appears to be well reflected in the above mentioned Zook reference which compares the electromechanical galvanometer oscillograph with modern developments including electrooptic and acoustooptic light beam deflectors and which recognizes that the electromechanical galvanometer provides the lowest access time (i.e. the slowest response) in terms of both present and projected performance. Despite this expressly confirmed drawback, Zook concludes on page 875 that "it has become clear that, whenever possible, mechanical deflectors are preferable," thereby in effect putting a damper on further developments in the solid-state galvanometer area.

While emphasis has been placed on oscillography in this disclosure statement, it should be understood that the subject invention has utility in other areas, such as those suggested by or apparent from the description of preferred embodiments or by the language of the claims.

SUMMARY OF TME INVENTION

It is a general object of this invention to meet the needs and overcome disadvantages expressed or implicit in the above disclosure statement or other parts hereof.

It is also an object of this invention to provide improved methods and apparatus for converting a spatially concentrated light output into a band of light.

It is a related object of this invention to provide improved apparatus and methods for illuminating an elongate electrode array, light gate array or other elongate structure from a point-type light source or from a spatially concentrated light output as uniformly as necessary for proper operation.

It is a further object of this invention to provide improved methods and apparatus for illuminating a surface.

It is also an object of this invention to provide improved methods and apparatus for recording varying electric signals.

It is also an object of this invention to provide improved methods and apparatus for reading information perceptible upon illumination.

It is a related object of this invention to provide improved methods and apparatus for modulating light from a spatially concentrated source of divergent light.

It is a germane object of this invention to improve the performance and utility of various PLZT and other solid state devices.

Other objects of the invention will become apparent in the further course of this disclosure.

From a first aspect thereof, the subject invention resides in a method of selectively illuminating a surface and, more specifically, resides in the improvement comprising in combination the steps of providing a slit traveling transversely to a longitudinal dimension of said slit for a predetermined distance, providing a source of spatially concentrated light, spreading light from said source in a plane parallel to the transverse travel of the slit and across said predetermined distance of transverse travel of the slit, collimating said spread light, and focusing said spread light into a traveling spot on said surface by imaging said spread light from said source through said traveling slit onto said surface anamorphically only as to a dimension of said spatially concentrated light corresponding to said longitudinal dimension of the slit.

From another aspect thereof, the subject invention resides in a method of selectively illuminating a surface and, more specifically, resides in the improvement comprising in combination the steps of providing a slit traveling transversely to a longitudinal dimension of said slit, providing a source of spatially concentrated light, emitting a first part of said light from said source to a first region, reflecting said first part from said first region, collimating said reflected first part at a distance from said first region, projecting said reflected collimated first part to a first portion of an elongate second region extending parallel to the transverse travel of the slit, and further through the slit onto said surface and imaging said first part of the light from said source via said first region, second region and slit onto said surface anamorphically only as to a dimension of said spatially concentrated light corresponding to said longitudinal dimension of the slit, emitting a second part of said light from said source to a third region, reflecting said second part from said third region, collimating said reflected second part at a distance from said third region, and projecting said reflected collimated second part to a second portion of said elongate second region, and further through the slit onto said surface and imaging said second part of the light from said source via said third region, second region and slit onto said surface anamorphically only as to a dimension of said spatially concentrated light corresponding to said longitudinal dimension of the slit.

From another aspect thereof, the subject invention resides in a method of selectively illuminating a surface and, more specifically, resides in the improvement comprising in combination the steps of providing a slit traveling transversely to a longitudinal dimension of said slit, providing a source of spatially concentrated light, emitting a first part of said light from said source to a first region, collimating said first part at said first region, reflecting said collimated first part from said first region to a first portion of an elongate second region extending parallel to the transverse travel of the slit, projecting said reflected collimated first part through said second region and said slit onto said surface and imaging said first part of the light from said source via said first region, second region and slit onto said surface anamorphically only as to a dimension of said spatially concentrated light corresponding to said longitudinal dimension of the slit, emitting a second part of said light from said source to a third region, collimating said second part at said third region, reflecting said collimated second part from said third region to a second portion of said elongate second region, said second portion being spaced by a third portion from said first portion, projecting said reflected collimated second part through said second region and said slit onto said surface and imaging said second part of the light from said source via said third region, second region and slit onto said surface anamorphically only as to a dimension of said spatially concentrated light corresponding to said longitudinal dimension of the slit, emitting a third part of said light from said source to a fourth region, collimating said third part at said fourth region, projecting said collimated third part of the light through said third portion of the second region and said slit onto said surface and imaging said third part of the light from said source via said fourth region, second region and slit onto said surface anamorphically only as to a dimension of said spatially concentrated light corresponding to said longitudinal dimension of the slit.

From another aspect thereof, the subject invention resides in a method of recording varying electric signals on a light-sensitive recording medium and, more specifically, resides in the improvement comprising in combination the steps of providing a slit traveling transversely to a longitudinal dimension of said slit for a predetermined distance and modulating the travel of said slit with said varying electric signals, providing a source of spatially concentrated light, spreading light from said source in a plane parallel to the transverse travel of the slit and across said predetermined distance of transverse travel of the slit, collimating said spread light, focusing said spread light into a traveling spot on said surface by imaging said spread light from said source through said traveling slit onto said recording medium anamorphically only as to a dimension of said spatially concentrated light corresponding to said longitudinal dimension of the slit, and recording said traveling spot.

From another aspect thereof, the subject invention resides in a method of recording varying electric signals on a light-sensitive recording medium and, more specifically, resides in the improvement comprising in combination the steps of providing a slit traveling transversely to a longitudinal dimension of said slit and modulating the travel of said slit with said varying electric signals, providing a source of spatially concentrated light, emitting a first part of said light from said source to a first region, reflecting said first part from said first region, collimating said reflected first part at a distance from said first region, projecting said reflected collimated first part to a first portion of an elongate second region extending parallel to the transverse travel of the slit, and further through the slit onto said recording medium and imaging said first part of the light from said source via said first region, second region and slit onto said recording medium anamorphically only as to a dimension of said spatially concentrated light corresponding to said longitudinal dimension of the slit, emitting a second part of said light from said source to a third region, reflecting said second part from said third region, collimating said reflected second part at a distance from said third region, and projecting said reflected collimated second part to a second portion of said elongate second region, and further through the slit onto said recording medium and imaging said second part of the light from said source via said third region, second region and slit onto said recording medium anamorphically only as to a dimension to said spatially concentrated light corresponding to said longitudinal dimension of the slit.

From another aspect thereof, the subject invention resides in a method of recording varying electric signals on a light-sensitive recording medium and, more specifically, resides in the improvement comprising in combination the steps of providing a slit traveling transversely to a longitudinal dimension of said slit and modulating the travel of said slit with said varying electric signals, providing a source of spatially concentrated light, emitting a first part of said light from said source to a first region, collimating said first part at said first region, reflecting said collimated first part from said first region to a first portion of an elongate second region extending parallel to the transverse travel of the slit, projecting said reflected collimated first part through said second region and said slit onto said recording medium and imaging said first part of the light from said source via said first region, second region and slit onto said recording medium anamorphically only as to a dimension of said spatially concentrated light corresponding to said longitudinal dimension of the slit, emitting a second part of said light from said source to a third region, collimating said second part at said third region, reflecting said collimated second part from said third region to a second portion of said elongate second region, said second portion being spaced by a third portion from said first portion, projecting said reflected collimated second part through said second region and said slit onto said recording medium and imaging said second part of the light from said source via said third region, second region and slit onto said recording medium anamorphically only as to a dimension of said spatially concentrated light corresponding to said longitudinal dimension of the slit, emitting a third part of said light from said source to a fourth region, collimating said third part at said fourth region, projecting said collimated third part of the light through said third portion of the second region and said slit onto said recording medium and imaging said third part of the light from said source via said fourth region, second region and slit onto said recording medium anamorphically only as to a dimension of said spatially concentrated light corresponding to said longitudinal dimension of the slit.

From another aspect thereof, the subject invention resides in a method of recording varying electric signals on a light-sensitive recording medium having a given width and, more specifically, resides in the improvement comprising in combination the steps of providing a slit traveling transversely to a longitudinal dimension of said slit for an extent of travel wider than said given width and modulating the travel of said slit with said varying electric signals, providing a source of spatially concentrated light, spreading light from said source in a plane parallel to, and for the extent of, the transverse travel of the slit, collimating said spread light for the extent of said transverse travel and projecting said collimating light onto said transversely traveling slit for selective gating by said slit, converging projected light gates by said traveling slit down to a width smaller than said extent of said transverse travel of the slit, and imaging said converged light onto said recording medium, said imaging including the step of imaging light from said source through said slit onto said recording medium anamorphically as to a dimension of said spatially concentrated light corresponding to said longitudinal dimension of the slit.

From another aspect thereof, the subject invention resides in a method of reading information perceptible upon illumination of a record of said information and, more specifically, resides in the improvement comprising in combination the steps of providing a source of spatially concentrated light, providing a slit traveling transversely to a longitudinal dimension of said slit for a predetermined distance for an illumination of elemental areas of said record, spreading light from said source in a plane parallel to the transverse travel of the slit and across said predetermined distance of transverse travel of the slit, collimating said spread light, focusing said spread light into a traveling spot on said surface by imaging said spread light from said source through said traveling slit onto said record anamorphically only as to a dimension of said spatially concentrated light corresponding to said longitudinal dimension of the slit, illuminating said elemental areas of said record with said traveling spot and reading said illuminated elemental areas of said record.

From another aspect thereof, the subject invention resides in a method of reading information perceptible upon illumination of a record of said information and, more specifically, resides in the improvement comprising in combination the steps of providing a source of spatially concentrated light, providing a slit traveling transversely to a longitudinal dimension of said slit for illumination of elemental areas of said record, emitting a first part of said light from said source to a first region, reflecting said first part from said first region, collimating said reflected first part at a distance from said first region, projecting said reflected collimated first part to a first portion of an elongate second region extending parallel to the transverse travel of the slit, and further through the slit onto said record and imaging said first part of the light from said source via said first region, second region and slit onto said record anamorphically only as to a dimension of said spatially concentrated light corresponding to said longitudinal dimension of the slit, emitting a second part of said light from said source to a third region, reflecting said second part from said third region, collimating said reflected second part at a distance from said third region, projecting said reflected collimated second part to a second portion of said elongate second region, and further through the slit onto said record and imaging said second part of the light from said source via said third region, second region and slit onto said record anamorphically only as to a dimension of said spatially concentrated light corresponding to said longitudinal dimension of the slit, and reading illuminated elemental areas of said record.

From another aspect thereof, the subject invention resides in a method of reading information perceptible upon illumination of a record of said information and, more specifically, resides in the improvement comprising in combination the steps of providing a source of spatially concentrated light, providing a slit traveling transversely to a longitudinal dimension of said slit for an illumination of elemental areas of said record, emitting a first part of said light from said source to a first region, collimating said first part at said first region, reflecting said collimated first part from said first region to a first portion of an elongate second region extending parallel to the transverse travel of the slit, projecting said reflected collimated first part through said second region and said slit onto said record and imaging said first part of the light from said source via said first region, second region and slit onto said record anamorphically only as to a dimension of said spatially concentrated light corresponding to said longitudinal dimension of the slit, emitting a second part of said light from said source to a third region, collimating said second part at said third region, reflecting said collimated second part from said third region to a second portion of said elongate second region, said second portion being spaced by a third portion from said first portion, projecting said reflected collimated second part through said second region ahd said slit onto said record and imaging said second part of the light from said source via said third region, second region and slit onto said record anamorphically only as to a dimension of said spatially concentrated light corresponding to said longitudinal dimension of the slit, emitting a third part of said light from said source to a fourth region, collimating said third part at said fourth region, projecting said collimated third part of the light through said third portion of the second region and said slit onto said record and imaging said third part of the light from said source via said fourth region, second region and slit onto said record anamorphically only as to a dimension of said spatially concentrated light corresponding to said longitudinal dimension of the slit, and reading illuminated elemental areas of said record.

From another aspect thereof, the subject invention resides in a method of converting a spatially concentrated light output into a band of light and, more specifically, resides in the improvement comprising in combination the steps of emitting a first part of said light output from a source of said spatially concentrated light output to a first region, collimating said first part at said first region and reflecting said collimated first part from said first region to a first portion of an elongate second region, emitting a second part of said light output from said source to a third region, collimating said second part at said third region and reflecting said collimated second part from said third region to a second portion of said elongate second region, said second portion being spaced by a third portion from said first portion, providing for a third part of said light output a folded light path leading from said source to an elongate fourth region, hence by reflection to a fifth region, and thence by reflection to said third portion of said elongate second region, and emitting said third part of said light output along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region.

From another aspect thereof, the subject invention resides in a method of recording varying electric signals and, more specifically, resides in the improvement comprising in combination the steps of providing a source of spatially concentrated light, providing a folded light path leading from said source of spatially concentrated light to a spaced elongate first region, hence to an elongate second region located closer to said source than said first region, and thence to an elongate third region, arranging said first, second and third regions in a common plane, providing a first transparent plate with partially transparent first reflecting surface along said elongate first region, and a second transparent plate with partially transparent second reflecting surface along said elongate second region, emitting light from said source through said second transparent plate and partially transparent second surface to said elongate first region, hence by reflection by said first reflecting surface back to said elongate second region, and thence by reflection by said second reflecting surface through said first transparent plate and partially transparent first surface to said elongate third region, collimating said emitted light into a band of light by curving one of said first and second reflecting surfaces concavely and the other of said first and second reflecting surfaces convexly in the direction of elongation of the particular elongate region, modulating said band of light with said varying electric signals to provide along said band light outputs varying as a function of said varying electric signals, and recording said varying light outputs.

From another aspect thereof, the subject invention resides in a method of recording varying electric signals and, more specifically, resides in the improvement comprising in combination the steps of providing a source of spatially concentrated light, emitting a first part of said light from said source of spatially concentrated light to a first region, collimating said first part at said first region and reflecting said collimated first part from said first region to a first portion of an elongate second region, emitting a second part of said light from said source to a third region, collimating said second part at said third region and reflecting said collimated second part from said third region to a second portion of said elongate second region, said second portion being spaced by a third portion from said first portion, providing for a third part of said light a folded light path leading from said source to an elongate fourth region, hence by reflection to a fifth region, and thence by reflection to said third portion of said elongate second region, emitting said third part of said light along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region, modulating said continuous band of light with said varying electric signals to provide along said continuous band light outputs varying as a function of said varying electric signals, and recording said varying light outputs.

From another aspect thereof, the subject invention resides in a method of reading information perceptible upon illumination and, more specifically, resides in the improvement comprising in combination the steps of providing a source of spatially concentrated light, providing a folded light path leading from said source of spatially concentrated light to a spaced elongate first region, hence to an elongate second region located closer to said source than said first region, and thence to an elongate third region, arranging said first, second and third regions in a common plane, providing a first transparent plate with partially transparent first reflecting surface along said elongate first region, and a second transparent plate with partially transparent second reflecting surface along said elongate second region, emitting light from said source through said second transparent plate and partially transparent second surface to said elongate first region, hence by reflection by said first reflecting surface back to said elongate second region, and thence by reflection by said second reflecting surface through said first transparent plate and partially transparent first surface to said elongate third region, collimating said emitted light into a band of light by curving one of said first and second reflecting surfaces concavely and the other of said first and second reflecting surfaces convexly in the direction of elongation of the particular elongate region, subdividing said band of light into elemental portions, successively gating said elemental portions to said information for successively illuminating elemental areas of said information, and reading said illumianted elemental areas.

From another aspect thereof, the subject invention resides in a method of reading information perceptible upon illumination and, more specifically, resides in the improvement comprising in combination the steps of providing a source of spatially concentrated light, emitting a first part of said light from said source of spatially concentrated light to a first region, collimating said first part at said first region and reflecting said collimated first part from said first region to a first portion of an elongate second region, emitting a second part of said light from said source to a third region, collimating said second part at said third region and reflecting said collimated second part from said third region to a second portion of said elongate second region, said second portion being spaced by a third portion from said first portion, providing for a third part of said light output a folded light path leading from said source to an elongate fourth region, hence by reflection to a fifth region, and thence by reflection to said third portion of said elongate second region, emitting said third part of said light output along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region, subdividing said band of light into elemental portions, successively gating said elemental portions to said information for successively illuminating elemental areas of said information, and reading said illuminated elemental areas.

From another aspect thereof, the subject invention resides in apparatus for selectively illuminating a surface and, more specifically, resides in the improvement comprising in combination a slit traveling transversely to a longitudinal dimension of said slit for a predetermined distance, a source of spatially concentrated light, and an anamorphic light projecting system including means for spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said slit onto said surface anamorphically only as to a dimension of said spatially concentrated light corresponding to said longitudinal dimension of the slit.

From another aspect thereof, the subject invention resides in apparatus for selectively illuminating a surface and, more specifically, resides in the improvement comprising in combination a slit traveling transversely to a longitudinal dimension of said slit, a source of spatially concentrated light, and an anamorphic light projecting system including means for emitting a first part of said light from said source to a first region, means at said first region for reflecting said first part from said first region, means spaced from said first region for receiving said reflected first part, collimating said received first part and projecting said collimated first part to a first portion of an elongate second region and through said slit onto said surface, said emitting, reflecting and projecting means including means for imaging said first part of the light from said source via said first region, second region and slit onto said surface anamorphically only as to a dimension of said spatially concentrated light corresponding to said longitudinal dimension of the slit, means for emitting a second part of said light from said source to a third region, means at said third region for reflecting said second part from said third region, and means spaced from said third region for receiving said reflected second part, collimating said received second part and projecting said collimated second part to a second portion of said elongate second region and through said slit onto said surface, said means for emitting, reflecting and projecting said second part including means for imaging said second part of the light from said source via said third region, second region and slit onto said surface anamorphically only as to a dimension of said spatially concentrated light corresponding to said longitudinal dimension of the slit.

From another aspect thereof, the subject invention resides in apparatus for selectively illuminating a surface and, more specifically, resides in the improvement comprising in combination a slit traveling transversely to a longitudinal dimension of said slit, a source of spatially concentrated light, and an anamorphic light projecting system including means for emitting a first part of said light from said source to a first region, means at said first region for collimating said first part at said first region and for reflecting said collimated first part from said first region to a first portion of an elongate second region, said emitting, collimating and reflecting means including means for projecting said reflected collimated first part through said second region and said slit onto said surface and for imaging said first part of the light from said source via said first region, second region and slit onto said surface anamorphically only as to a dimension of said spatially concentrated light corresponding to said longitudinal dimension of the slit, means for emitting a second part of said light from said source to a third region, means at said third region for collimating said second part at said third region and for reflecting said collimated second part from said third region to a second portion of an elongate second region, said second portion being spaced by a third portion from said first portion, said means for emitting, collimating and reflecting said second part including means for projecting said reflected collimated second part through said second region and said slit onto said surface and for imaging said second part of the light from said source via said third region, second region and slit onto said surface anamorphically only as to a dimension of said spatially concentrated light corresponding to said longitudinal dimension of the slit, means for emitting a third part of said light from said source to a fourth region, and means at said fourth region for collimating said third part at said fourth region and for projecting said collimated third part from said fourth region to said third portion of said elongate second region, said means for emitting, collimating and projecting said third part including means for projecting said collimated third part through said second region and said slit onto said surface and for imaging said third part of the light from said source via said fourth region, second region and slit onto said surface anamorphically only as to a dimension of said spatially concentrated light corresponding to said longitudinal dimension of the slit.

From another aspect thereof, the subject invention resides in apparatus for recording varying electric signals on a light-sensitive recording medium and, more specifically, resides in the improvement comprising in combination a slit traveling transversely to a longitudinal dimension of said slit for a predetermined distance, means for modulating the travel of said slit with said varying electric signals, a source of spatially concentrated light, and an anamorphic light projecting system including means spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said traveling slit onto said recording medium anamorphically only as to a dimension of said spatially concentrated light corresponding to said longitudinal dimension of the slit, and means for recording said traveling spot.

From another aspect thereof, the subject invention resides in apparatus for recording varying electric signals on a light-sensitive recording medium and, more specifically, resides in the improvement comprising in combination a slit traveling transversely to a longitudinal dimension of said slit, means for modulating the travel of said slit with said varying electric signals, a source of spatially concentrated light, and an anamorphic light projecting system including means for emitting a first part of said light from said source to a first region, means at said first region for reflecting said first part from said first region, means spaced from said first region for receiving said reflected first part, collimating said received first part and projecting said collimated first part to a first portion of an elongate second region and through said slit onto said recording medium, said emitting, reflecting and projecting means including means for imaging said first part of the light from said source via said first region, second region and slit onto said recording medium anamorphically only as to a dimension of said spatially concentrated light corresponding to said longitudinal dimension of the slit, means for emitting a second part of said light from said source to a third region, means at said third region for reflecting said second part from said third region, and means spaced from said third region for receiving said reflected second part, collimating said received second part and projecting said collimated second part to a second portion of said elongate second region and through said slit onto said recording medium, said means for emitting, reflecting and projecting said second part including means for imaging said second part of the light from said source via said third region, second region and slit onto said recording medium anamorphically only as to a dimension of said spatially concentrated light corresponding to said longitudinal dimension of the slit.

From another aspect thereof, the subject invention resides in apparatus for recording varying electric signals on a light-sensitive recording medium and, more specifically, resides in the improvement comprising in combination a slit traveling transversely to a longitudinal dimension of said slit, means for modulating the travel of said slit with said varying electric signals, a source of spatially concentrated light, and an anamorphic light projecting system including means for emitting a first part of said light from said source to a first region, means at said first region for collimating said first part at said first region and for reflecting said collimated first part from said first region to a first portion of an elongate second region, said emitting, collimating and reflecting means including means for projecting said reflected collimated first part through said second region and said slit onto said recording medium and for imaging said first part of the light from said source via said first region, second region and slit onto said recording medium anamorphically only as to a dimension of said spatially concentrated light corresponding to said longitudinal dimension of the slit, means for emitting a second part of said light from said source to a third region, means at said third region for collimating said second part at said third region and for reflecting said collimated second part from said third region to a second portion of an elongate second region, said second portion being spaced by a third portion from said first portion, said means for emitting, collimating and reflecting said second part including means for projecting said reflected collimated second part through said second region and said slit onto said recording medium and for imaging said second part of the light from said source via said third region, second region and slit onto said recording medium anamorphically only as to a dimension of said spatially concentrated light corresponding to said longitudinal dimension of the slit, means for emitting a third part of said light from said source to a fourth region, and means at said fourth region for collimating said third part at said fourth region and for projecting said collimated third part from said fourth region to said third portion of said elongate second region, said means for emitting, collimating and projecting said third part including means for projecting said collimated third part through said second region and said slit onto said recording medium and for imaging said third part of the light from said source via said fourth region, second region and slit onto said recording medium anamorphically only as to a dimension of said spatially concentrated light corresponding to said longitudinal dimension of the slit.

From another aspect thereof, the subject invention resides in apparatus for recording varying electric signals on a light-sensitive recording medium having a given width and, more specifically, resides in the improvement comprising in combination a slit traveling transversely to a longitudinal dimension of said slit for an extent of travel wider than said given width, means for modulating the travel of said slit with said varying electric signals, a source of spatially concentrated light, means for spreading light from said source in a plane parallel to, and for the extent of, the transverse travel of the slit, means for collimating said spread light for the extent of said transverse travel and projecting said collimating light onto said transversely traveling slit for selective gating by said slit, means for converging projected light gated by said traveling slit down to a width smaller than said extent of said transverse travel of the slit, and means for imaging said converged light onto said recording medium, including means for imaging light from said source through said slit onto said recording medium anamorphically as to a dimension of said spatially concentrated light corresponding to said longitudinal dimension of the slit.

From another aspect thereof, the subject invention resides in apparatus for reading information perceptible upon illumination of a record of said information and, more specifically, resides in the improvement comprising in combination a source of spatially concentrated light, a slit traveling transversely to a longitudinal dimension of said slit for a predetermined distance, for an illumination of elemental areas of said record, an anamorphic light projecting system including means for spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said traveling slit onto said record anamorphically only as to a dimension of said spatially concentrated light corresponding to said longitudinal dimension of the slit, and means for reading illuminated elemental areas of said record with the aid of said traveling spot.

From another aspect thereof, the subject invention resides in apparatus for reading information perceptible upon illumination of a record of said information and, more specifically, resides in the improvement comprising in combination a source of spatially concentrated light, a slit traveling transversely to a longitudinal dimension of said slit for an illumination of elemental areas of said record, and an anamorphic light projecting system including means for emitting a first part of said light from said source to a first region, means at said first region for reflecting said first part from said first region, means spaced from said first region for receiving said reflected first part, collimating said received first part and projecting said collimated first part to a first portion of an elongate second region and through said slit onto said record, said emitting, reflecting and projecting means including means for imaging said first part of the light from said source via said first region, second region and slit onto said record anamorphically only as to a dimension of said spatially concentrated light corresponding to said longitudinal dimension of the slit, means for emitting a second part of said light from said source to a third region, means at said third region for reflecting said second part from said third region, and means spaced from said third region for receiving said reflected second part, collimating said received second part and projecting said collimated second part to a second portion of said elongate second region and through said slit onto said record, said means for emitting, reflecting and projecting said second part including means for imaging said second part of the light from said source via said third region, second region and slit onto said record anamorphically only as to a dimension of said spatially concentrated light corresponding to said longitudinal dimension of the slit, and said apparatus including means for reading illuminated elemental areas of said record.

From another aspect thereof, the subject invention resides in apparatus for reading information perceptible upon illumination of a record of said information and, more specifically, resides in the improvement comprising in combination a source of spatially concentrated light, a slit traveling transversely to a longitudinal dimension of said slit for an illumination of elemental areas of said record, and an anamorphic light projecting system including means for emitting a first part of said light from said source to a first region, means at said first region for collimating said first part at said first region and for reflecting said collimated first part from said first region to a first portion of an elongate second region, said emitting, collimating and reflecting means including means for projecting said reflected collimated first part through said second region and said slit onto said record and for imaging said first part of the light from said source via said first region, second region and slit onto said record anamorphically only as to a dimension of said spatially concentrated light corresponding to said longitudinal dimension of the slit, means for emitting a second part of said light from said source to a third region, means at said third region for collimating said second part at said third region and for reflecting said collimated second part from said third region to a second portion of an elongate second region, said second portion being spaced by a third portion from said first portion, said means for emitting, collimating and reflecting said second part including means for projecting said reflected collimated second part through said second region and said slit onto said record and for imaging said second part of the light from said source via said third region, second region and slit onto said record anamorphically only as to a dimension of said spatially concentrated light corresponding to said longitudinal dimension of the slit, means for emitting a third part of said light from said source to a fourth region, and means at said fourth region for collimating said third part at said fourth region and for projecting said collimated third part from said fourth region to said third portion of said elongate second region, said means for emitting, collimating and projecting said third part including means for projecting said collimated third part through said second region and said slit onto said record and for imaging said third part of the light from said source via said fourth region, second region and slit onto said record anamorphically only as to a dimension of said spatially concentrated light corresponding to said longitudinal dimension of the slit, and said apparatus including means for reading illuminated elemental areas of said record.

From another aspect thereof, the subject invention resides in apparatus for converting a spatially concentrated light output into a band of light and, more specifically, resides in the improvement comprising in combination means for providing a folded light path leading from a source of spatially concentrated light output to a spaced elongate first region, hence to an elongate second region located closer to said source than said first region, and thence to an elongate third region, means for arranging said first, second and third regions in a common plane, said folded light path providing means including a first transparent plate with partially transparent first reflecting surface along said elongate first region and a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light, and means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region.

From another aspect thereof, the subject invention resides in apparatus for converting a spatially concentrated light output into a band of light and, more specifically, resides in the improvement comprising in combination means for emitting a first part of said light output from a source of said spatially concentrated light output to a first region, means at said first region for collimating said first part and for reflecting said collimated first part from said first region to a first portion of an elongate second region, means for emitting a second part of said light output from said source to a third region, means at said third region for collimating said second part and for reflecting said collimated second part from said third region to a second portion of said elongate second region, said second portion being spaced by a third portion from said first portion, and a folded light path including means for emitting a third part of said light output from said source to an elongate fourth region in the form of a divergent sheet extending to said collimated first and second parts and means for projecting said third part from said fourth region by reflection to a fifth region and thence by reflection to said third part of said elongate second region and for collimating light from said divergent sheet into a band of light extending over said third portion upon projection from said fourth region, with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region.

From another aspect thereof, the subject invention resides in apparatus for recording varying electric signals and, more specifically, resides in the improvement comprising in combination a source of spatially concentrated light, means for providing a folded light path leading from said source of spatially concentrated light to a spaced elongate first region, hence to an elongate second region located closer to said source than said first region, and thence to an elongate third region, means for arranging said first, second and third regions in a common plane, said folded light path providing means including a first transparent plate with partially transparent first reflecting surface along said elongate first region, a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light, means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region, means for modulating said band of light with said varying electric signals to provide along said band light outputs varying as a function of said varying electric signals, and means for recording said varying light outputs.

From another aspect thereof, the subject invention resides in apparatus for recording varying electric signals and, more specifically, resides in the improvement comprising in combination a source of spatially concentrated light, means for providing a folded light path leading from said source of spatially concentrated light to a spaced elongate first region, hence to an elongate second region, thence to an elongate third region and thence to an elongate fourth region, said folded light path providing means including means for providing a first reflecting surface along said elongate first region, a second reflecting surface along said elongate second region, and a third reflecting surface along said elongate third region, means for emitting light from said source to said elongate first region in the form of a divergent sheet of light, hence by reflection by said first reflecting surface to said elongate second region, thence by reflection by said second reflecting surface to said elongate third region and thence by reflection by said third reflecting surface to said elongate fourth region, at least one of said first, second and third reflecting surfaces being curved in the direction of elongation of the particular elongate region and another of said reflecting surfaces being convex, for collimating said emitted light into a band of light, means for modulating said band of light with said varying electric signals to provide along said band light outputs varying as a function of said varying electric signals, and means for recording said varying light outputs.

From another aspect thereof, the subject invention resides in apparatus for recording varying electric signals and, more specifically, resides in the improvement comprising in combination a source of spatially concentrated light, means for emitting a first part of said light from said source of spatially concentrated light to a first region, means at said first region for collimating said first part and for reflecting said collimated first part from said first region to a first portion of an elongate second region, means for emitting a second part of said light from said source to a third region, means at said third region for collimating said second part and for reflecting said collimated second part from said third region to a second portion of said elongate second region, said second portion being spaced by a third portion from said first portion, a folded light path including means for emitting a third part of said light from said source to an elongate fourth region in the form of a divergent sheet extending to said collimated first and second parts and means for projecting said third part from said fourth region by reflection to a fifth region and thence by reflection to said third part of said elongate second region and for collimating light from said divergent sheet into a band of light extending over said third portion upon projection from said fourth region, with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region, means for modulating said continuous band of light with said varying electric signals to provide along said continuous band light outputs varying as a function of said varying electric signals, and means for recording said varying light outputs.

From another aspect thereof, the subject invention resides in apparatus for reading information perceptible upon illumination and, more specifically, resides in the improvement comprising in combination a source of spatially concentrated light, means for providing a folded light path leading from said source of spatially concentrated light to a spaced elongate first region, hence to an elongate second region located closer to said source than said first region, and thence to an elongate third region, means for arranging said first, second and third regions in a common plane, said folded light path providing means including a first transparent plate with partially transparent first reflecting surface along said elongate first region, and a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light, means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region, means for subdividing said band of light into elemental portions, means fur successively gating said elemental portions to said information for successively illuminating elemental areas of said information, and means for reading said illuminated elemental areas.

From another aspect thereof, the subject invention resides in apparatus for reading information perceptible upon illumination and, more specifically, resides in the improvement comprising in combination a source of spatially concentrated light, means for emitting a first part of said light from said source of spatially concentrated light to a first region, means at said first region for collimating said first part and for reflecting said collimated first part from said first region to a first portion of an elongate second region, means for emitting a second part of said light from said source to a third region, means at said third region for collimating said second part and for reflecting said collimated second part from said third region to a second portion of said elongate second region, said second portion being spaced by a third portion from said first portion, a folded light path including means for emitting a third part of said light from said source to an elongate fourth region in the form of a divergent sheet extending to said collimated first and second parts and means for projecting said third part from said fourth region to said third part of said elongate second region and for collimating light from said divergent sheet into a band of light extending over said third portion upon projection from said fourth region, with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region, means for subdividing said continuous band of light into elemental portions, means fur successively gating said elemental portions to said information for successively illuminating elemental areas of said information, and means for reading said illuminated elemental areas.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which:

FIG. 1 is an elevation of a prior-art interdigitated electrode array structure;

FIG. 2 is an elevation of an interdigitated electrode array structure useful in the practice of a preferred embodiment of the subject invention;

FIG. 3 is an elevation of an interdigitated electrode array structure useful in the practice of a preferred embodiment of the invention, and a circuit diagram of electrode driver and gate actuation circuitry;

FIG. 6 is a top view of the apparatus of FIG. 5;

FIG. 8 is a top view of a second modification of the apparatus shown in FIGS. 5 and 6;

FIG. 11 is an elevation, partially in section of a solid state oscillograph apparatus in accordance with an embodiment of the subject invention;

FIG. 13 is a section taken along the line 13—13 in FIG. 12;

FIG. 16 is a top view of a solid state oscillograph apparatus in accordance with another embodiment of the subject invention;

FIG. 17 is a side view, partially in section, of the apparatus shown in FIG. 16;

FIG. 18 is a top view of part of a facsimile or document reading apparatus in accordance with an embodiment of the subject invention;

FIG. 19 is a side view of the apparatus shown in FIG. 18;

FIG. 20 is a top view of a micro-imaging apparatus in accordance with an embodiment of the subject invention;

FIG. 21 is a side view of the apparatus shown in FIG. 20;

FIG. 23 is a top view of the apparatus of FIG. 22; and

FIG. 24 is a top view of a modification of the apparatus shown in FIG. 11.

DESCRIPTION OF PREFERRED EMBODIMENTS

Figure 4:
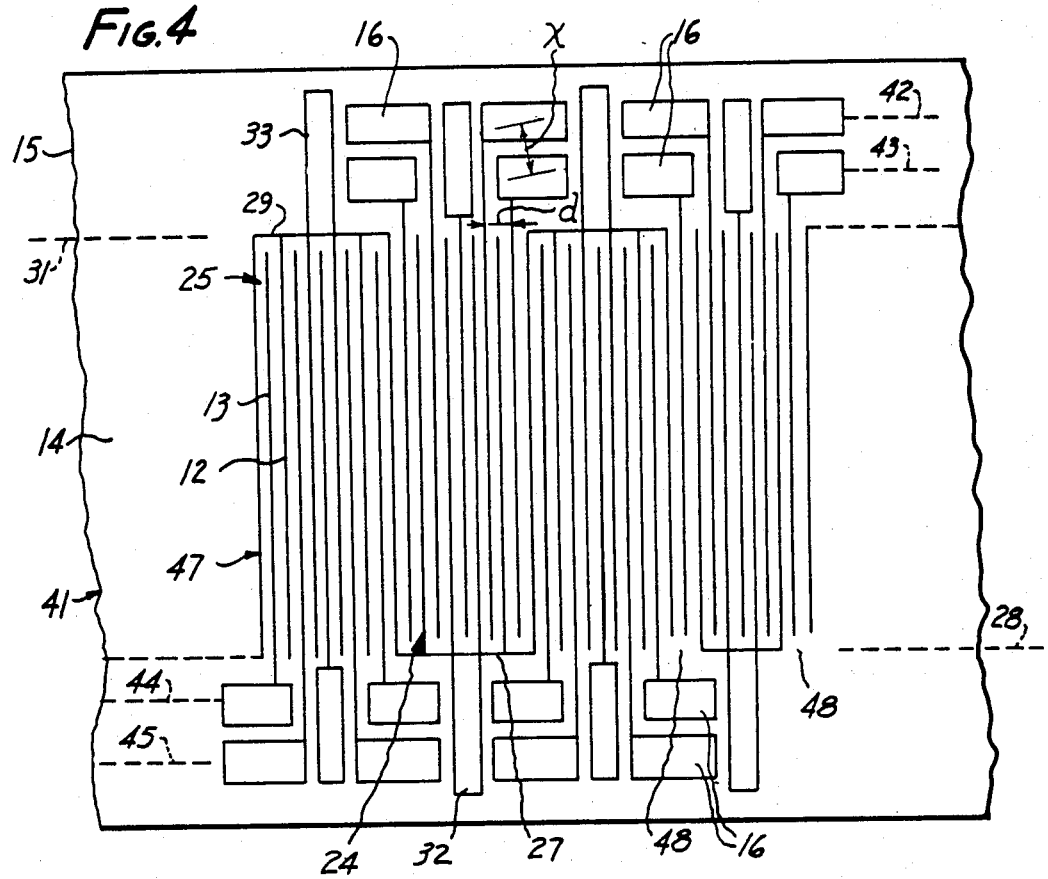
FIG. 4 is an elevation of a further interdigitated electrode array structure.

By way of background several electrode array structures useful in the practice of special aspects of the subject invention will first be described.

The prior-art electrode array structure 10 shown in FIG. 1 has spaced parallel interdigitated first and second electrodes 12 and 13 alternating along an elongate region 14 of a substrate 15. Depending on the use of the electrode array structure, the substrate 15 may be merely a support for the electrodes or may be a chip or other structure on which a voltage or electric current supplied to the electrodes act. If desired, the substrate 15 may be supportive of a material on which a voltage or electric current supplied to the electrodes acts. For instance, the substrate may include or be supportive of a photoconductor material if the electrode array structure is to act as or in an otpical scanner or some such apparatus. The substrate 15 may include or be supportive of a low Curie point material if the electrode array is to have a thermomagnetic or thermoremanent function. In the case of light arrays, the substrate 15 may consist or be supportive of an electrooptically active material, such as a PLTZ or other solid state compound. Other compositions of the substrate and other uses of the electrode array structures herein shown or disclosed are apparent within the confines of the state of the art in various fields of endeavor.

The formation or deposition of electrode structures on various substrates is a well-established art. Suffice to say, therefore, that the electrode structure may be deposited on the substrate by evaporation, plating or sputtering, and that preferred electrode materials include gold, indium, chromium and aluminum, depending on the use of the electrode structure.

The width or thickness of the individual electrode wires or strips also depends on the intended utility. For electrooptical applications an electrode thickness or width of 10 to 50 $\mu$m is typical. The spacing d between adjacent electrodes generally determines the resolution of the electrode array or the resolution attainable therewith. For instance, in an electrooptical device, the spacing between adjacent electrodes determines the number of light gates that can be provided per unit of linear measure, such as inch or centimeter. In this respect, the size of the electrode terminals 16 cannot arbitrarily be reduced even where a reduction of electrode thickness or width is possible. In electrooptical and other applications, where at least one of the electrodes in each pair such as each electrode 13, has to be individually driven or energized from its own distinct lead 17, 18 et seq. which has to be soldered, welded or otherwise fastened to the particular individual terminal 16, the requisite terminal size, rather than the attainable minimum electrode thickness or width is in fact the determinant of electrode spacing and thus of attainable electrode density and resulting resolution.

In many applications, a common electrode or lead 19 may be provided for jointly energizing one type of electrodes, such as the electrodes 12 as shown in FIG. 1. Such common electrode 19 may have its own terminal 20 which then serves as a common terminal for the electrodes 12.

In practice, and as may be seen from FIG. 1, even use of a common terminal 20 for one-half of the electrodes does not as such prevent the minimum attainable spacing d between adjacent second electrodes 13 from being in effect dictated by the minimal permissible spacing between the inevitably larger individual electrode terminals 16 having a center-to-center distance x.

Assuming for the purpose of comparison the minimum permissible spacing between adjacent terminals 16 to be as shown in FIG. 1, it is apparent that only thirteen gate electrodes 13 can be accommodated within the given length of electrode array shown in FIG. 1. This means that only 26 interelectrode spaces or light gates can be provided within the illustrated length. In practice, this may further reduce itself to thirteen actual light gates, since each individual electrode 13 controls or gates the two spaceqs between itself and the adjacent common electrodes 12.

FIG. 2 shows an electrode array structure providing a higher electrode density. In particular, the spaced parallel interdigitated first and second electrodes 12 and 13 in the electrode array structure 23 shown in FIG. 2 are subdivided into first and second electrode arrays 24 and 25 alternating with each other along an elongate region 14 of the substrate 15.

To render the electrode structure 23 practically effective, a plurality of first electrodes 12 and a plurality of second electrodes 13 are allocated to each of the two types of electrode arrays 24 and 25.

Each plurality of first electrodes 12 in each first electrode array 24 is provided with a first common electrode 27 located at a first side 28 of the elongate substrate region 14. Conversely, each plurality of first electrodes 12 in each second electrode array 25 is provided with a second common electrode 29 located at an opposite second side 31 of the elongate region 14. Terminals 32 and 33 are provided for the first and second common electrodes 27 and 29. As before, an individual terminal 16 is provided for each of the second electrodes 13. According to FIG. 2, any individual terminal 16 of any one second electrode 13 is spaced from any other individual terminal of any adjacent second electrode 13 by a center-to-center distance x greater than the center-to-center spacing d between that one second electrode 13 and the particular adjacent second electrode 13. It will thus be seen that, in structural terms, each first electrode array 24 has a plurality of first electrodes 12 and a plurality of second electrodes 13, with the first and second electrodes 12 and 13 of each first electrode array 24 being parallel to and spaced from each other, and interdigitated along part of the elongate region 14. Each first electrode array 24 further has a first common electrode 27 for the first electrode 12 in the particular first electrode array 24, with such first common electrode 27 being located at a first side 28 of the elongate region 14.

Each second electrode 13 in each first electrode array further has an individual terminal 16, with any individual terminal 16 of any second electrode 13 being spaced from any other individual terminal 16 of any adjacent second electrode 13 by a center-to-center distance greater than the center-to-center spacing between that one second electrode 13 and the particular adjacent second electrode 13.

Similarly, each second electrode array 25, in structural terms, has a plurality of first electrodes 12 and a plurality of second electrodes 13, with the first and second electrodes of each second electrode array being parallel to and spaced from each other and being interdigitated along part of the elongate region 14.

Each second electrode array 25 further includes a second common electrode 29 for the first electrodes 12 in the particular second electrode array 25. That second common electrode in each second array 25 is located at a second side 31 of the elongate region 14. There again is an individual terminal 16 for each second electrode in each second array 25. In accordance with the illustrated preferred embodiments, any individual terminal 16 of any one second electrode is spaced from any other individual terminal of any adjacent second electrode by a center-to-center distance x greater than the center-tocenter spacing d between that one second electrode and the particular adjacent second electrode.

The first and second common electrodes 27 and 29 have terminals 32 and 33.

In the illustrated preferred electrode arrays, the individual terminals 16 of the second electrodes 13 in each of the first electrode arrays 24 are arranged or located at the above mentioned second side 31 of the elongate region 14 of the substrate 15. Conversely, the individual terminals 16 of the second electrodes 13 in each of the second electrode arrays 25 are arranged or located at the first side 28 of the elongate region 14.

In practice, this enables a convenient and advantageous attachment of driver or lead wires to the second electrodes 13 at both sides of the substrate 15. In the versions of FIGS. 2 and 3, this also enables the individual terminals 16 to be spread out for increased spacing therebetween and/or increased density of the electrodes 12 and 13. As shown in FIGS. 2 and 3, slanted leads or electrode portions 13' may be employed to provide appropriate connections between the second electrodes and their individual terminals 16.

According to FIGS. 2 and 3, the individual terminals 16 of the second electrodes 13 in each of the first electrode arrays 24 are aligned along the second side 31 of the elongate substrate region 14. Conversely, the individual terminals 16 of the second electrodes 13 in each of the second electrode arrays 25 are aligned along the first side 28 of the elongate region 14.

At least in terms of efficiency and ease of connection, such an arrangement is presently preferred.

Further in accordance with FIG. 2, not only the individual terminals 16 of the second electrode 13 in each of the second electrode arrays 25, but also the terminals 32 for the first common electrodes 27 are located at the first side 28 of the elongate region 14. In fact, the individual terminals 16 of the second electrodes 13 in each of the first electrode arrays 24 and the second terminals 33 for the second common electrode 29 preferably are arranged at the second side 31 of the elongate region 14.

Further in accordance with FIG. 2, the individual terminals 16 of the second electrodes 13 in each of the first electrode arrays 24 are aligned along a first line 35 on the second side 31 of the elongate substrate region 14. Conversely, the individual terminal 16 of the second electrodes 13 in each of the second electrode arrays 25 are aligned along a second line 36 on the first side 28 of the elongate region 14.

Terminals means 32 for first common electrodes 27 are aligned along a third line 37 different from the first and second lines 35 and 36 and located on the first side 28 of the elongate region 14. Also second terminals 33 for the second common electrodes 29 are aligned along a fourth line 38 different from the first, second and third lines 35, 36 and 37 and located on the second side 31 of the elongate region 14.

In practice, this permits maximum spacing between adjacent terminal pairs 16, 16; 16, 32; and 16, 33. For a given minimum spacing between such electrode pairs, a maximum interdigitated electrode density is possible.

FIG. 3, on a somewhat enlarged scale, shows an electrode structure 39 which in many respects is similar to the electrode structure shown in FIG. 2. In addition, FIG. 3 shows the individual terminals 16 of the second electrodes 13 in the second electrode arrays 25 and terminal means 24 for the first common electrodes 27 aligned along the first side 28 of the elongate region 14.

Similarly, the individual terminals 16 of the second electrodes 13 in each of the first electrode arrays 24 and the second terminal means 33 for the second common electrodes 29 are aligned along the second side 31 of the elongate region of the substrate. In terms of efficiency and ease of interconnection, this mutual alignment of individual and common electrodes 16/32 on the one side and 16/33 on the other side is most advantageous. Also, the terminals 16, 32 and 33 in FIG. 3 are in the form of rectangular tabs or deposits, lending themselves to a rugged and reliable interconnection with the drive or energizing cables. By way of contrast, a further electrode structure 41 is shown on an enlarged scale in FIG. 4.

According to FIG. 4, some or part of the individual terminals 16 of the second electrodes 13 in each of the first electrode arrays 24 are aligned along a first line 42 on the second side 31 of the elongate region 14 of the substrate 15.

The remainder of the individual terminals 16 of the second electrodes 13 in each of the first electrode arrays 24 is aligned along a different second line 43 on that second side 31 of the elongate region 14.

Conversely, part of some of the individual terminals 16 of the second electrodes 13 in each of the second electrode array 25 are aligned along a third line 44 on the first side 28 of the elongate region 14, while the remainder of the individual terminals of the second electrodes 13 in each of the second electrode arrays 25 is aligned along a fourth line 45 different from the first, second and third lines 42, 43 and 44 and located on the first side 28 of the elongate region 14.

As before, any individual terminal 16 of any one second electrode 13 is spaced from any other individual terminal 16 of any adjacent second electrode by a center-to-center distance x greater than the center-to-center spacing d between that one second electrode 13 and the particular adjacent second electrode 13.

The principle of the illustrated preferred embodiments, of the defined distance x being greater than the corresponding defined spacing d may also be applied to the common electrode terminals 32 and 33 relative to adjacent individual terminals 16, as has already been indicated above. In particular, any of the first terminals 32 for first common electrodes 27 is preferably spaced from any adjacent individual terminal 16 of any one second electrode 13 by a center-to-center distance x greater than the center-to-center spacing d of any two second electrodes 13 being adjacent each other.

Similarly, any of the second terminals 33 for second common electrodes 29 is preferably spaced from any adjacent individual terminal 16 of any one second electrode by a center-to-center distance x greater than the center-to-center spacing d of any two second electrodes 16 which are adjacent each other. This principle has been applied to the embodiments of FIGS. 2, 3 and 4.

In accordance with a further preferred embodiment, the first and second common electrodes 27 and 29 and adjacent first electrodes 13 include one common serpentine or square-wave common electrode 47, as is the case in FIGS. 2, 3 and 4. The provision of such serpentine electrode may have the advantage of obviating some of the common terminals 32 and 33.

However, if common terminals 32 and 33 can conveniently be provided on both sides 28 and 31 of the elongate substrate region 14 and can conveniently be associated with each common electrode 27 and 29, the serpentine common electrode 47 may be dispensed with, such as by providing breaks in the interconnections of corresponding common electrodes 27 and 29, such as shown at 48. In practice, such breaks may be desirable if a serpentine common electrode would display an objectionable induction in terms of switching speed or another parameter.

Depending on conductivity or current carrying capacity requirements, the common electrodes 27 and 29 may be made wider or otherwise provided with a larger effective cross-section, such as shown in two instances in FIG. 2.

The electrode array structures herein shown may be employed in the electrooptical equipment herein disclosed, although their utility obviously is not so limited.

Figure 5:
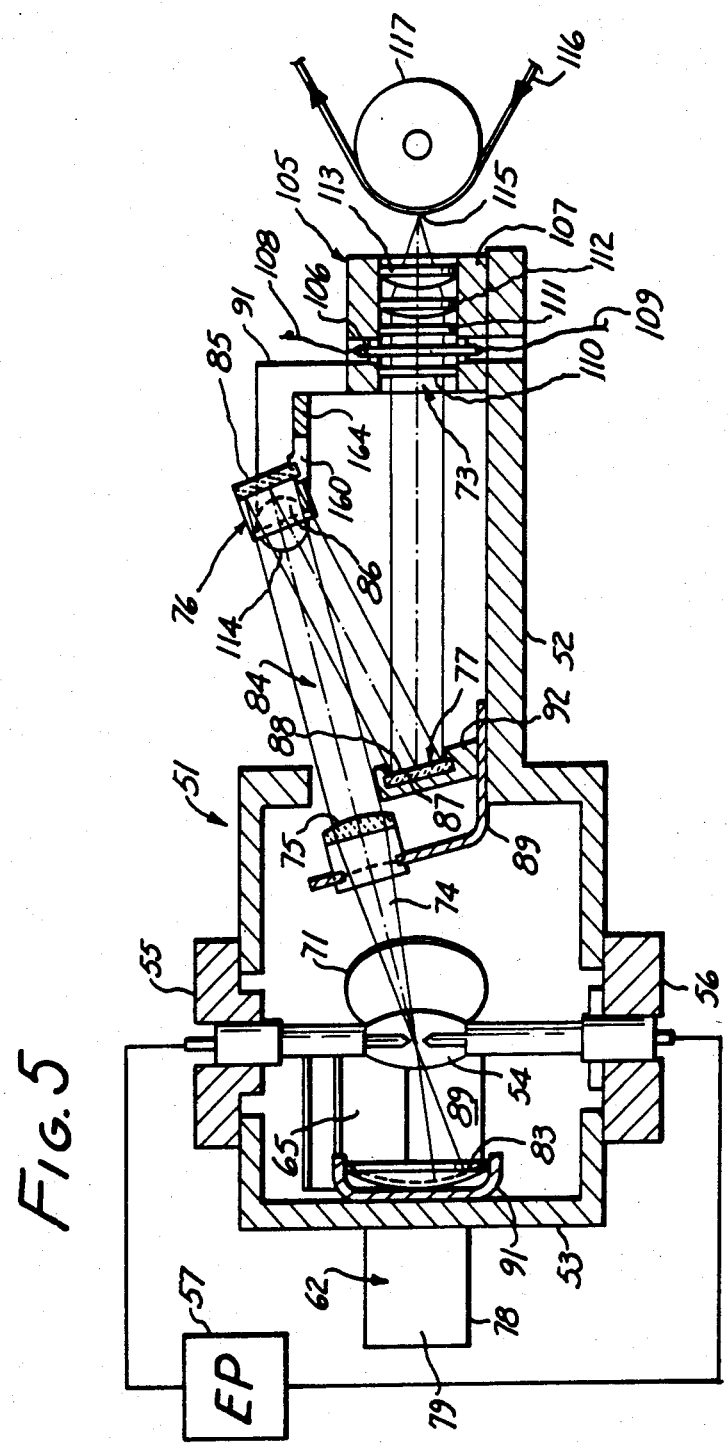
FIG. 5 is a section, taken along the line 5—5 in FIG. 6, of a solid state oscillograph apparatus in accordance with an embodiment of the subject invention.

The solid state oscillograph apparatus 51 shown in FIGS. 5 and 6 has a base 52 and a lamp housing 53. A source of spatially concentrated light output, such as a short arc gas discharge lamp 54 is mounted in the lamp housing by means of sockets 55 and 56 and is electrically energized from a conventional electric power source 57. The showing of the lamp housing 53, socket mounts 55 and 56 and power source 57 has been omitted in FIG. 6 for increased clarity.

As best seen in FIG. 6, a first part 61 of the light output of the source of spatially concentrated light 54 is emitted to a first region 62 and is reflected at that first region 62 to a first portion 63 of an elongate second region 64. The means for emitting the first part of light 61 include a cylindrical belt lens 65 and a lamp reflector 66. Cylindrical belt lenses as such are known in the oscillography art and in effect consist of an elongate lens which is cylindrical in a direction transverse to its direction of elongation and which is curved in its direction of elongation. The lamp mirror 66 reflects light emitted by the lamp 54 and adds such reflected light to the first light part 61 emitted to the first region 62. Similarly, a second part 67 of the light output of the lamp 54 is emitted to a third region 68 by means of a belt lens 69 and a projector or lamp mirror 71.

The second light part 67 is reflected from the third region 68 to a second portion 72 of the elongate second region 64, such second portion 72 being spaced by a third portion 73 from the above mentioned first portion 63.

A third or central part 74 of the light output of the source 54 is emitted with the aid of a belt lens 75 to an elongate fourth region 76. Such emitted third light part 74 is reflected from the fourth region 76 to an elongate fifth region 77. The thus reflected third light output part 74 is reflected from the fifth region 77 to the third portion 73 of the elongate second region 64 to provide a continuous band of light extending over the first, second and third portions 63, 72 and 73 of the elongate second region. As seen in FIG. 6, and as will become more fully apparent in the further course of this disclosure, the first, second and third light output parts 61, 67 and 74 are collimated at the first, third and fourth regions 62, 68 and 76, respectively, and such collimated first, second and third light output parts are reflected from the first, third and fourth regions 62, 68 and 76, respectively, to the first, spaced second and intervening third portions 63, 72 and 73 of the elongate second region 64. Also, it should be understood that the band of light which has been converted from the spatially concentrated light output of the point-type light source 54 extends continuously through the elongate second region 64 without break in continuity between the first and third portions 63 and 73 and second and third portions 72 and 73 of such second region 64, even though clarity of illustration may have dictated a type of showing of the light paths that may suggest a lateral discontinuity to the superficial observer.

This is not to say that the light uniformity has to be absolutely constant throughout the entire extent of the converted light band. Rather, the light intensity value may increase or decline somewhat within sensitivity tolerances of the oscillograph paper, reading photocell or other employed light recipient, whereby the converted band of light in effect has a practical uniformity subject to permissible tolerances.

In the illustrated preferred embodiment of FIGS. 5 and 6, the first and third regions 62 and 68 are arranged or extend symmetrically relative to the fourth or fifth region 76 or 77 or relative to the light source 54. This preferred arrangement maximizes efficiency, relative economy of means and uniformity of the resulting light band.

The means for emitting or reflecting the first light output part 61 include a curved mirror 78 providing a first curved reflecting surface 79 for reflecting the first part of the light output to the first portion 63 of the elongate second region 64.

Similarly, the means for emitting or reflecting the second light output part 67 include a curved mirror 81 located in the elongate third region 68 for reflecting the second light output part 67 to the second portion 72 of the elongate second region 64.

As seen in FIG. 6, the mirror 78 and 81 or reflecting surfaces 79 and 82 are concavely curved.

According to the illustrated preferred embodiment shown in FIGS. 5 and 6, the first, second, third and fifth regions 62, 64, 68 and 77 are arranged or located in a common plane. The first part 61 of the light output of the lamp 54 is projected along the common plane from the first region 62 to the first portion 63 of the second region 64. Similarly, the second light output part 67 is projected along the common plane from the third region 68 to the second portion 72 of the elongate second region 64. The third light output part 74 is projected along the common plane to the third portion 73 of the elongate second region. As seen in FIG. 5, the third light output part 74 is in effect projected from the elongate fifth region 77 to the third portion 73 of the second region 64.

However, it also is to be noted that the third part 74 of the light source output is emitted or projected with the aid of a lamp reflector 83 along a folded light path 84 leading from the source 54 to the fourth region 76, hence by reflection to the fifth region 77 located closer to the source 54 than the fourth region 76, and thence by reflection to the third portion 73 of the elongate second region 64.

The method and apparatus for converting a spatially concentrated light output 74 into a band of light at the third portion 73 of the elongate second region 64 has utility not only in the context of the remainder of the light emission and reflection equipment shown in FIG. 6, but also is of independent utility in converting a spatially concentrated light output into a band of light, and will thus presently be discussed in greater detail.

In particular, the folded light path 84 is provided with the aid of a mirror 85 providing a reflecting surface 86 along the elongate region 76, and a mirror 87 providing a reflecting surface 88 along the elongate region 77.

At least one of the mirrors 85 and 87 or reflecting surfaces 86 and 88 is curved in the direction of elongation of the particular elongate region 76 and 77. In the preferred embodiment shown in FIG. 6, it is the mirror 85 or its reflecting surface 86 which is concavely curved in the direction of elongation of the elongate region 76.

In the folded light path 84 shown in FIGS. 5 and 6, the elongate fifth region 77 is laterally offset from a plane through the source 54 (i.e. through the center of the arc between the lamp electrode) and through a longitudinal dimension of the elongate fourth region 76. In terms of the above mentioned common plane, it may also be said that the elongate fourth region 76 and the belt lens 75 are laterally offset relative to that common plane.

Since many means for mounting lenses and mirrors are known and available or readily constructible, only some mounting means have been shown in FIG. 5 by way of example. For instance, the belt lenses 65 and 75 may be mounted on similar slanted brackets 89 attached to the base 52. Mounting brackets 91 and 92 have also been shown for the mirrors 85 and 87 in the folded light path 84. The lamp reflector mirrors 66, 71 and 83 may be mounted by brackets, one of which is shown at 91 in FIG. 5 as attached to the lamp housing 53.

In the illustrated preferred embodiment shown in FIGS. 5 and 6, the regions 76 and 77, being in effect the first and second regions of the folded light path 84, are arranged within the space between the source of light 54 and the third portion 73 of the elongate region 64.

Figure 7:
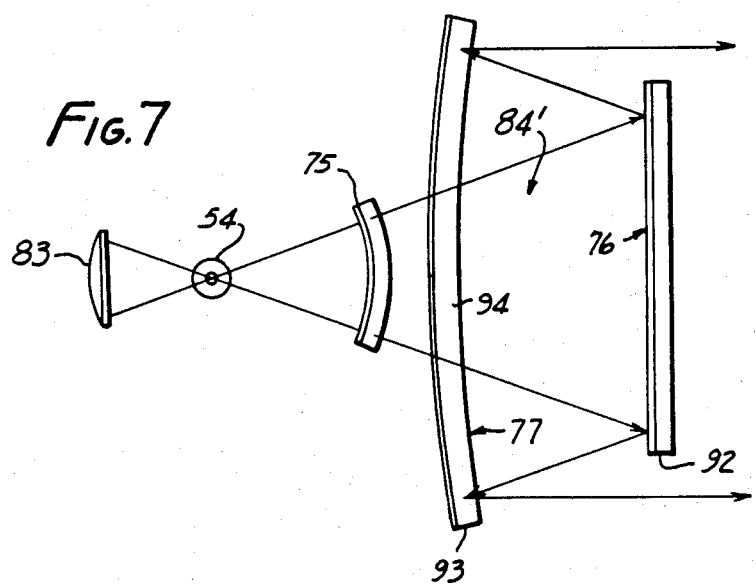
FIG. 7 is a top view of a first modification of the apparatus of FIGS. 5 and 6.

A modification of the folded light path 84 shown in FIGS. 5 and 6 is shown at 84' in FIG. 7, where an elongate planar or straight mirror 92 with a planar or straight reflecting surface extends along the elongate fourth region 76, while a concavely curved mirror 93 with a concavely curved reflecting surface 94 extends in the elongate fifth region 77. In that case, the longitudinal dimension of the mirror 92 in the fourth region 76 may be smaller than the longitudinal dimension of the mirror 93 in the fifth region 77. The embodiment shown in FIG. 7 may be used in the embodiment of FIGS. 5 and 6 by way of modification, or may be used independently.

By way of further modification of the embodiment shown in FIGS. 5 and 6, FIG. 8 shows a folded light path 84'' in which one of the mirrors or reflecting surfaces is convexly curved. For present purposes, this is permissible when the overall or net curvature of the optical system of the folded light path is concave or at least acts in the nature of a concave system yielding parallel light output for the illumination of the light gate array.

Accordingly, an elongate convex mirror 95 with a convexly curved reflecting surface extends along the fourth region 76, while an elongate concave mirror 96 with a concavely curved reflecting surface 97 extends in the fifth region 77. The curvature of the concave mirror 96 is stronger than the curvature of the convex mirror 95 so that the overall curvature or effect of the folded light path system 84'' is concave for a collimated orientation of the resulting light output. In the embodiments of FIGS. 5 to 8, and in other embodiments herein disclosed, the cylindrical belt lens collimates the light in a first direction and the associated mirror further collimates the light in a perpendicular second direction.

Figure 9:
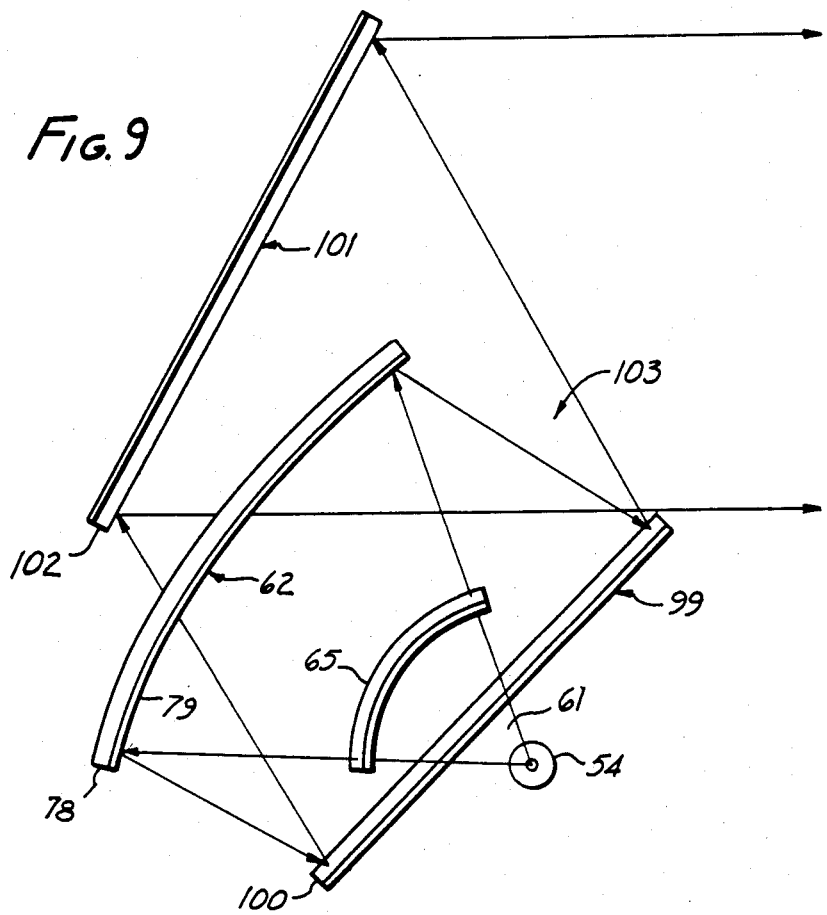
FIG. 9 is a top view of a third modification of the apparatus shown in FIGS. 5 and 6.
Figure 10:
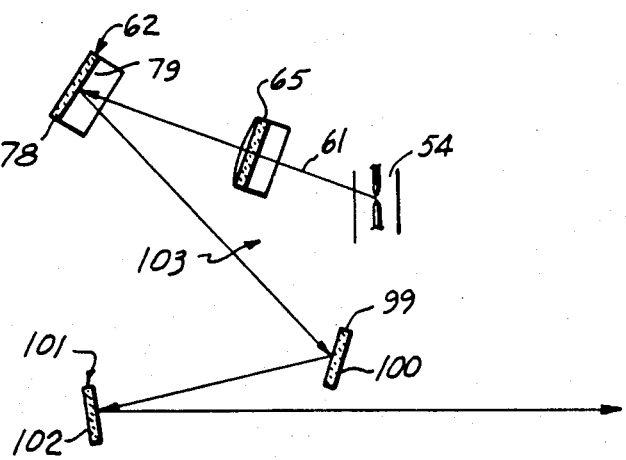
FIG. 10 is a side view of the modification shown in FIG. 9.

By way of further modification, FIGS. 9 and 10 show a top and side view of a folded light path system which may be employed in the embodiment of FIGS. 5 and 6 in substitution or modification of the lateral light band producing means.

Of course, the system illustrated in FIGS. 9 and 10 has utility apart from the system of FIGS. 5 and 6 also.

The first part 61 of the light output of the source 54 is in FIGS. 9 and 10 again emitted via belt lens 65 in the form of a divergent sheet of light to a curved mirror 78 presenting a concave reflecting surface 79 in the elongate region 62. The surface 79 reflects the light to an elongate region 99 occupied by a mirror 100. The mirror 100 reflects the light to a further elongate region 101 occupied by a mirror 102 which further reflects the light to the first portion 63 of the elongate second region 64, for instance.

It is thus seen that the folded light path 103 in the embodiment of FIGS. 9 and 10 leads from a source 54 of spatially concentrated light to a spaced elongate region 62 hence by reflection by the reflecting surface 79 of the mirror 78 to an elongate region 99, thence by reflection by the mirror 100 to the elongate region 101 and thence by reflection by the mirror 102 to a further elongate region, such as the portion 63 of the second region 64 shown in FIG. 6.

At least one of the mirrors or reflecting surfaces in the folded light path 103 is curved in the direction of elongation of the particular elongate region it occupies. In the embodiment shown in FIGS. 9 and 10, it is the mirror 78 which is concavely curved. However, such as with reference to FIG. 7, another of the mirrors shown in FIGS. 9 and 10 may be curved.

Also, with reference to FIG. 8, one of the mirrors in the folded light path 103 of FIGS. 9 and 10 may be convexly curved, as long as the overall curvature or net effect of the light path is concave to provide the desired parallelism in or collimation of the light output. With further reference to the embodiment shown in FIGS. 9 and 10, it will be noted that the second-in-line region 99 is situated closer to the light source 54 than the first region 62. Also, the third-in line region 101 is situated farther from the light source 54 than the second-in-line region 99.

The second-in-line region 99 is laterally offset from a plane through the source 54 of spatially concentrated light and a longitudinal dimension of the elongate first region 62.

The same applies to the third-in-line region 101 which, moreover, is laterally offset from a plane through longitudinal dimensions of the elongate regions 62 and 99, to provide the folded light path 103 as shown in FIGS. 9 and 10.

The illustrated preferred embodiments of FIGS. 5 to 10 are ideally suited to provide light outputs requisite for the recording of varying electric signals. In this respect, it should be understood that the recording of electric signals need not be an end in itself. For instance, the information to be recorded need not originally be contained in an electric signal. Rather, information or a varying parameter may be transduced to a varying electric signal which is employed to drive a galvanometer or light modulator or gate.

In fact, the illumination systems herein disclosed are ideally suited for illuminating PLZT or other solid state light gates because of the high intensity realizable with spatially concentrated or point-type light sources and the high collimation or parallelism and light intensity uniformity realizable with the disclosed optical systems despite the concentrated or point-type origin of the light output.

If a given light gate array is relative wide, the requisite illumination is preferably generated in several parallel stages or parts, such as the light output parts 61, 67 and 74 shown in FIG. 6 and jointly illuminating the elongate region 64 via its contiguous portions 63, 72 and 73.

On the other hand, shorter light gate arrays may be illuminated in only one stage, such as only the center portion or folded light path 84 shown in FIGS. 5 and 6 or the folded light path 103 shown in FIGS. 9 and 10.

An elongate light gate assembly 105 is shown in FIGS. 5 and 6 located on the baseplate 52 for illumination by the continuous light band provided along the second elongate region 64. The assembly 105 has a light gate structure 106 contained in a mount 107 positioned on the base 52.

The plate-like elongate structure 106 includes the PLZT or other employed electrooptically active solid state material, if necessary on a transparent supporting substrate.

Lead wires or cables 108 and 109 are connected to electrode arrays located on the PLZT or other solid state material.

In accordance with an embodiment of the subject invention, one of the interdigitated electrode arrays shown in FIGS. 1 to 4 is employed in the light gate structure 106 to provide a multitude of high-density light gates along the assembly 105 for optimum resolution.

The light gate assembly also includes the traditional crossed light polarizer plates comprising a polarizer 110 and analyzer 111 between which the solid state light gate structure 106 is positioned. According to FIG. 5, the assembly 105 also includes two elongate cylinder lenses 112 and 113 mounted in tandem in the mount 107 to provide a recording lens system having a short focal lens and low aberrations.

In this respect, it may be noted in practice that the tilt of the mirrors, such as the mirror 85, should advantageously be different between the centers and the ends, since the vertical angles of reflection are slightly different as between the axial and the marginal rays. Accordingly, the mirrors may be slightly twisted, such as by mounting metal mirrors rigidly at their centers while applying torsion at the ends. An angularly adjustable mirror mounting member for applying a controlled torsion to the mirror 85 is indicated at 114 in FIG. 5.

In practice, a bracket 160 may engage a central portion of the mirror 85 midway between its outer ends at the mounting brackets 91. The bracket 160 may project from a bar 164 connected to and extending between the mounting brackets 91. In this manner, the central portion of the mirror 85 may be held stationary against the torsion applied by the angularly adjustable mirror mounting members 114 at opposite ends of the mirror.

The recording lens system comprising the cylinder lenses 112 and 113 projects light gated by the structure 106 with crossed polarizers 110 and 111 as a spot 115 onto a light-sensitive paper or other recording medium 116 which is advanced relative to the light gate assembly 105 via a drum 117 driven by a motor 118, as shown in FIG. 6.

There are several techniques by means of which the band of light provided by the optical system may be modulated to provide, along the light band, light outputs varying as a function of the varying electric signals or other input parameters, whereby the varying light outputs may be recorded on the medium 116. For instance, different elemental portions of the light band at the elongate second region 64 may be selectively gated to provide a light spot 115 shifting as a function of the varying electric signals or parameters, whereby such shifting light spot may be recorded on the traveling medium 116 as an oscillograph trace 120. Of course, light within a given elemental area will not travel as such to other elemental areas. Rather, the successive gating of different elemental areas in effect will give the impression of a traveling light spot manifesting itself in the recorded oscillograph trace 120.

The light gate assembly 105 subjects light from the band of light at the elongate region 64 to light-blocking crossed polarization by means of the polarizer and analyzer 110 and 111, and the gated solid state element 106 selectively overcomes the light-blocking property of the crossed polarization to provide the requisite varying light outputs or light spot 115 shifting as a function of the varying input signals and resulting in the oscillograph trace 120 either directly in the case of a direct-print oscillograph paper or similar recording medium or after photographic or other development, depending on the nature of the recording medium 116.

In this respect, any of the embodiments illustrated in FIGS. 5 to 10 or of subsequently discussed embodiments, such as the embodiment of FIGS. 22 and 23, may be employed for this purpose. Various means exist for gating or driving the light gate of the assembly 105. As shown in FIG. 3, gating current of the requisite voltage may be provided by an electric power source 122 which is selectively connected to individual electrodes 13 via individually controlled switches 123 and 124 in a control 125.

Of course, the control 125 typically has an individual switch for each light gate. Also typically, these switches modernly would be of an electronic nature. By way of example, the gating switches may form part of an electronic encoder which renders the varying signals to be recorded suitable for driving the light gates.

In their solidly illustrated rest position, the switches 123, 124, etc. in the control 125 maintain the individual gate electrodes 13 connected to ground or earth 126. In its actuated condition, indicated by a dotted line, each switch in the control 125 connects its associated individual gate electrode 113 to the driver source 122 for an opening of the particular light gate.

Inductive, capacitive and other phenomena affecting PLZT and other solid state light gates tend to put limitations on attainable switching speeds thereby impeding the progress of solid state oscillograph, facsimile and other equipment. I have found that this impediment can be ameliorated by a predetermined preconditioning of the light gates to subsequent opening in response to driving signals.

In terms of the electrode array shown in FIG. 3, the light gates between interdigitated first and second electrodes 12 and 13 are electrically biased to an initially open condition. To this end, a source of electric bias potential 127 is provided between ground and the common electrodes 27 and 29. A variable potentiometer 128 is connected to the source 127 for an adjustment of the bias potential.

In the rest position of the switches 123 and 124, an electric bias circuit extends from the source 127 through the potentiometer 128 and its movable contact to the common terminals 32 and 33 and hence through first electrodes 12, adjacent light gates, second electrodes 13, individual terminals 16, and further in parallel through switches 123 and 124 in their solidly illustrated rest position illustrated by solid lines, and thence to ground 126 and the grounded side of the source 127.

In this manner, the light gates between the interdigitated electrodes 12 and 13 are biased to an initially open condition. The extent of this open condition is adjusted by adjustment of the potentiometer 128. Such adjustment, in turn, is attuned to the sensitivity of the recording medium or paper 126.

In particular, the light-sensitive recording medium 116 typically has a certain threshold value of sensitivity. For instance, in the case of direct print recording paper, there is an intensity inertia or reciprocity failure which permits a certain light leakage without a display of undesirable background fog.

In general terms, the light gates of the assembly 105 are illuminated with light of a first intensity above zero light intensity. The light sensitive recording medium 116 is sensitive to illumination levels at light intensities including the mentioned first light intensity and starting at a second light intensity below that first intensity and above zero light intensity. The source 127 is dimensioned and the potentiometer 128 adjusted to provide a first voltage for biasing the light gates to an initially open condition wherein the gates pass light from the mentioned first-intensity illumination at an intensity above zero light intensity, but below the mentioned second light intensity at which the recording medium would be fogged.

Accordingly, the bias source 127 and potentiometer 128 constitute means for exposing the recording medium 116 to the light passed by the preconditioned gases in their initially open condition whereby the recording medium is exposed to light below the mentioned second intensity.

The preconditioned light gates 129 are thereupon selectively energized and further opened in response to the varying signals to be recorded by selective energization of the switches 123, 124, etc. in the control 125, so as to pass light from the above mentioned first intensity illumination at at least the second light intensity at which the recording medium 116 is sensitive and will provide a recording of the luminous representation of the varying input signal.

In order to open the light gates 129 selectively, the electric sources 122 and 127 may be operated in series as shown in FIG. 3. In this manner, it is possible to operate with a source 122 having only a voltage that would not by itself satisfactorily open the light gates in response to the input signal to be recorded. In particular, the gate driver source 122 may have a second voltage only capable by itself of opening the light gates to pass light from the above mentioned first-level illumination at a level below the second light intensity at which the recording medium is sufficiently sensitive. In practice, this statement may have to be interpreted within an appropriate time frame relating to the employed solid state light gate material. For instance, it may be that the mentioned second voltage would eventually be capable of opening the light gates sufficiently, but would not be so capable within a given time period required for a desired rapid response. This frequently occurring situation is intended to be encompassed within the statement of "a second voltage only capable by itself of opening the light gates to pass light from the mentioned first-intensity illumination at a level below the mentioned second light intensity".

If voltage provided by the bias source 127 and adjusted potentiometer 128 is called a first voltage, then the second voltage provided by the gate driver 122 is capable in combination with the electric bias having the mentioned first voltage of opening the light gates to pass light from the above mentioned first-intensity illumination at at least the mentioned second light intensity at which an oscillograph trace 120 or a facsimile signal will be recorded.

By way of further modification of the embodiment shown in FIGS. 5 and 6, FIG. 11 shows a system in which light is emitted from the source 54 through the region 77 to the first region 76, hence by reflection to the second region 77, and thence by reflection to the region 64 at its portion 73.

In the embodiment shown in FIG. 11 the region 77 is occupied by a transparent plate 131 mounted on the base 55 and having a coating of a partially transparent, reflective film 132. The elongate region 76 is occupied by a transparent plate 133 mounted on the base 52 at a distance from the plate 77 and having a partially transparent reflective film. The plate 132 is closer to the light source 54 than plate 133.

Also, at least one of the plates 132 and 134 is curved in the direction of elongation of the particular region 77 or 76 for collimating emitted light into a band of light. According to FIG. 11, the plate 133 is curved concavely as seen from the point of view of the coating 134. The principles illustrated in FIGS. 7 and 8 may be employed to curve either one or both of the plates 131 and 133. For instance and as shown in FIG. 24, a partially transparent concave plate 131' or reflecting surface 132 may be substituted for the plate 131 in the embodiment of FIG. 11 in analogy to the concave mirror 96 or reflecting surface 97 in the embodiment of FIG. 8, and a partially transparent convex plate 133' or reflecting surface 134 may be substituted for the plate 133, also in analogy to the embodiment of FIG. 8.

Plates with partially transparent, reflective films delimiting an air space therebetween are known from the Fabry-Perot interferometer [see C. Fabry and A. Perot, Ann. Chim. Phys. (7), 16 (1899), 115, or Max Born, PRINCIPLES OF OPTICS (3rd Ed), Pergamon Press, 1965, 7.6.2, pp. 329 et seq.].

It is an advantage of the embodiments shown in FIGS. 11 and 24 that the third part of light 74 from the source 54 can be projected in the common plane in which the first and second parts 61 and 67 are projected. Of course, the embodiments of FIGS. 11 and 24 have utility ihdependently of the embodiment of FIG. 6, and it may generally be said that the embodiments of FIGS. 11 and 24 process light from the source 54 in planes parallel to the base 52.

In particular, light is emitted from the source 54 with the aid of the belt lens 75 through the transparent plate 131 or 131' and partially transparent film 132 to impinge on the partially transparent reflective film 134. That film 134 reflects part of the light back to the film 132 which, in turn, reflects part of the light back to the film 134 for transmission through that partially transparent film and the transparent plate 133 or 133' to the light gate assembly which is thus illuminated by a band of light extending in the region 64 or its portion 73. Light from that band is gated onto the recording medium 116 and recorded as an oscillograph trace in the manner mentioned above in connection with FIGS. 5 and 6.

Figure 12:
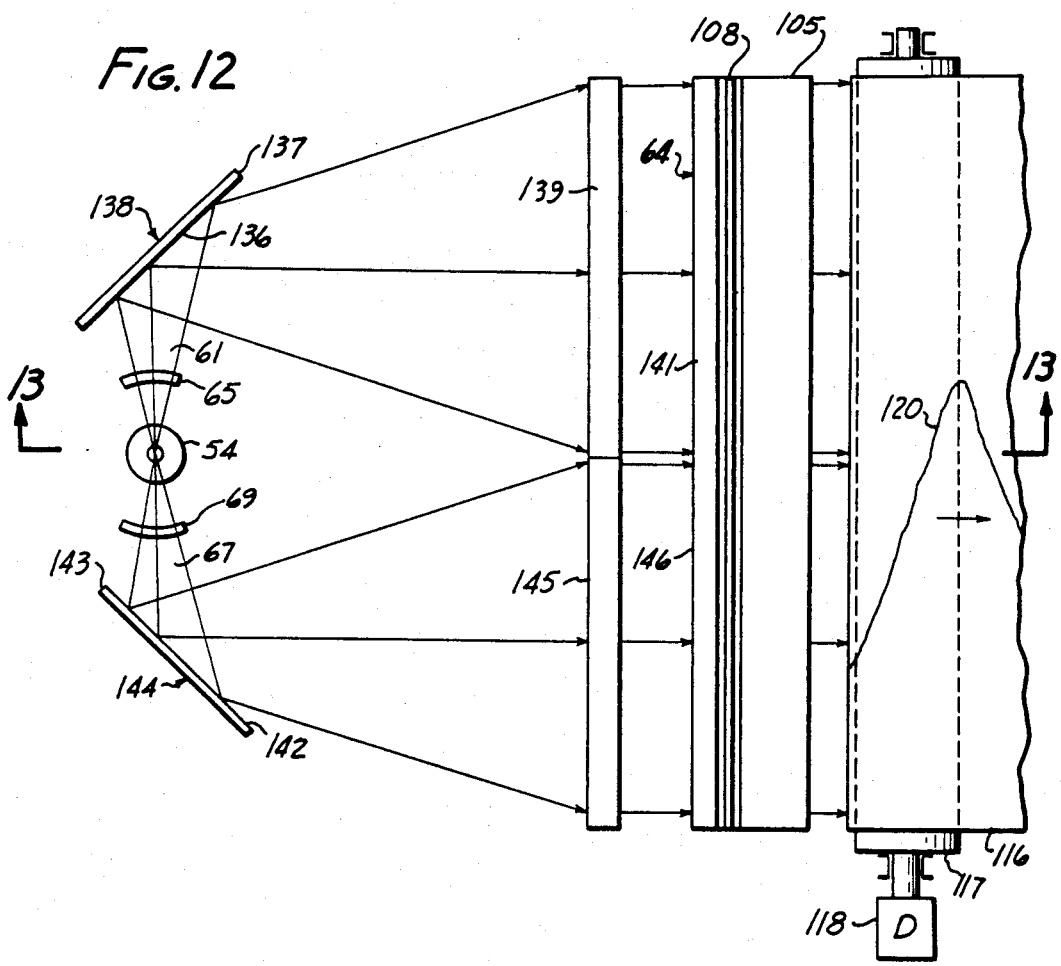
FIG. 12 is a top view of a solid state oscillograph apparatus in accordance with a further embodiment of the subject invention.

In the embodiments shown in FIGS. 12 to 17, as well as in the above mentioned embodiments, divergent light from a spatially concentrated source 54 is emitted into a sheet of light having an elongate cross-section of sufficient width in its direction of elongation to illuminate the elongate light gate array in the assembly 105 upon collimation. In particular, light in the embodiment of FIGS. 12 and 13 is emitted from the source 54 via belt lens 65 to the reflective surface 136 of a mirror 137 extehding in an elongate region 138. The first part of light 61 is reflected by the mirror 137 onto a first Fresnel lens 139 which collimates the first light part and projects it onto a first portion 141 of the elongate region 64.

Similarly, the second light part 67 is projected from the source 54 by a belt lens 69 onto the reflective surface 142 of a mirror 143 extending in a region 144. The mirror 134 reflects the second light part 67 onto a second Fresnel lens 145 which, in turn, projects the received second light part to a second region 146 of the elongate region 64. In this manner, the light gate assembly 105 is illuminated with a continuous band of light extending throughout the region 64. As before, the gate assembly 105 selectively gates the light from the uniform band in accordance with a varying input signal, so as to provide an oscillograph trace 120 or other desired record of the input signal. In this respect, the light gates in the assembly 105 are selectively opened by selective electrical actuation for a controlled transmission of the collimated light through the recording medium 116.

Figure 14:
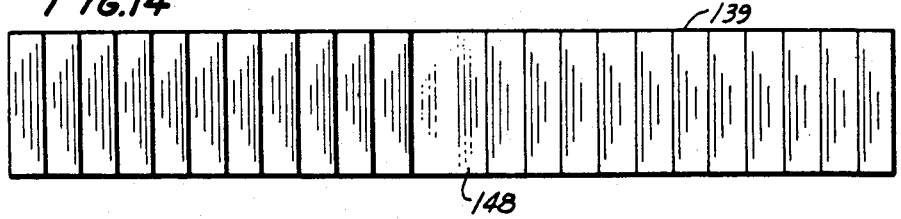
FIG. 14 is an elevation of a component of the apparatus shown in FIGS. 12 and 13.
Figure 15:
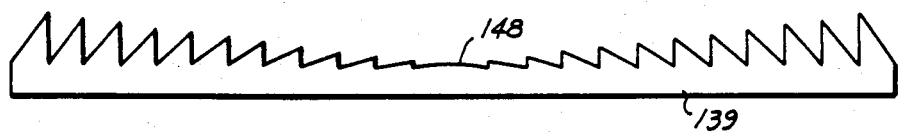
FIG. 15 is a top view of the component shown in FIG. 14.

By way of example, FIGS. 14 and 15 show an elevation and a top view of a Fresnel lens, on an enlarged scale, for use in the apparatus of FIGS. 12 and 13 and 20 and 21. The Fresnel lens in FIGS. 14 and 15 is labeled with the reference numeral 139, but it should be understood that the same Fresnel lens can be used at 145 in the apparatus of FIGS. 12 and 13. The Fresnel lens of FIGS. 14 and 15 preferably is of the Fresnel cylinder lens type which is composed of symmetrical transparent prisms having trapezoidal profiles as shown in FIGS. 14 and 15.

In particular, the Fresnel lens 139 has a central cylindrical surface 148 followed by saw tooth-like surfaces increasing in height in opposite directions from the central surface 148. In practice, saw tooth profiles may provide sufficient approximations. However, the top surfaces of the saw tooth configurations may be shaped cylindrically for increased collimation or parallelism of the light output.

Depending on the width of the light gate assembly 105, a single Fresnel lens 139 may be employed for collimating the light into the requisite band.

An embodiment of this type is shown in FIGS. 16 and 17, except that, by way of further modification, a large cylinder lens 149 is employed for collimating divergent light from the light sheet 151 into a band of collimated light in the elongate region 64. Again, the light gate assembly 105 is electrically operated to provide an oscillograph trace 120 or other desired record of the input signal.

Figure 22:
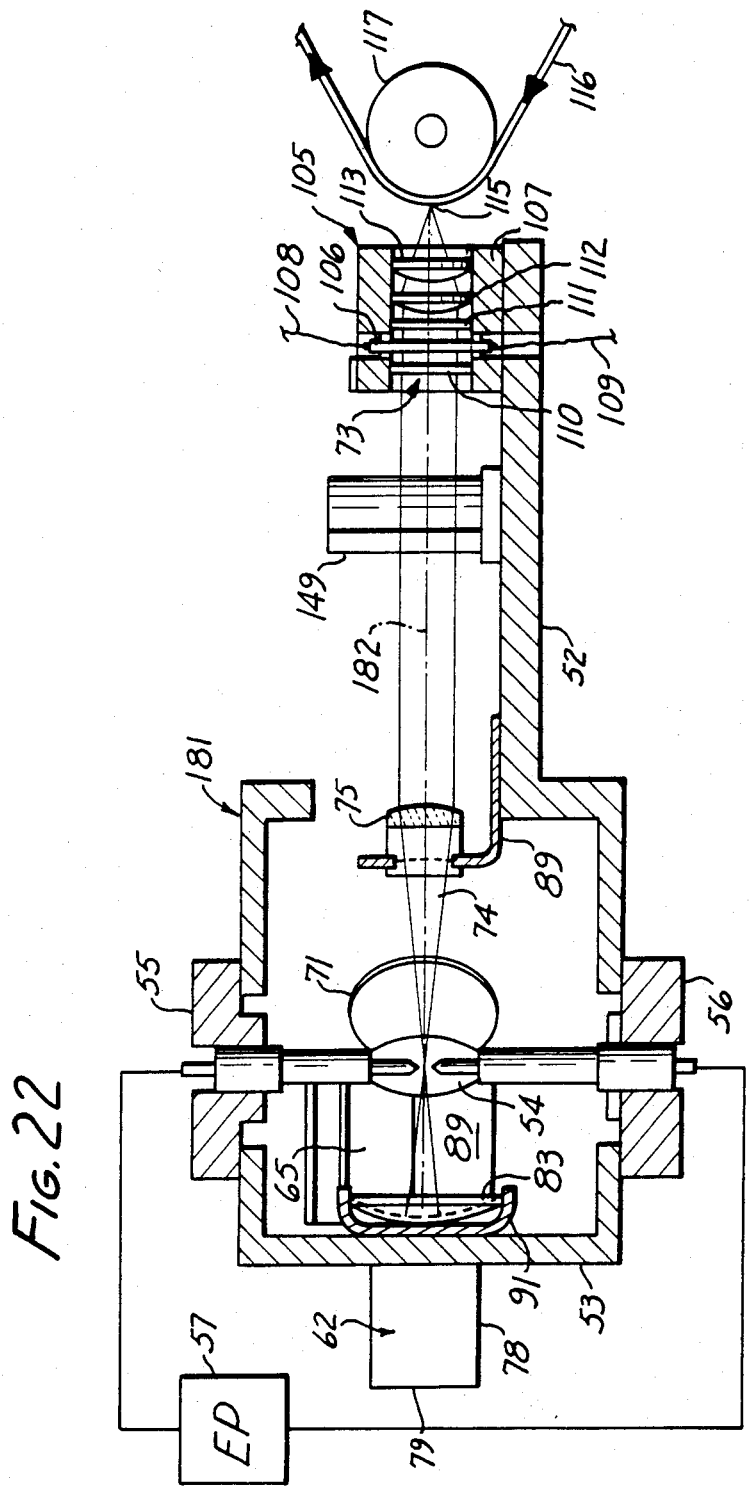
FIG. 22 is a section, taken along the line 22—22 in FIG. 23, of a solid state oscillograph apparatus in accordance with a preferred embodiment of the subject invention.

Among the light band forming embodiments so far discussed, the embodiment of FIGS. 22 and 23 is presently considered to constitute the best mode.

The light band forming principles and equipment herein disclosed may in accordance with a further preferred embodiment be employed for operating facsimile apparatus in the writing and/or reading mode.

In that case, the switches 123, 124, etc. in the control 125 are operated in a manner known per se to open the light gate 129 sequentially and in synchronism with reading circuits 152 as indicated by the line 153 shown in FIG. 18.

By way of example, FIGS. 18 and 19 illustrate a method and show apparatus for reading information 154 from a document 155 advancing via a drum 117 driven by a motor 118. The information 154 is perceptible upon illumination gated by the assembly 105.

The band of light with which the light gate assembly 105 is illuminated along an elongate region 64 may be provided by any of the methods and apparatus shown in FIGS. 5 to 17, 22 and 23, with the embodiment of FIGS. 5 and 6 or 22 and 23 being presently preferred for larger document width.

In the operation of the reader shown in FIGS. 18 and 19, the multitude of gates 129 (see FIG. 3) effectively subdivides the band of light along the region 64 into elmental portions. Sequential energization of the second electrodes 113 by the control 125 successively gates the elemental light portions to the information 154 for successively illuminating elemental areas of that information or of the document 155 along a transverse line. This scanning cycle is repeated as needed for scanning the entire advancing document 155.

The successively or sequentially illuminated elemental or information areas are read with the aid of an elongate photocell 157. If desired, a smaller photocell looking at the document 155 through a lens (not shown) may be employed.

As indicated at 158 in FIG. 19, light is reflected from sequentially illuminated document areas into the photocell 157. The photocell is connected through a resistor 159 and amplifier 161 with variable gain as indicated at 162 to reading circuits 152 which may be of a conventional type, and which are synchronized with the light gate control 125 so that the reading circuits are at all times informed what particular spot the photocell is reading at the moment.

The above mentioned advantages connected with the use of the bias source 127 and adjustable potentiometer 128 or, in general terms, the above mentioned light gate preconditioning may also be employed advantageously in the reader of FIGS. 18 and 19.

In particular, any of the embodiments shown in FIGS. 5 to 17, 22 or 23 may be employed to illuminate the gate array 105 along an elongate region 64 with light of a first intensity above zero light intensity.

The bias source 127 and potentiometer 120 may be employed as shown in FIG. 3 for preconditioning the light gates in the plurality of electrically controlled light gates 129 in the assembly 105 to subsequent opening in response to electric control signals actuating the switches 123, 124 etc. in the control 125 shown in FIG. 3.

As before, the preconditioning may be done by the source 127 and potentiometer 128 electrically biasing the light gates 125 to an initially open condition wherein the gates 129 pass light from the illumination band at the elongate region 64 at an intensity above zero light intensity and below a second intensity lower than the first intensity of the light band.

The sequentially gated assembly 105 subjects the record 155 with information 156 to a first illumination of an intensity above zero light intensity and below the mentioned second intensity as passed by the preconditioned gates in their biased, initially open condition. The control 125 with sequentially actuated switches 123, 124 etc. and the controlled gate assembly 105 further subject the record 155 to a second illumination by opening the preconditioned light gates in response to electric control signals which cause passage of light through the assembly 105 at at least the second light intensity and scanning of the record 155 with the passed light at at least the mentioned second intensity.

The reading equipment, including the photocell 157, is conditioned for reading information from the record 155 only in response to the mentioned second illumination. To this end, means may be provided for inhibiting a response by the reader to the mentioned first illumination provided by the preconditioned gates. In particular, the photocell 157 may have an inherent threshold of response which renders it relatively insensitive to the mentioned first illumination.

Alternatively, a clipping amplifier 161 or an amplifier 161 with a high direct-current threshold such that a signal below a minimum level would produce no output may be employed to render the reading circuit 152 insensitive to the mentioned first illumination caused by the biased, preconditioned gates. The photocell 157 with inherent threshold or the clipping amplifier 161 or amplifier with high direct-current threshold constitute means for inhibiting a response by the reading equipment to the mentioned first illumination.

However, it should be understood that the scope of the subject invention also extends to apparatus and methods wherein the bias source 127 and potentiometer 128 shown in FIG. 3 are omitted and the common electrodes 32 and 33 are connected directly to ground 126. In that case, the gates 129 would not be preconditioned and the voltage of the source 122 may have to be augmented to open the gates sufficiently by itself. A normal (e.g. non-clipping) type of amplifier 161 could then be used in FIG. 18.

The embodiment of FIGS. 20 and 21 provides the solid state light gate structure 106 with crossed polarizer 110 and analyzer 111 between two collimating structures 166 and 167. The collimating structures 166 and 167 may be large cylinder lenses or preferably cylinder Fresnel lenses of the type shown in FIGS. 14 and 15.

Accordingly, the apparatus shown in FIGS. 20 and 21 preferably has first and second Fresnel cylinder lenses 166 and 167 mounted relative to the base 52.

The light gate structure 106 with crossed polarizer and analyzer 110 and 111 is mounted between the spaced collimating lenses 166 and 167. Divergent light from the source 54 and sheet 151 is collimated with the first lens 166 and is projected as a band of collimated light through the polarizer 110 to the light gate array 106 to be gated in response to a variable input signal via the control 25 shown in FIG. 3. The gated light passes the analyzer 111 and is converged by the second Fresnel lens 167. In other words, light from the controlled transmission effected by the light gate assembly is converged with the second Fresnel lens 167.

The converged light is imaged onto a surface by means of a lens system 169. Viewed differently, the second Fresnel lens 167 and the lens system 169 jointly image the collimated light from the controlled transmission provided by the light gate array onto a surface. The particular surface may be a surface of a photographic material or other recording medium 171 which is driven by a motor 118 on a drum 117. In this manner, the imaged light transmissions may be recorded. In particular, the light transmissions provided by the polarized gate array may be imaged and recorded at a scale which, as shown at 172 in FIG. 20 is reduced relative to the extent of the light gate array 106.

In the imaging lens system 169 an objective lens of the general type used in microfilm cameras may be employed, with the Fresnel lens 167 serving as a field lens to ensure that the light from the gate array is redirected to pass through the lens system 169. The image formed by the objective lens would ordinarily be a reproduction of the light gate array in both the vertical and horizontal dimensions. Preferably, a negative cylinder lens 173 is placed near the objective lens so that light gated at 106 is imaged on the film 171 along a line. The power of the negative cylinder lens 173 is such that the image of the height of the arc in the lamp 54, otherwise to be found in the transform plane of the objective lens is imaged onto the film 171.

This embodiment shown in FIGS. 20 and 21 is particularly advantageous for use in Computer Output Microfilm (COM) Apparatus. If desired, the general principles shown in FIGS. 20 and 21 may be employed to enlarge the image of the light gate array. In either case, alphanumeric characters may be recorded or displayed by suitable control of the light gate array 106 in a manner known in the control of alphanumeric oscillograph displays.

The solid state oscillograph apparatus 181 shown in FIGS. 22 and 23 to a large extent resembles the apparatus according to FIGS. 5 and 6 as modified according to the teachings of FIGS. 16 and 17. Accordingly, like reference numerals are employed to designate like or functionally equivalent parts as among FIGS. 5, 6, 16, 17, 22 and 23, and reference should be had to the above description of FIGS. 5, 6, 16 and 17, as far as the purpose, nature and function of corresponding parts in FIGS. 22 and 23 are concerned.

Some differences between the presently most preferred embodiment of FIGS. 22 and 23 on the one hand, and the embodiments of FIGS. 5 and 6 on the other hand, will presently be disclosed.

In particular, the folded light path 84 of the apparatus of FIGS. 5 and 6 has been replaced in the equipment of FIGS. 22 and 23 by a lens device, such as the cylindrical lens 149 shown in, and mentioned above in connection with, FIGS. 16 and 17. If desired, the lens means 149 may be composed of two or more lens elements for less aberration and better performance. Also, in the apparatus of FIGS. 22 and 23, the first, second and third regions 62, 64 and 68 are arranged or located in a common plane 182.

As before, the first part 61 of the light output of the lamp 54 is projected along the common plane 182 from the first region 62 to the first portion 63 of the second region 64. Similarly, the second light output part 67 is projected along the common plane 182 from the third region 68 to the second portion 72 of the elongate second region 64.

In the embodiment of FIGS. 22 and 23, the third light output part 74 is projected along the common plane to the third portion 73 of the elongate second region 64 via lenses 75 and 149 directly in a straight path, rather than in any folded light path. The mirror 83 and lenses 75 and 149 constitute an assembly for optically projecting the third part 174 of the light output of the source 54 to the third portion 73 of the elongate region 64.

The preferred embodiment of FIGS. 22 and 23 may also be viewed as a combination of the basic features of FIGS. 16 and 17 with lateral reflecting surfaces or mirrors 78, 79, 81 and 82 arranged symmetrically to the light source 54 to supplement the light band projected by the equipment of FIGS. 16 and 17 by lateral light bands projected via regions 62 and 68. In this respect, the teachings of FIGS. 14 and 15 may be applied to the apparatus of FIGS. 22 and 23, in that the optical means 149 may be considered symbolic not only of the cylindrical lens 149 of FIGS. 16 and 17, but also of the Fresnel lens shown in FIGS. 14 and 15.

In other words, a Fresnel lens may, if desired, be employed at 149 in the apparatus of FIGS. 22 and 23.

As before, the reflector 83 and lens 75 cooperate in emitting the third part 74 of the light output from the source 54 past the reflectors 66 and 71 to an elongate fourth region at 149 in the form of a sheet of light which is divergent and in effect extends to the collimated first and second light output parts reflected from the first and third regions 62 and 68 as seen in FIGS. 22 and 23. As also apparent from FIGS. 22 and 23, the fourth region at 149 is located closer to the second region 64 than to the reflectors 66 and 67. The cylindrical or Fresnel lens 149 projects the third part 74 of the light output from the elongate fourth region at 149 to the third portion 73 of the elongate second region 64 and provides a continous band of light extending over the first, second and third portions 63, 72 and 73 of the elongate second region 64, by collimating light from the divergent sheet into a band of light extending over the third portion 73 of the elongate second region 64 upon projection by the lens 149 from the fourth region through which that lens extends.

Even though FIG. 23, for the sake of clarity, shows some lateral distance between the arrowheads designating adjacent portions of the second region parts 63, 72 and 73, it should be understood that the apparatus of FIGS. 22 and 23 provides one essentially continuous light band at least along the electro-optically active portion of the light gate assembly 105. The method and apparatus shown in FIGS. 22 and 23 for converting a spatially concentrated light output from a point source 54 into a band of light extending along the second region 64 has utility not only in the context of the remainder of the illustrated oscillograph apparatus, but also is of independent utility in converting a spatially concentrated light output into a band of light.

In the specific context of FIGS. 22 and 23, the generated band of light is applied to the light gate assembly 105 which is electrically operated to provide an oscillograph trace 120 or other desired record of information input signals, as disclosed above.

By way of example, the band-type illumination system of FIGS. 22 and 23 may alternatively be employed for reading recorded information, such as has been disclosed in connection with FIGS. 18 and 19.

The principles of FIGS. 22 and 23 may thus, for instance, be employed for the purpose of converting a spatially concentrated light output into a band of light, of recording varying electric signals, or of reading information perceptible upon illumination, as may be desired.

As in FIGS. 5 and 6, folded light path systems of the type shown in FIGS. 9 and 10 may be employed in the apparatus of FIGS. 22 and 23 in substitution or modification of the lateral light band producing means 78 and 81.

The subject invention provides or comprises combinations of important features as may, for instance, be seen from its illustrated embodiments and their specific description herein provided.

By way of background in this respect, it may be recalled at this point that the above description of FIGS. 5 and 6 points out that different elemental portions of the light band at the elongate region 64 may be selectively gated to provide in effect a light spot shifting as a function of the varying electric signals or parameters. The above description of FIGS. 18 and 19 similarly points out that the operation of the illustrated reader effectively subdivides the band of light along the region 64 into elemental portions, and that sequential energization of the electrodes 113 by the control 125 successively gates elemental light portions for successively illuminating elemental areas of the information 154 or document 155 along a transverse line.

Considering the elongate nature of each of the gates between any pair of adjacent electrodes 12 and 13 in the electrode or light gate arrays of FIGS. 1 to 4, the latter teaching and related portions of the subject disclosure in general may be restated by saying that the currently discussed aspect of the subject invention in effect provides a slit (see, for instance, 129 in FIG. 3) which, in response to selective energization of the electrodes 12 and 13, travels transversely to a longitudinal dimension of that slit. In particular, each light gate 129 may be regarded as a slit which is selectively actuated to be light-transmissive. As the light gates are actuated along the arrays 24 and 25, a transversely traveling slit is in effect created.

If desired, an actual light-transmissive slit may be provided and may be laterally moved for travel transversely to the longitudinal dimension of that slit. However, it will generally be found in practice that the use of a solid state light gate structure for providing in effect the transversely traveling, light-transmissive slit is preferable in terms of attainable speed, response, control and modulation of slit travel by electric signals.

Without limitation to any particular embodiment, it may be said with reference to FIGS. 3, 5, 6, 18, 19, 22 and 23 that the subject invention, from one aspect thereof, resides in a method of selectively illuminating a surface, such as the surface of the recording medium 116, the surface of the record 155, or any other surface which is desired to be selectively illuminated.

The invention according to this aspect resides, more specifically, in the improvement comprising, in combination, the steps of providing a slit (e.g. 129, FIG. 3) traveling transversely to a longitudinal dimension of that slit, providing a source 54 of spatially concentrated light, imaging light from that source through the slit onto the mentioned surface anamorphically only as to a dimension of the spatially concentrated light corresponding to the longitudinal dimension of the slit. As may be seen from some of the illustrations, such as FIGS. 6 and 23, the subject combination according to the invention further includes the steps of spreading light from the source 54 in a plane parallel to the transverse travel of the slit, collimating that spread light, and projecting that collimated light through the slit onto the mentioned surface and for the extent of at least a portion of the transverse travel of the slit.

In this respect, the embodiments of FIGS. 11, 16, 17, 20, 21 and 24, for instance, project the spread light 74 or 151 after collimation through the extent of the transverse travel of the slit. Similarly, the compound illumination systems of other embodiments, such as those shown in FIGS. 5, 6, 22 and 23, illuminate the entire transverse travel of the slit. However, individual portions of those systems illuminate by themselves only part of such transverse travel, such as a part corresponding to one of the first, second and third portions 63, 72 and 73 of the elongate second region 64.

According to illustrated preferred embodiments of the subject invention, the transversely traveling slit is provided by arranging a plurality of elongate light gates, such as the gates 129 shown in FIG. 3, side by side over the mentioned transverse travel, and by selectively actuating such light gates, such as in the manner shown in, or described above with reference to, FIGS. 3 and 18.

Light is then imaged from the source 54 through the actuated light gates 129 onto the surface at 116, 155 or elsewhere anamorphically only as to a dimension of the spatially concentrated light corresponding to a longitudinal dimension of the elongate light gates 129. The above mentioned projecting step then includes projecting the collimated light through the actuated light gates 129 onto the surface at 116, 155 or elsewhere.

In this respect, it may be seen that the subject invention and its illustrated embodiments, against the background of the above mentioned prior-art failure, provide the requisite collimation in two cross-directions to avoid sideways spread of the recording or illuminated reading point and to enable focusing of gated light to a small spot in the direction of travel in the recording medium or the record to be read.

As mentioned above, features of the type presently discussed are particularly important in view of the well-known light scattering properties of PLZT and other solid state light gates, coupled with the natural diffraction imposed on light flowing through a multitude of narrow gates or slits.

In particular, the currently discussed aspect of the subject invention proceeds from the recognition that only an anamorphic illumination system will satisfy the needs of PLZT and similar light gate structures or generally the needs of systems employing a transversely traveling slit or other gating device subject to diffraction effects.

Within the context of this recognition, the currently discussed aspect of the invention provides in effect an imaging system in the vertical plane as seen in FIGS. 5, 10, 11, 13, 17, 21 and 22, combined in a horizontal plane as seen in FIGS. 6, 7, 8, 9, 12, 16, 20, 23 and 24, with a shadowgraph-type system including a movable slit or selectively actuated light gate 129. In other words, the confines of the movable slit or the closed gates in effect cast a shadow on the recording medium 116, record 155 or other selectively illuminated surface. Unlike prior proposals, such as the one advanced in the above mentioned U.S. Pat. No. 2,909,972, the currently discussed aspect of the invention thus does not image actuated light gates onto a recording or other surface and thus provides no optics for that purpose. Similarly, the subject invention is distinguishable in this respect from galvanometer-type oscillograph apparatus which imaged light not only in a plane parallel to galvanometer mirrors, but in effect imaged the light source by special lenses also in a plane transverse to the galvanometer mirrors. Unlike such prior systems, the system according to the subject invention images the light source in only one plane, such as vertically, but not omnidirectionally or in crossed planes.

Accordingly, preferred embodiments of the invention, such as seen in FIGS. 5 and 22, employ optics or lenses 75, 112 and 113 for imaging in effect the height of the luminous arc in the light source 54 anamorphically through any actuated light gate or any slit onto the recording or reading surface.

Conversely, in the horizontal or transverse plane, the luminous arc or spatially concentrated light is not imaged onto the recording or reading surface. Rather, such light is spread in the horizontal or transverse plane, and is further collimated and projected through actuated light gates or any transversely traveling slit onto the recording or reading surface.

According to embodiments of the invention, at least part of the spread light may be collimated by refraction, as seen in FIGS. 12, 13, 16, 17, 20, 21, 22 and the central part of 23. Alternatively or additionally, at least part of the spread light is collimated by reflection on a curved surface, as seen in FIGS. 5, 6, 7, 8, 9, 10 and 11, the outer portions of FIGS. 23, and further in FIG. 24. Also in accordance with an embodiment of the invention, the spread light 74 is projected along a folded light path 84, 84' or 84" as seen in FIG. 5, the central portion of FIG. 6, FIG. 7, FIG. 8, FIG. 9 and FIG. 10.

Embodiments of the invention emit different parts of the spatially concentrated light via different paths.

For instance, the embodiment of FIGS. 12 and 13 emits a first part 61 of the light from the spatially concentrated source 54 to a first region 138, reflects such first part from that first region, and collimates that reflected first part at 139 at a distance from the first region 138. The embodiment of FIGS. 12 and 13 then projects that reflected collimated first part to a first portion 141 of an elongate second region 64 extending parallel to the above mentioned transverse travel of the slit. That embodiment projects the reflected collimated first part further through the slit onto the surface at 116 and images that first part of the light from the source 54 via the first region 138, second region 64 and the slit onto the mentioned surface anamorphically only as to a dimension of the spatially concentrated light corresponding to the longitudinal dimension of the slit (e.g. the vertical extent of any actuated light gate 129, as seen in FIG. 3).

The embodiment of FIGS. 12 and 13 also emits a second part 67 of the light from the source 54 to a third region 144, reflects that second part from such third region, and collimates that reflected second part at 145, that is at a distance from the third region 144. This embodiment further projects the reflected collimated second part to a second portion 146 of the elongate second region 64, and further through the slit onto the surface at 116. The subject embodiment images the second part of the light from the source 54 via the third region 144, second region 64 and the slit onto the surface at 116 anamorphically only as to a dimension of the spatially concentrated light corresponding to the mentioned longitudinal dimension of the slit.

In this manner, a wide surface can be selectively illuminated and the above mentioned detriments in terms of scattering and diffraction are practically avoided.

As seen in FIG. 12 to 15, the mentioned reflected first and second parts 61 and 67 of the light from the source 54 may be collimated by refraction, such as at 139 and 145.

For even wider light gate arrays or transverse travel of the slit, the embodiments of FIGS. 5, 6, 22 and 23 may be employed. These embodiments in particular emit a first part 61 of the light from the source 54 to a first region 62, collimate that first part at that first region, reflect that collimated first part from that first region 62 to a first portion 63 of an elongate second region extending parallel to the above mentioned transverse travel of the slit. These embodiments further project the reflected collimated first part 61 through the second region 64 and the slit onto the surface at 166 and image the first part of the light from the source 54 via the first region 62, second region 64 and slit onto the surface at 116 anamorphically only as to a dimension of the spatially concentrated light corresponding to the longitudinal dimension of the slit.

The embodiments shown in FIGS. 5, 6, 22 and 23 further emit a second part 67 of the light from the source 54 to a third region 68, collimate that second part 67 at that third region, and reflect that collimated second part from that third region to a second portion 72 of the elongate second region 64.

As before, such second portion 72 is spaced by a third portion 73 from the mentioned first portion 63. These embodiments further project the reflected collimated second part through the second region 64 and the slit onto the surface at 116 and image the second part 67 of the light from the source 54 via the third region 68, second region 64 and the slit onto the surface at 116 anamorphically only as to a dimension of the spatially concentrated light corresponding to the longitudinal dimension of the slit.

The embodiments of FIGS. 5, 6, 22 and 23 further emit a third part 74 of the light from the source 54 to a fourth region, collimate the third part at that fourth region, project the collimated third part of the light through the above mentioned third part of the second region and the slit onto the surface at 116, and image the third part of the light from the source 54 via the fourth region, second region 64 and slit onto the surface at 116 anamorphically only as to a dimension of these spatially concentrated lights corresponding to the longitudinal dimension of the slit.

According to the preferred embodiment of FIGS. 22 and 23, the emitted third part of the light is collimated by refraction. To this end, refractive collimating means, such as the collimating lens or lens system 149 may be positioned at the mentioned fourth region to which the third part of the light from the source 54 is emitted.

In particular, the preferred embodiment of the invention shown in FIGS. 22 and 23 collimates the emitted first and second part of the light by reflection on curved surface regions, while collimating the emitted third part of the light by refraction.

Alternatively, the emitted third part of the light may be collimated by reflection on at least one curved surface. For instance, the embodiment of the invention shown in FIGS. 5 and 6 collimates the emitted third part 74 of the light from the source 54 by reflection from a curved surface 86 at the mentioned fourth region 76. Similarly, the embodiment according to FIG. 7 employs a curved surface 94 for this purpose. On the other hand, a version shown in FIG. 8 collimates the emitted third part of the light by reflection on curved surface regions 95 and 97.

As may further be seen from FIGS. 6 and 23, the first light part 61 according to the embodiment illustrated therein is emitted along straight light paths in a plane parallel to the transverse travel of the slit from the source 54 to the first region 62. Similarly, the second part 67 is emitted along straight light paths in a plane parallel to the transverse travel of the slit from the source 54 to the third region 68. This in contrast to the system of the above mentioned Swedish Pat. No. 47835 which employs a complex lens 6 for projecting light portions from a source 1 to a reflecting surface 2 along bent light paths. Within the scope of the subject invention, a lens of the type of lens 6 of the cited Swedish patent may also be employed in the practice of the subject invention in cases where such extra lens and its high price and optical losses imposed thereby may be warranted by a more compact arrangement of the reflective surfaces.

As shown in FIG. 6 and 23, the third part 74 of the light may also be emitted along straight light paths in a plane parallel to the transverse travel of the slit from the source 54 to the fourth region 76 or location of the lens 149. According to FIGS. 22 and 23, the first, second and third parts 61, 67 and 74 of the light from the source 54 are emitted in a common plane parallel to the transverse travel of the slit.

Alternatively, the means for collimating the third part 74 may include a folded light path 84, and the third part 74 may be projected along that folded light path, as in the embodiment of FIGS. 5 and 6, for instance.

As already indicated, the embodiments so far discussed may, for instance, be employed in methods and apparatus for recording varying electric signals onto a light-sensitive recording medium, or in methods and apparatus for reading information perceptible upon illumination of a record of such information.

According to the embodiment of the invention shown in FIGS. 20 and 21, principles of the subject invention are employed for recording varying electric signals on a light-sensitive recording medium 171 having a given width. This embodiment again provides a slit traveling transversely to a longitudinal dimension thereof for an extent of travel wider than the given width of the recording medium 171, and modulates the travel of that slit with the varying electric signals to be recorded.

In terms of FIGS. 20 and 21, this is accomplished by providing the light gate array 106 with associated polarizers and collimators 110, 111, 166 and 167 over a width larger than the width of the relative narrow recording medium 171.

The embodiments of FIGS. 20 and 21 further spread light 151 from the source 54 in a plane parallel to, and for the extent of, the transverse travel of the slit. Such spread light 151 is collimated for the extent of that transverse travel and is projected onto the transversely traveling slit, such as by the collimating lens 166, for selective gating by the slit. Projected light gated by the traveling slit is converged down to a width smaller than the extent of the transverse travel of the slit. The second lens 167 shown in FIGS. 20 and 21 may be employed for this purpose. The converged light is imaged onto the recording medium 171, such as by the lens system 169. In particular, the embodiment shown in FIGS. 20 and 21 images light from the source 54 through the slit onto the recording medium 171 anamorphically as to a dimension of the spatially concentrated light corresponding to the longitudinal dimension of the slit.

As before, the transversely traveling slit may be provided and modulated by arranging a plurality of elongate light gates 129 side by side over the mentioned transverse travel and by selectively actuating such light gates in response to varying electric signals. The mentioned spreading of light includes spreading light 151 from the source 54 for the extent of the arranged light gates.

The collimating and projecting steps include collimating the spread light 151 for the extent of the arranged light gates 106 and projecting such collimated light onto the arranged light gates for selective gating by actuated light gates 129. The converging step includes converging projected light gated by the selectively actuated light gates down to a width smaller than the width or extent of the arranged light gates 106. The imaging process then includes imaging light from the source 54 through the actuated light gates onto the surface of the medium 171 anamorphically as to a dimension of the spatially concentrated light corresponding to a longitudinal dimension of the elongate light gates 129.

The subject invention and its various embodiments thus solve the above mentioned problems, meet the above mentioned objects and satisfy the above mentioned needs in an efficient and effective manner.

By way of example, solid state oscillograph apparatus according to the preferred embodiment of the invention shown in FIGS. 22 and 23, and employing light gate structures of the type shown in FIG. 3, provide oscillograph traces on one-foot wide direct-print paper, thereby exhibiting a performance considered to be unprecedented.

In particular, such oscillograph systems according to the subject invention have proved capable of printing out different wave shapes at widely different frequencies and top quality.

The familiar overshoots and objectionable trace thickenings at sharp amplitude peaks occurring with beam deflection oscillography equipment are readily avoided with the solid state equipment of the subject invention. No objectionable gaps appear in the oscillograph trace between portions corresponding to the first, second and third regions 63, 72 and 73 of the elongate region 64, where the essentially continuous band of light is produced by the illumination system shown in FIGS. 22 and 23. In fact, wide amplitude recordings, wherein for instance a single trace extends across the one-foot-wide paper, are easily produced with the apparatus of the invention presently under discussion.

On the other hand, several traces can be recorded at once and each trace is capable of jumping without inertia from one point to another on the one-foot-wide printout paper. Channel designations and other alphanumeric designations are readily printed in considerable detail on the recording medium 116, along with the oscillograph traces.

It is thus believed clear that the long-standing and entrenched dominance of oscillography by electromechanical galvanometers has finally been broken in a competitive manner. This, of course, does not detract from the fact that the subject invention and its various embodiments have utility in many other fields, such as has been set forth herein.

Also, the subject extensive disclosure will render apparent or suggest to those skilled in the art various modifications and variations within the spirit of the subject invention and various fields and instances of utility.

I claim:

1. In a method of selectively illuminating a surface, the improvement comprising in combination the steps of:

providing a slit traveling transversely to a longitudinal dimension of said slit for a predetermined distance;

providing a source of spatially concentrated light;

spreading light from said source in a plane parallel to the transverse travel of the slit and across said predetermined distance of transverse travel of the slit;

collimating said spread light; and focusing said spread light into a traveling spot on said surface by imaging said spread light from said source through said traveling slit onto said surface anamorphically only as to a dimension of said spatially concentrated light corresponding to said longitudinal dimension of the slit.

2. A method as claimed in claim 1, wherein:

at least part of said spread light is collimated by refraction.

3. A method as claimed in claim 1, wherein:

at least part of said spread light is collimated by reflection on a curved surface.

4. A method as claimed in claim 1, wherein:

at least part of said spread light is projected along a folded light path.

5. A method as claimed in claim 1, 2, 3 or 4, wherein:

said transversely traveling slit is provided by arranging a plurality of elongate light gates side by side over said transverse travel, and by selectively actuating said light gates; and said imaging includes imaging light from said source through said actuated light gates onto said surface anamorphically only as to a dimension of said spatially concentrated light corresponding to a longitudinal dimension of said elongate light gates.

6. In a method of selectively illuminating a surface, the improvement comprising in combination the steps of:

providing a slit traveling transversely to a longitudinal dimension of said slit;

providing a source of spatially concentrated light;

emitting a first part of said light from said source to a first region, reflecting said first part from said first region, collimating said reflected first part at a distance from said first region;

projecting said reflected collimated first part to a first portion of an elongate second region extending parallel to the transverse travel of the slit, and further through the slit onto said surface and imaging said first part of the light from said source via said first region, second region and slit onto said surface anamorphically only as to a dimension of said spatially concentrated light corresponding to said longitudinal dimension of the slit;

emitting a second part of said light from said source to a third region, reflecting said second part from said third region, collimating said reflected second part at a distance from said third region; and projecting said reflected collimated second part to a second portion of said elongate second region, and further through the slit onto said surface and imaging said second part of the light from said source via said third region, second region and slit onto said surface anamorphically only as to a dimension of said spatially concentrated light corresponding to said longitudinal dimension of the slit.

7. A method as claimed in claim 6, wherein:

said reflected first and second parts of said light are collimated by refraction.

8. In a method of selectively illuminating a surface, the improvement comprising in combination the steps of:

providing a slit traveling transversely to a longitudinal dimension of said slit;

providing a source of spatially concentrated light;

emitting a first part of said light from said source to a first region, collimating said first part at said first region, reflecting said collimated first part from said first region to a first portion of an elongate second region extending parallel to the transverse travel of the slit;

projecting said reflected collimated first part through said second region and said slit onto said surface and imaging said first part of the light from said source via said first region, second region and slit onto said surface anamorphically only as to a dimension of said spatially concentrated light corresponding to said longitudinal dimension of the slit;

emitting a second part of said light from said source to a third region, collimating said second part at said third region, reflecting said collimated second part from said third region to a second portion of said elongate second region, said second portion being spaced by a third portion from said first portion;

projecting said reflected collimated second part through said second region and said slit onto said surface and imaging said second part of the light from said source via said third region, second region and slit onto said surface anamorphically only as to a dimension of said spatially concentrated light corresponding to said longitudinal dimension of the slit; and emitting a third part of said light from said source to a fourth region, collimating said third part at said fourth region, projecting said collimated third part of the light through said third portion of the second region and said slit onto said surface and imaging said third part of the light from said source via said fourth region, second region and slit onto said surface anamorphically only as to a dimension of said spatially concentrated light corresponding to said longitudinal dimension of the slit.

9. A method as claimed in claim 8, wherein:
said emitted third part of said light is collimated by refraction.

10. A method as claimed in claim 8, wherein:
said emitted third part of said light is collimated by reflection on at least one curved surface.

11. A method as claimed in claim 8, wherein:
said emitted first and second parts of said light are collimated by reflection on curved surface regions.

12. A method as claimed in claim 8, wherein:
said emitted first and second parts of said light are collimated by reflection on curved surface regions; and
said emitted third part of said light is collimated by refraction.

13. A method as claimed in claim 8, wherein:
said emitted first and second parts of said light are collimated by reflection on curved surface regions; and
said emitted third part of said light is collimated by reflection on at least one curved surface.

14. A method as claimed in claim 8, wherein:
said first part is emitted along straight light paths in a plane parallel to the transverse travel of the slit from said source to said first region; and said second part is emitted along straight light paths in a plane parallel to the transverse travel of the slit from said source to said third region.

15. A method as claimed in claim 8, wherein:
said third part is emitted along straight light paths in a plane parallel to the transverse travel of the slit from said source to said fourth region.

16. A method as claimed in claim 8, wherein:
said first, second and third parts of said light from the source are emitted in a common plane parallel to the transverse travel of the slit.

17. A method as claimed in claim 6, 7, 8, 9, 10, 11, 12, 13, 14, 15 or 16:
said transversely traveling slit is provided by arranging a plurality of elongate light gates side by side over said transverse travel, and by selectively actuating said light gates;

said imaging includes imaging light from said source through said actuated light gates onto said surface anamorphically only as to a dimension of said spatially concentrated light corresponding to a longitudinal dimension of said elongate light gates; and said projecting includes projecting said collimated light through said actuated light gates onto said surface.

18. In a method of recording varying electrical signals on a light-sensitive recording medium, the improvement comprising in combination the steps of:
providing a slit traveling transversely to a longitudinal dimension of said slit for a predetermined distance and modulating the travel of said slit which said varying electric signals;

providing a source of spatially concentrated light;

spreading light from said source in a plane parallel to the transverse travel of the slit and across said predetermined distance of transverse travel of the slit;

collimating said spread light;

focusing said spread light into a traveling spot on said surface by imaging said spread light from said source through said traveling slit onto said recording medium anamorphically only as to a dimension of said spatially concentrated light corresponding to said longitudinal dimension of the slit; and recording said traveling spot.

19. A method as claimed in claim 18, wherein:
at least part of said spread light is collimated by refraction.

20. A method as claimed in claim 18, wherein:
at least part of said spread light is collimated by reflection on a curved surface.

21. A method as claimed in claim 18, wherein:
at least part of said spread light is projected along a folded light path.

22. A method as claimed in claim 18, 19, 20 or 21, wherein:
said transversely traveling slit is provided and modulated by arranging a plurality of elongate light gates side by side over said transverse travel, and by selectively actuating said light gates in response to said varying electric signals; and said imaging includes imaging light from said only as to a dimension of recording medium anamorphically source through said actuated light gates onto said said spatially concentrated light corresponding to a longitudinal dimension of said elongate light gates.

23. In a method of recording varying electric signals on a light-sensitive recording medium, the improvement comprising in combination the steps of:
providing a slit traveling transversely to a longitudinal dimension of said slit and modulating the travel of said slit with said varying electric signals;
providing a source of spatially concentrated light;
emitting a first part of said light from said source to a first region, reflecting said first part from said first region, collimating said reflected first part at a distance from said first region;
projecting said reflected collimated first part to a first portion of an elongate second region extending parallel to the transverse travel of the slit, and further through the slit onto said recording medium and imaging said first part of the light from said source via said first region, second region and slit onto said recording medium anamorphically only as to a dimension of said spatially concentrated light corresponding to said longitudinal dimension of the slit;
emitting a second part of said light from said source to a third region, reflecting said second part from said third region, collimating said reflected second part at a distance from said third region; and
projecting said reflected collimated second part to a second portion of said elongate second region, and further through the slit onto said recording medium and imaging said second part of the light from said source via said third region, second region and slit onto said recording medium anamorphically only as to a dimension to said spatially concentrated light corresponding to said longitudinal dimension of the slit.

24. A method as claimed in claim 23, wherein:
said reflected first and second parts of said light are collimated by refraction.

25. In a method of recording varying electric signals on a light-sensitive recording medium, the improvement comprising in combination the steps of:
providing a slit traveling transversely to a longitudinal dimension of said slit and modulating the travel of said slit with said varying electric signals;
providing a source of spatially concentrated light;
emitting a first part of said light from said source to a first region, collimating said first part at said first region, reflecting said collimated first part from said first region to a first portion of an elongate second region extending parallel to the transverse travel of the slit;
projecting said reflected collimated first part through said second region and said slit onto said recording medium and imaging said first part of the light from said source via said first region, second region and slit onto said recording medium anamorphically only as to a dimension of said spatially concentrated light corresponding to said longitudinal dimension of the slit;
emitting a second part of said light from said source to a third region, collimating said second part at said third region, reflecting said collimated second part from said third region to a second portion of said elongate second region, said second portion being spaced by a third portion from said first portion;
projecting said reflected collimated second part through said second region and said slit onto said recording medium and imaging said second part of the light from said source via said third region, second region and slit onto said recording medium anamorphically only as to a dimension of said spatially concentrated light corresponding to said longitudinal dimension of the slit; and
emitting a third part of said light from said source to a fourth region, collimating said third part at said fourth region, projecting said collimated third part of the light through said third portion of the second region and slit onto said recording medium and imaging said third part of the light from said source via said fourth region, second region and slit onto said recording medium anamorphically only as to a dimension of said spatially concentrated light corresponding to said longitudinal dimension of the slit.

26. A method as claimed in claim 25, wherein:
said emitted third part of said light is collimated by refraction.

27. A method as claimed in claim 25, wherein:
said emitted third part of said light is collimated by reflection on at least one curved surface.

28. A method as claimed in claim 25, wherein:
said emitted first and second parts of said light are collimated by reflection on curved surface regions.

29. A method as claimed in claim 25, wherein:
said emitted first and second parts of said light are collimated by reflection on curved surface regions; and
said emitted third part of said light is collimated by refraction.

30. A method as claimed in claim 25, wherein
said emitted first and second parts of said light are collimated by reflection on curved surface regions; and
said emitted third part of said light is collimated by reflection on at least one curved surface.

31. A method as claimed in claim 25, wherein:
said first part is emitted along straight light paths in a plane parallel to the transverse travel of the slit from said source to said first region; and
said second part is emitted along straight light paths in a plane parallel to the transverse travel of the slit from said source to said third region.

32. A method as claimed in claim 31, wherein:
said third part is emitted along straight light paths in a plane parallel to the transverse travel of the slit from said source to said fourth region.

33. A method as claimed in claim 31, wherein:
said first, second and third parts of said light from the source are emitted in a common plane parallel to the transverse travel of the slit.

34. A method as claimed in claim 23, 24, 25, 26, 27, 28, 29, 30, 31, 32 or 33, wherein:
said transversely traveling slit is provided by arranging a plurality of elongate light gates side by side over said transverse travel, and by selectively actuating said light gates;
said imaging includes imaging light from said source through said actuated light gates onto said recording medium anamorphically only as to a dimension of said spatially concentrated light corresponding to a longitudinal dimension of said elongate light gates; and
said projecting includes projecting said collimated light through said actuated light gates onto said recording medium.

35. In a method of recording varying electric signals on a light-sensitive recording medium having a given width, the improvement comprising in combination the steps of:

providing a slit traveling transversely to a longitudinal dimension of said slit for an extent of travel wider than said given width and modulating the travel of said slit with said varying electric signals;

providing a source of spatially concentrated light;

spreading light from said source in a plane parallel to, and for the extent of, the transverse travel of the slit;

collimating said spread light for the extent of said transverse travel and projecting said collimating light onto said transversely traveling slit for selective gating by said slit;

converging projected light gated by said traveling slit down to a width smaller than said extent of said transverse travel of the slit; and imaging said converged light onto said recording medium, said imaging including the step of imaging light from said source through said slit onto said recording medium anamorphically as to a dimension of said spatially concentrated light corresponding to said longitudinal dimension of the slit.

36. A method as claimed in claim 35, wherein:

said transversely traveling slit is provided and modulated by arranging a plurality of elongate light gates side by side over said transverse travel, and by selectively actuating said light gates in response to said varying electric signals;

said spreading of light includes spreading light from said source for the extent of said arranged light gates;

said collimating and projecting include collimating said spread light for the extent of said arranged light gates and projecting said collimated light onto said arranged light gates for selective gating by said actuated light gates;

said converging includes converging projected light gated by said selectively actuated light gates down to a width smaller than said extent of said arranged light gates; and said imaging includes imaging light from said source through said actuated light gates onto said surface anamorphically as to a dimension of said spatially concentrated light corresponding to a longitudinal dimension of said elongate light gates.

37. In a method of reading information perceptible upon illumination of a record of said information, the improvement comprising in combination the steps of:

providing a source of spatially concentrated light;

providing a slit traveling transversely to a longitudinal dimension of said slit for a predetermined distance, for an illumination of elemental areas of said record;

spreading light from said source in a plane parallel to the transverse travel of the slit and across said predetermined distance of transverse travel of the slit;

collimating said spread light;

focusing said spread light into a traveling spot on said surface by imaging said spread light from said source through said traveling slit onto said record anamorphically only as to a dimension of said spatially concentrated light corresponding to said longitudinal dimension of the slit;

illuminating said elemental areas of said record with said traveling spot; and reading said illuminated elemental areas of said record.

38. A method as claimed in claim 37, wherein:

at least part of said spread light is collimated by refraction.

39. A method as claimed in claim 37, wherein:

at least part of said spread light is collimated by reflection on a curved surface.

40. A method as claimed in claim 37, wherein:

at least part of said spread light is projected along a folded light path.

41. A method as claimed in claim 37, 38, 39 or 40, wherein:

said transversely traveling slit is provided by arranging a plurality of elongate light gates side by side over said transverse travel, and by selectively actuating said light gates; and said imaging includes imaging light from said source through said actuated light gates onto said record anamorphically only as to a dimension of said spatially concentrated light corresponding to a longitudinal dimension of said elongate light gates.

42. In a method of reading information perceptible upon illumination of a record of said information, the improvement comprising in combination the steps of:

providing a source of spatially concentrated light;

providing a slit traveling transversely to a longitudinal dimension of said slit for illumination of elemental areas of said record;

emitting a first part of said light from said source to a first region, reflecting said first part from said first region, collimating said reflected first part at a distance from said first region;

projecting said reflected collimated first part to a first portion of an elongate second region extending parallel to the transverse travel of the slit, and further through the slit onto said record and imaging said first part of the light from said source via said first region, second region and slit onto said record anamorphically only as to a dimension of said spatially concentrated light corresponding to said longitudinal dimension of the slit;

emitting a second part of said light from said source to a third region, reflecting said second part from said third region, collimating said reflected second part at a distance from said third region;

projecting said reflected collimated second part to a second portion of said elongate second region, and further through the slit onto said record and imaging said second part of the light from said source via said third region, second region and slit onto said record anamorphically only as to a dimension of said spatially concentrated light corresponding to said longitudinal dimension of the slit; and reading illuminated elemental areas of said record.

43. A method as claimed in claim 42, wherein:

said reflected first and second parts of said light are collimated by refraction.

44. In a method of reading information perceptible upon illumination of a record of said information, the improvement comprising in combination the steps of:

providing a source of spatially concentrated light;

providing a slit traveling transversely to a longitudinal dimension of said slit for an illumination of elemental areas of said record;

emitting a first part of said light from said source to a first region, collimating said first part at said first region, reflecting said collimated first part from said first region to a first portion of an elongate second region extending parallel to the transverse travel of the slit;

projecting said reflected collimated first part through said second region and said slit onto said record and imaging said first part of the light from said source via said first region, second region and slit onto said record anamorphically only as to a dimension of said spatially concentrated light corresponding to said longitudinal dimension of the slit;

emitting a second part of said light from said source to a third region, collimating said second part at said third region, reflecting said collimated second part from said third region to a second portion of said elongate second region, said second portion being spaced by a third portion from said first portion;

projecting said reflected collimated second part through said second region and said slit onto said record and imaging said second part of the light from said source via said third region, second region and slit onto said record anamorphically only as to a dimension of said spatially concentrated light corresponding to said longitudinal dimension of the slit;

emitting a third part of said light from said source to a fourth region, collimating said third part at said fourth region, projecting said collimated third part of the light through said third portion of the second region and said slit onto said record and imaging said third part of the light from said source via said fourth region, second region and slit onto said record anamorphically only as to a dimension of said spatially concentrated light corresponding to said longitudinal dimension of the slit; and reading illuminated elemental areas of said record.

45. A method as claimed in claim 44, wherein:
said emitted third part of said light is collimated by refraction.

46. A method as claimed in claim 44, wherein:
said emitted third part of said light is collimated by reflection on at least one curved surface.

47. A method as claimed in claim 44, wherein:
said emitted first and second parts of said light are collimated by reflection on curved surface regions.

48. A method as claimed in claim 44, wherein:
said emitted first and second parts of said light are collimated by reflection on curved surface regions; and
said emitted third part of said light is collimated by refraction.

49. A method as claimed in claim 44, wherein:
said emitted first and second parts of said light are collimated by reflection on curved surface regions: and
said emitted third part of said light is collimated by reflection on at least one curved surface.

50. A method as claimed in claim 44, wherein:
said first part is emitted along straight light paths in a plane parallel to the transverse travel of the slit from said source to said first region; and
said second part is emitted along straight light paths in a plane parallel to the transverse travel of the slit from said source to said third region.

51. A method as claimed in claim 50, wherein:
said third part is emitted along straight light paths in a plane parallel to the transverse travel of the slit from said source to said fourth region.

52. A method as claimed in claim 44, wherein:
said first, second and third parts of said light from the source are emitted in a common plane parallel to the transverse travel of the slit.

53. A method as claimed in claim 42, 43, 44, 45, 46, 47, 48, 49, 50, 51 or 52, wherein:
said transversely traveling slit is provided by arranging a plurality of elongate light gates side by side over said transverse travel, and by selectively actuating said light gates;
said imaging includes imaging light from said source through said actuated light gates into said record anamorphically only as to a dimension of said spatially concentrated light corresponding to a longitudinal dimension of said elongate light gates; and
said projecting includes projecting said collimated light through said actuated light gates onto said record.

54. In a method of converting a spatially concentrated light output into a band of light, the improvement comprising in combination the steps of:
emitting a first part of said light output from a source of said spatially concentrated light output to a first region, collimating said first part at said first region and reflecting said collimated first part from said first region to a first portion of an elongate second region;
emitting a second part of said light output from said source to a third region, collimating said second part at said third region and reflecting said collimated second part from said third region to a second portion of said elongate second region, said second portion being spaced by a third portion from said first portion;
providing for a third part of said light output a folded light path leading from said source to an elongate fourth region, hence by reflection to a fifth region, and thence by reflection to said third portion of said elongate second region; and
emitting said third part of said light output along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region.

55. A method as claimed in claim 54, including the step of:
arranging said first and third regions symmetrically relative to said fourth region.

56. A method as claimed in claim 54, including the steps of:
providing in said first region a first curved reflecting surface for reflecting said first part of said light output to said first portion of the elongate second region; and
providing in said third region a second curved reflecting surface for reflecting said second part of said light output to said second portion of the elongate second region.

57. A method as claimed in claim 54, including the steps of:

providing in said first region a first concavely curved reflecting surface for reflecting said first part of said light output to said first portion of the elongate second region; and providing in said third region a second concavely curved reflecting surface for reflecting said second part of said light output to said second portion of the elongate second region.

58. A method as claimed in claim 54, including the step of:

providing in one of said fourth and fifth regions a curved reflecting surface for said third part of said light output.

59. A method as claimed in claim 54, including the step of:

providing in one of said fourth and fifth regions a concavely curved reflecting surface for said third part of said light output.

60. A method as claimed in claim 54, including the step of:

situating said fifth region closer to said source than said fourth region.

61. A method as claimed in claim 54, including the step of:

offsetting said elongate fifth region laterally from a plane through said source of said spatially concentrated light and a longitudinal dimension of said elongate fourth region.

62. A method as claimed in claim 54, including the steps of:

arranging said first, second and third regions in a common plane;

projecting said collimated first part of said light output along said common plane from said first region to said first portion of the second region;

projecting said collimated second part of said light output along said common plane from said third region to said second portion of the second region; and projecting said third part of said light output in part along said common plane to said third portion of the second region.

63. In a method of recording varying electric signals, the improvement comprising in combination the steps of:

providing a source of spatially concentrated light;

providing a folded light path leading from said source of spatially concentrated light to a spaced elongate first region, hence to an elongate second region located closer to said source than said first region, and thence to an elongate third region;

arranging said first, second and third regions in a common plane;

providing a first transparent plate with partially transparent first reflecting surface along said elongate first region, and a second transparent plate with partially transparent second reflecting surface along said elongate second region;

emitting light from said source through said second transparent plate and partially transparent second surface to said elongate first region, hence by reflection by said first reflecting surface back to said elongate second region, and thence by reflection by said second reflecting surface through said first transparent plate and partially transparent first surface to said elongate third region;

collimating said emitted light into a band of light by curving one of said first and second reflecting surfaces concavely and the other of said first and second reflecting surfaces convexly in the direction of elongation of the particular elongate region;

modulating said band of light with said varying electric signals to provide along said band light outputs varying as a function of said varying electric signals; and recording said varying light outputs.

64. A method as claimed in claim 63, wherein:

said modulation includes the step of selectively gating with said electric signals different elemental portions of said band of light to provide a light spot shifting as a function of said varying electric signals; and said recording includes the step of recording said shifting light spot as an oscillograph trace.

65. A method as claimed in claim 63, wherein:

said modulation includes the steps of subjecting light from said band to light-blocking crossed polarization, and selectively overcoming the light-blocking property of said crossed polarization to provide said light outputs varying as a function of said varying electric signals.

66. A method as claimed in claim 63, wherein:

said modulation includes the step of subjecting light from said band to light-blocking crossed polarization, selectively gating with said electric signals different elemental areas of said band of light through said crossed polarization by locally overcoming the light-blocking property of said crossed polarization to provide a light spot shifting as a function of said varying electric signals; and said recording includes the step of recording said shifting light spot as an oscillograph trace.

67. In a method of recording varying electric signals, the improvement comprising in combination the steps of:

providing a source of spatially concentrated light;

emitting a first part of said light from said source of spatially concentrated light to a first region, collimating said first part at said first region and reflecting said collimated first part from said first region to a first portion of an elongate second region;

emitting a second part of said light from said source to a third region, collimating said second part at said third region and reflecting said collimated second part from said third region to a second portion of said elongate second region, said second portion being spaced by a third portion from said first portion;

providing for a third part of said light a folded light path leading from said source to an elongate fourth region, hence by reflection to a fifth region, and thence by reflection to said third portion of said elongate second region;

emitting said third part of said light along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region;

modulating said continuous band of light with said varying electric signals to provide along said continuous band light outputs varying as a function of said varying electric signals; and recording said varying light outputs.

68. A method as claimed in claim 67, wherein:

said modulation includes the step of selectively gating with said electric signals different elemental portions of said continuous band of light to provide a light spot shifting as a function of said varying electric signals; and said recording includes the step of recording said shifting light spot as an oscillograph trace.

69. A method as claimed in claim 67, including the step of:

arranging said first and third regions symmetrically relative to said fourth region.

70. A method as claimed in claim 67, including the steps of:

providing in said first region a first curved reflecting surface for reflecting said first part of said light output to said first portion of the elongate second region; and providing in said third region a second curved reflecting surface for reflecting said second part of said light output to said second portion of the elongate second region.

71. A method as claimed in claim 67, including the steps of:

providing in said first region a first concavely curved reflecting surface for reflecting said first part of said light output to said first portion of the elongate second region; and providing in said third region a second concavely curved reflecting surface for reflecting said second part of said light output to said second portion of the elongate second region.

72. A method as claimed in claim 67, including the step of:

providing in one of said fourth and fifth regions a curved reflecting surface for said third part of said light output.

73. A method as claimed in claim 67, including the step of:

providing in one of said fourth and fifth regions a concavely curved reflecting surface for said third part of said light output.

74. A method as claimed in claim 67, including the step of:

situating said fifth region closer to said source than said fourth region.

75. A method as claimed in claim 67, including the step of:

offsetting said elongate fifth region laterally from a plane through said source of said spatially concentrated light and a longitudinal dimension of said elongate fourth region.

76. A method as claimed in claim 67, including the steps of:

arranging said first, second and third regions in a common plane;

projecting said collimated first part of said light output along said common plane from said first region to said first portion of the second region;

projecting said collimated second part of said light output along said common plane from said third region to said second portion of the second region; and projecting said third part of said light output in part along said common plane to said third portion of the second region.

77. In a method of reading information perceptible upon illumination, the improvement comprising in combination the steps of:

providing a source of spatially concentrated light;

providing a folded light path leading from said source of spatially concentrated light to a spaced elongate first region, hence to an elongate second region located closer to said source than said first region, and thence to an elongate third region;

arranging said first, second and third regions in a common plane;

providing a first transparent plate with partially transparent first reflecting surface along said elongate first region, and a second transparent plate with partially transparent second reflecting surface along said elongate second region;

emitting light from said source through said second transparent plate and partially transparent second surface to said elongate first region, hence by reflection by said first reflecting surface back to said elongate second region, and thence by reflection by said second reflecting surface through said first transparent plate and partially transparent first surface to said elongate third region;

collimating said emitted light into a band of light by curving one of said first and second reflecting surfaces concavely and the other of said first and second reflecting surfaces convexly in the direction of elongation of the particular elongate region;

subdividing said band of light into elemental portions;

successively gating said elemental portions to said information for successively illuminating elemental areas of said information; and reading said illuminated elemental areas.

78. A method as claimed in claim 77, including the step of:

curving another of said reflecting surfaces convexly.

79. In a method of reading information perceptible upon illumination, the improvement comprising in combination the steps of:

providing a source of as spatially concentrated light;

emitting a first part of said light from said source of spatially concentrated light to a first region, collimating said first part at said first region and reflecting said collimated first part from said first region to a first portion of an elongate second region;

emitting a second part of said light from said source to a third region, collimating said second part at said third region and reflecting said collimated second part from said third region to a second portion of said elongate second region, said second portion being spaced by a third portion from said first portion;

providing for a third part of said light output a folded light path leading from said source to an elongate fourth region, hence by reflection to a fifth region, and thence by reflection to said third portion of said elongate second region;

emitting said third part of said light output along said folded light path from said source to said elongate fourth region in the form of a divergent sheet extending to said collimated first and second parts, projecting said third part from said fourth region to said third portion of said elongate second region and providing a continuous band of light extending over said first, second and third portions of said elongate second region by collimating light from said divergent sheet at said fourth region into a band of light extending over said third portion upon projection from said fourth region;

subdividing said band of light into elemental portions;

successively gating said elemental portions to said information for successively illuminating elemental areas of said information; and reading said illuminated elemental areas.

80. A method as claimed in claim 79, including the step of:
arranging said first and third regions symmetrically relative to said fourth region.

81. A method as claimed in claim 79, including the steps of:
providing in said first region a first curved reflecting surface for reflecting said first part of said light output to said first portion of the elongate second region; and
providing in said third region a second curved reflecting surface for reflecting said second part of said light output to said second portion of the elongate second region.

82. A method as claimed in claim 79, including the steps of:
providing in said first region a first concavely curved reflecting surface for reflecting said first part of said light output to said first portion of the elongate second region; and
providing in said third region a second concavely curved reflecting surface for reflecting said second part of said light output to said second portion of the elongate second region.

83. A method as claimed in claim 79, including the step of:
providing in one of said fourth and fifth regions a curved reflecting surface for said third part of said light output.

84. A method as claimed in claim 79, including the step of:
providing in one of said fourth and fifth regions a concavely curved reflecting surface for said third part of said light output.

85. A method as claimed in claim 79, including the step of:
situating said fifth region closer to said source than said fourth region.

86. A method as claimed in claim 79, including the step of:
offsetting said elongate fifth region laterally from a plane through said source of said spatially concentrated light and a longitudinal dimension of said elongate fourth region.

87. A method as claimed in claim 79, including the steps of:
arranging said first, second and third regions in a common plane;
projecting said collimating first part of said light output along said common plane from said first region to said first portion of the second region;
projecting said collimated second part of said light output along said common plane from said third region to said second portion of the second region; and
projecting said third part of said light output in part along said common plane to said third portion of the second region.

88. In apparatus for selectively illuminating a surface, the improvement comprising in combination:
a slit traveling transversely to a longitudinal dimension of said slit for a predetermined distance;
a source of spatially concentrated light; and
an anamorphic light projecting system including means for spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said traveling slit onto said surface anamorphically only as to a dimension of said spatially concentrated light corresponding to said longitudinal dimension of the slit.

89. Apparatus as claimed in claim 88, wherein:
said collimating means include refractive means for collimating at least part of said spread light.

90. Apparatus as claimed in claim 88, wherein:
said collimating means include a collimating lens.

91. Apparatus as claimed in claim 88, wherein:
said collimating means include a reflective curved surface for collimating at least part of said spread light.

92. Apparatus as claimed in claim 88, wherein:
said collimating means include a folded light path for at least part of said spread light; and
said projecting means include means for projecting said part along a folded light path.

93. Apparatus as claimed in claim 88, 89, 90, 91 or 92, including:
means for providing said transversely traveling slit, including a plurality of elongate light gates arranged side by side over said transverse travel, and means for selectively actuating said light gates; and
said imaging means including means for imaging light from said source through said actuated light gates onto said surface anamorphically only as to a dimension of said spatially concentrated light corresponding to a longitudinal dimension of said elongate light gates.

94. In apparatus for selectively illuminating a surface, the improvement comprising in combination:
a slit traveling transversely to a longitudinal dimension of said slit;
a source of spatially concentrated light; and
an anamorphic light projecting system including:
means for emitting a first part of said light from said source to a first region;
means at said first region for reflecting said first part from said first region;
means spaced from said first region for receiving said reflected first part, collimating said received first part and projecting said collimated first part to a first portion of an elongate second region and through said slit onto said surface;
said emitting, reflecting and projecting means including means for imaging said first part of the light from said source via said first region, second region and slit onto said surface anamorphically only as to a dimension of said spatially concentrated light corresponding to said longitudinal dimension of the slit;

means for emitting a second part of said light from said source to a third region;

means at said third region for reflecting said second part from said third region; and means spaced from said third region for receiving said reflected second part, collimating said received second part and projecting said collimated second part to a second portion of said elongate second region and through said slit onto said surface;

said means for emitting, reflecting and projecting said second part including means for imaging said second part of the light from said source via said third region, second region and slit onto said surface anamorphically only as to a dimension of said spatially concentrated light corresponding to said longitudinal dimension of the slit.

95. Apparatus as claimed in claim 94, wherein:
said collimating means include refractive means for collimating said reflected first and second parts of said light.

96. In apparatus for selectively illuminating a surface, the improvement comprising in combination:

a slit traveling transversely to a longitudinal dimension of said slit;

a source of spatially concentrated light; and an anamorphic light projecting system including:

means for emitting a first part of said light from said source to a first region;

means at said first region for collimating said first part at said first region and for reflecting said collimated first part from said first region to a first portion of an elongate second region;

said emitting, collimating and reflecting means including means for projecting said reflected collimated first part through said second region and said slit onto said surface and for imaging said first part of the light from said source via said first region, second region and slit onto said surface anamorphically only as to a dimension of said spatially concentrated light corresponding to said longitudinal dimension of the slit;

means for emitting a second part of said light from said source to a third region;

means at said third region for collimating said second part at said third region and for reflecting said collimated second part from said third region to a second portion of an elongate second region, said second portion being spaced by a third portion from said first portion;

said means for emitting, collimating and reflecting said second part including means for projecting said reflected collimated second part through said second region and said slit onto said surface and for imaging said second part of the light from said source via said third region, second region and slit onto said surface anamorphically only as to a dimension of said spatially concentrated light corresponding to said longitudinal dimension of the slit;

means for emitting a third part of said light from said source to a fourth region; and means at said fourth region for collimating said third part at said fourth region and for projecting said collimated third part from said fourth region to said third portion of said elongate second region;

said means for emitting, collimating and projecting said third part including means for projecting said collimated third part through said second region and said slit onto said surface and for imaging said third part of the light from said source via said fourth region, second region and slit onto said surface anamorphically only as to a dimension of said spatially concentrated light corresponding to said longitudinal dimension of the slit.

97. Apparatus as claimed in claim 96, wherein:
said means for collimating said third part include refractive collimating means.

98. Apparatus as claimed in claim 96, wherein:
said means for collimating said third part include a collimating lens.

99. Apparatus as claimed in claim 96, wherein:
said means for collimating said third part include a reflective curved surface.

100. Apparatus as claimed in claim 96, wherein:
said means for collimating said third part include a folded light path; and
said projecting means include means for projecting said third part along said folded light path.

101. Apparatus as claimed in claim 94, 95, 96, 97, 98, 99 or 100, including:

means for providing said transversely traveling slit, including a plurality of elongate light gates arranged side by side over said transverse travel, and means for selectively actuating said light gates;

said imaging means including means for imaging light from said source through said actuated light gates onto said surface anamorphically only as to a dimension of said spatially concentrated light corresponding to a longitudinal dimension of said elongate light gates; and said projecting means including means for projecting said collimated light through said actuated light gates onto said surface.

102. In apparatus for recording varying electric signals on a light-sensitive recording medium, the improvement comprising in combination:

a slit traveling transversely to a longitudinal dimension of said slit for a predetermined distance;

means for modulating the travel of said slit with said varying electric signals;

a source of spatially concentrated light; and an anmorphic light projecting system including means for spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said traveling slit onto said recording medium anamorphically only as to a dimension of said spatially concentrated light corresponding to said longitudinal dimension of the slit; and means for recorings said traveling spot.

103. Apparatus as claimed in claim 102, wherein:
said collimating means include refractive means for collimating at least part of said spread light.

104. Apparatus as claimed in claim 102, wherein:
said collimating means include a collimating lens.

105. Apparatus as claimed in claim 102, wherein:
said collimating means include a reflective curved surface for collimating at least part of said spread light.

106. Apparatus as claimed in claim 102, wherein:
said collimating means include a folded light path for at least part of said spread light; and said projecting means include means for projecting said part along said folded light path.

107. Apparatus as claimed in claim 102, 103, 104, 105 or 106, wherein:
said apparatus includes a plurality of elongate light gates arranged side by side for providing said transversely traveling slit;
said modulating means include means for selectively actuating said light gates in response to said varying electric signals; and
said imaging means including means for imaging light from said source through said actuated light gates onto said recording medium anamorphically only as to a dimension of said spatially concentrated light corresponding to a longitudinal dimension of said elongate light gates.

108. In apparatus for recording varying electric signals on a light-sensitive recording medium, the improvement comprising in combination:
a slit traveling transversely to a longitudinal dimension of said slit;
means for modulating the travel of said slit with said varying electric signals;
a source of spatially concentrated light; and
an anamorphic light projecting system including:
means for emitting a first part of said light from said source to a first region;
means at said first region for reflecting said first part from said first region;
means spaced from said first region for receiving said reflected first part, collimating said received first part and projecting said collimated first part to a first portion of an elongate second region and through said slit onto said recording medium;
said emitting, reflecting and projecting means including means for imaging said first part of the light from said source via said first region, second region and slit onto said recording medium anamorphically only as to a dimension of said spatially concentrated light corresponding to said longitudinal dimension of the slit;
means for emitting a second part of said light from said source to a third region;
means at said third region for reflecting said second part from said third region; and
means spaced from said third region for receiving said reflected second part, collimating said received second part and projecting said collimated second part to a second portion of said elongate second region and through said slit onto said recording medium;
said means for emitting, reflecting and projecting said second part including means for imaging said second part of the light from said source via said third region, second region and slit onto said recording medium anamorphically only as to a dimension of said spatially concentrated light corresponding to said longitudinal dimension of the slit.

109. Apparatus as claimed in claim 108, wherein:
said collimating means include refractive means for collimating said reflected first and second parts of said light.

110. In apparatus for recording varying electric signals on a light-sensitive recording medium, the improvement comprising in combination:
a slit traveling transversely to a longitudinal dimension of said slit;
means for modulating the travel of said slit with said varying electric signals;
a source of spatially concentrated light; and
an anamorphic light projecting system including:
means for emitting a first part of said light from said source to a first region;
means at said first region for collimating said first part at said first region and for reflecting said collimated first part from said first region to a first portion of an elongate second region;
said emitting, collimating and reflecting means including means for projecting said reflected collimated first part through said second region and said slit onto said recording medium and for imaging said first part of the light from said source via said first region, second region and slit onto said recording medium anamorphically only as to a dimension of said spatially concentrated light corresponding to said longitudinal dimension of the slit;
means for emitting a second part of said light from said source to a third region;
means at said third region for collimating said second part at said third region and for reflecting said collimated second part from said third region to a second portion of an elongate second region, said second portion being spaced by a third portion from said first portion;
said means for emitting, collimating and reflecting said second part including means for projecting said reflected collimated second part through said second region and said slit onto said recording medium and for imaging said second part of the light from said source via said third region, second region and slit onto said recording medium anamorphically only as to a dimension of said spatially concentrated light corresponding to said longitudinal dimension of the slit;
means for emitting a third part of said light from said source to a fourth region; and
means at said fourth region for collimating said third part at said fourth region and for projecting said collimated third part from said fourth region to said third portion of said elongate second region;
said means for emitting, collimating and projecting said third part including means for projecting said collimated third part through said second region and said slit onto said recording medium and for imaging said third part of the light from said source via said fourth region, second region and slit onto said recording medium anamorphically only as to a dimension of said spatially concentrated light corresponding to said longitudinal dimension of the slit.

111. Apparatus as claimed in claim 110, wherein:
said means for collimating said third part include refractive collimating means.

112. Apparatus as claimed in claim 110, wherein:
said means for collimating said third part include a collimating lens.

113. Apparatus as claimed in claim 110, wherein:
said means for collimating said third part include a reflective curved surface.

114. Apparatus as claimed in claim 110, wherein:
said means for collimating said third part include a folded light path; and
said projecting means include means for projecting said third part along said folded light path.

115. Apparatus as claimed in claim 108, 109, 110, 111, 112, 113 or 114, wherein:
- said apparatus includes a plurality of elongate light gates arranged side by side for providing said transversely traveling slit;
- said modulating means include means for selectively actuating said light gates in response to said varying electric signals;
- said imaging means include means for imaging light from said source through said actuated light gates onto said recording medium anamorphically only as to a dimension of said spatially concentrated light corresponding to a longitudinal dimension of said elongate light gates; and
- said projecting means include means for projecting said collimated light through said actuated light gates onto said recording medium.

116. In apparatus for recording varying electric signals on a light-sensitive recording medium having a given width, the improvement comprising in combination:
- a slit traveling transversely to a longitudinal dimension of said slit for an extent of travel wider than said given width;
- means for modulating the travel of said slit with said varying electric signals;
- a source of spatially concentrated light;
- means for spreading light from said source in a plane parallel to, and for the extent of, the transverse travel of the slit;
- means for collimating said spread light for the extent of said transverse travel and projecting said collimating light onto said transversely traveling slit for selective gating by said slit;
- means for converging projected light gated by said traveling slit down to a width smaller than said extent of said transverse travel of the slit; and
- means for imaging said converged light onto said recording medium, including means for imaging light from said source through said slit onto said recording medium anamorphically as to a dimension of said spatially concentrated light corresponding to said longitudinal dimension of the slit.

117. Apparatus as claimed in claim 116, wherein:
- said collimating means include first lens means for collimating said spread light; and
- said converging means include second lens means for converging said gated projected light.

118. Apparatus as claimed in claim 116 or 117, wherein:
- said imaging means include lens means for imaging said gated projected light along a line on said recording medium.

119. Apparatus as claimed in claim 116, wherein:
- said apparatus includes a plurality of elongate light gates arranged side by side for providing said transversely traveling slit;
- said modulating means include means for selectively actuating said light gates in response to said varying electric signals;
- said spreading means include means for spreading light from said source for the extent of said arranged light gates;
- said collimating and projecting means include means for collimating said spread light for the extent of said arranged light gates and for projecting said collimated light onto said arranged light gates for selective gating by said actuated light gates;
- said converging means include means for converging projected light gated by said selectively actuated light gates down to a width smaller than said extent of said arranged light gates; and
- said imaging means include means for imaging light from said source through said actuated light gates onto said surface anamorphically as to a dimension of said spatially concentrated light corresponding to a longitudinal dimension of said elongate light gates.

120. In apparatus for reading information perceptible upon illumination of a record of said information, the improvement comprising in combination:
- a source of spatially concentrated light;
- a slit traveling transversely to a longitudinal dimension of said slit for a predetermined distance, for an illumination of elemental areas of said record;
- an anamorphic light projecting system including means for spreading light from said source in a plane parallel to the transverse travel of the slit and across said predetermined distance of transverse travel of the slit, means for collimating said spread light, and means for focusing said spread light into a traveling spot on said surface, including means for imaging said spread light from said source through said traveling slit onto said record anamorphically only as to a dimension of said spatially concentrated light corresponding to said longitudinal dimension of the slit; and
- means for reading illuminated elemental areas of said record with the aid of said traveling spot.

121. Apparatus as claimed in claim 120, wherein:
said collimating means include refractive means for collimating at least part of said spread light.

122. Apparatus as claimed in claim 120, wherein:
said collimating means include a collimating lens.

123. Apparatus as claimed in claim 120, wherein:
said collimating means include a reflective curved surface for collimating at least part of said spread light.

124. Apparatus as claimed in claim 120, wherein:
- said collimating means include a folded light path for at lease part of said spread light; and
- said projecting means include means for projecting said part along a folded light path.

125. Apparatus as claimed in claim 120, 121, 122, 123 or 124, including:
- means for providing said transversely traveling slit, including a plurality of elongate light gates arranged side by side over said transverse travel, and means for selectively actuating said light gates; and
- said imaging means including means for imaging light from said source through said actuated light gates onto said record anamorphically only as to a dimension of said spatially concentrated light corresponding to a longitudinal dimension of said elongate light gates.

126. In apparatus for reading information perceptible upon illumination of a record of said information, the improvement comprising in combination
- a source of spatially concentrated light;
- a slit traveling transversely to a longitudinal dimension of said slit for an illumination of elemental areas of said record; and
- an anamorphic light projecting system including:
- means for emitting a first part of said light from said source to a first region;

means at said first region for reflecting said first part from said first region;

means spaced from said first region for receiving said reflected first part, collimating said received first part and projecting said collimated first part to a first portion of an elongate second region and through said slit onto said record;

said emitting, reflecting and projecting means including means for imaging said first part of the light from said source via said first region, second region and slit onto said record anamorphically only as to a dimension of said spatially concentrated light corresponding to said longitudinal dimension of the slit;

means for emitting a second part of said light from said source to a third region;

means at said third region for reflecting said second part from said third region; and means spaced from said third region for receiving said reflected second part, collimating said received second part and projecting said collimated second part to a second portion of said elongate second region and through said slit onto said record;

said means for emitting, reflecting and projecting said second part including means for imaging said second part of the light from said source via said third region, second region and slit onto said record anamorphically only as to a dimension of said spatially concentrated light corresponding to said longitudinal dimension of the slit; and said apparatus including means for reading illuminated elemental areas of said record.

127. Apparatus as claimed in claim 126, wherein:
said collimating means include refractive mans for collimating said reflected first and second parts of said light.

128. In apparatus for reading information perceptible upon illumination of a record of said information, the improvement comprising in combination:

a source of spatially concentrated light;

a slit traveling transversely to a longitudinal dimension of said slit for an illumination of elemental areas of said record; and an anamorphic light projecting system including:

means for emitting a first part of said light from said source to a first region;

means at said first region for collimating said first part at said first region and for reflecting said collimated first part from said first region to a first portion of an elongate second region;

said emitting, collimating and reflecting means including means for projecting said reflected collimated first part through said second region and said slit onto said record and for imaging said first part of the light from said source via said first region, second region and slit onto said record anamorphically only as to a dimension of said spatially concentrated light corresponding to said longitudinal dimension of the slit;

means for emitting a second part of said light from said source to a third region;

means at said third region for collimating said second part at said third region and for reflecting said collimated second part from said third region to a second portion of an elongate second region, said second portion being spaced by a third portion from said first portion;

said means for emitting, collimating and reflecting said second part including means for projecting said reflected collimated second part through said second region and said slit onto said record and for imaging said second part of the light from said source via said third region, second region and slit onto said record anamorphically only as to a dimension of said spatially concentrated light corresponding to said longitudinal dimension of the slit;

means for emitting a third part of said light from said source to a fourth region; and means at said fourth region for collimating said third part at said fourth region and for projecting said collimated third part from said fourth region to said third portion of said elongate second region;

said means for emitting, collimating and projecting said third part including means for projecting said collimated third part through said second region and said slit onto said record and for imaging said third part of the light from said source via said fourth region, second region and slit onto said record anamorphically only as to a dimension of said spatially concentrated light corresponding to said longitudinal dimension of the slit; and said apparatus including means for reading illuminated elemental areas of said record.

129. Apparatus as claimed in claim 128, wherein:
said means for collimating said third part include refractive collimating means.

130. Apparatus as claimed in claim 128, wherein:
said means for collimating said third part include a collimating lens.

131. Apparatus as claimed in claim 128, wherein:
said means for collimating said third part include a reflective curved surface 132. Apparatus as claimed in claim 128, wherein:
said means for collimating said third part include a folded light path; and
said projecting means include means for projecting said third part along said folded light path.

133. Apparatus as claimed in claim 126, 127, 128, 129, 130, 131 or 132, including:
means for providing said transversely traveling slit, including a plurality of elongate light gates arranged side by side over said transverse travel, and means for selectively actuating said light gates;
said imaging means including means for imaging light from said source through said actuated light gates onto said record anamorphically only as to a dimension of said spatially concentrated light corresponding to a longitudinal dimension of said elongate light gates; and
said projecting means including means for projecting said collimated light through said actuated light gates onto said record.

134. In apparatus for converting a spatially concentrated light output into a band of light, the improvement comprising in combination:
means for providing a folded light path leading from a source of spatially concentrated light output to a spaced elongate first region, hence to an elongate second region located closer to said source than said first region, and thence to an elongate third region;
means for arranging said first, second and third regions in a common plane;
said folded light path providing means including a first transparent plate with partially transparent first reflecting surface along said elongate first region and a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light; and means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region.

135. In apparatus for converting a spatially concentrated light output into a band of light, the improvement comprising in combination:

means for emitting a first part of said light output from a source of said spatially concentrated light output to a first region;

means at said first region for collimating said first part and for reflecting said collimated first part from said first region to a first portion of an elongate second region;

means for emitting a second part of said light output from said source to a third region;

means at said third region for collimating said second part and for reflecting said collimated second part from said third region to a second portion of said elongate second region, said second portion being spaced by a third portion from said first portion; and a folded light path including means for emitting a third part of said light output from said source to an elongate fourth region in the form of a divergent sheet extending to said collimated first and second parts and means for projecting said third part from said fourth region by reflection to a fifth region and thence by reflection to said third portion of said elongate second region and for collimating light from said divergent sheet into a band of light extending over said third portion upon projection from said fourth region; with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region.

136. Apparatus as claimed in claim 135, wherein:
said first and third regions extend symmetrically relative to said fourth region.

137. Apparatus as claimed in claim 135, wherein:
said means for collimating said first part of said light output include means in said first region having a first curved reflecting surface for reflecting said first part of said light output to said first portion of the elongate second region; and said means for collimating said second part of said light output include means in said third region having a second curved reflecting surface for reflecting said second part of said light output to said second portion of the elongate second region.

138. Apparatus as claimed in claim 135, wherein:
said means for collimating said first part of said light output include means in said first region having a first concavely curved reflecting surface for reflecting said first part of said light output to said first portion of the elongate second region; and said means for collimating said second part of said light output include means in said third region having a second concavely curved reflecting surface for reflecting said second part of said light output to said second portion of the elongate second region.

139. Apparatus as claimed in claim 135, wherein:
said projecting means include means in one of said fourth and fifth regions having a curved reflecting surface for said third part of said light output.

140. Apparatus as claimed in claim 135, wherein:
said projecting means include means in one of said fourth and fifth regions having a concavely curved reflecting surface for said third part of said light output.

141. Apparatus as claimed in claim 135, wherein:
said fifth region is closer to said source than said fourth region.

142. Apparatus as claimed in claim 135, wherein:
said fifth region is laterally offset from a plane through said source of said spatially concentrated light and a longitudinal dimension of said elongate fourth region.

143. Apparatus as claimed in claim 135, wherein:
said first, second and third regions are in a common plane;

said means for collimating said first part of said light output include means for projecting said first part of said light output along said common plane from said first region to said first portion of the second region;

said means for collimating said second part of said light output include means for projecting said second part of said light output along said common plane from said third region to said second portion of the second region; and said means for projecting said third part of said light output include means for projecting said third part of said light output at least in part along said common plane to said third portion of the second region.

144. In apparatus for recording varying electric signals, the improvement comprising in combination:
a source of spatially concentrated light;

means for providing a folded light path leading from said source of spatially concentrated light to a spaced elongate first region, hence to an elongate second region located closer to said source than said first region, and thence to an elongate third region;

means for arranging said first, second and third regions in a common plane;

said folded light path providing means including a first transparent plate with partially transparent first reflecting surface along said elongate first region, a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light;

means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region;

means for modulating said band of light with said varying electric signals to provide along said band light outputs varying as a function of said varying electric signals; and means for recording said varying light outputs.

145. Apparatus as claimed in claim 144, wherein:

said modulation means include means for selectively gating with said electric signals different elemental portions of said band of light to provide a light spot shifting as a function of said varying electric signals; and said recording means include means for recording said shifting light spot as an oscillograph trace.

146. Apparatus as claimed in claim 144, wherein:

said modulation means include means for subjecting light from said band to light-blocking crossed polarization, and means for selectively overcoming the light-blocking property of said crossed polarization to provide said light outputs varying as a function of said varying electric signals.

147. Apparatus as claimed in claim 144, wherein:

said modulation means include means for subjecting light from said band to light-blocking crossed polarization, and means for selectively gating with said electric signal different elemental areas of said band of light through said crossed polarization by locally overcoming the light-blocking property of said crossed polarization to provide a light spot shifting as a function of said varying electric signals; and said recording means include means for recording said shifting light spot as an oscillograph trace.

148. In apparatus for recording varying electric signals, the improvement comprising in combination:

a source of spatially concentrated light;

means for providing a folded light path leading from said source of a spatially concentrated light to a spaced elongate first region, hence to an elongate second region, thence to an elongate third region and thence to an elongate fourth region;

said folded light path providing means including means for providing a first reflecting surface along said elongate first region, a second reflecting surface along said elongate second region, and a third reflecting surface along said elongate third region;

means for emitting light from said source to said elongate first region in the form of a divergent sheet of light, hence by reflection by said first reflecting surface to said elongate second region thence by reflection by said second reflecting surface to said elongate third region and thence by reflection by said third reflecting surface to said elongate fourth region;

at least one of said first, second and third reflecting surfaces being curved in the direction of elongation of the particular elongate region and another of said reflecting surfaces being convex, for collimating said emitted light into a band of light;

means for modulating said band of light with said varying electric signals to provide along said band light outputs varying as a function of said varying electric signals; and means for recording said varying light outputs.

149. Apparatus as claimed in claim 148, wherein:

said modulation means include means for selectively gating with said electric signals different elemental portions of said band of light to provide a light spot shifting as a function of said varying electric signals; and said recording means include means for recording said shifting light spot as an oscillograph trace.

150. Apparatus as claimed in claim 148, wherein:

said second region is closer to said source than said first region.

151. Apparatus as claimed in claim 148, wherein:

said second region is closer to said source than said first region; and said third region is farther from said source than said second region.

152. Apparatus as claimed in claim 148, wherein:

said elongate second region is laterally offset from a plane through said source of spatially concentrated light and a longitudinal dimension of said elongate first region.

153. Apparatus as claimed in claim 148, wherein:

said one reflecting surface is concave.

154. Apparatus as claimed in claim 148, wherein:

said modulation means include means for subjecting light from said band to light-blocking crossed polarization, and means for selectively overcoming the light-blocking property of said crossed polarization to provide said light outputs varying as a function of said varying electric signals.

155. Apparatus as claimed in claim 148, wherein:

said modulation means include means for subjecting light from said band to light-blocking crossed polarization, and means for selectively gating with said electric signals different elemental areas of said band of light through said crossed polarization by locally overcoming the light-blocking property of said crossed polarization to provide a light spot shifting as a function of said varying electric signals; and said recording means include means for recording said shifting light spot as an oscillograph trace.

156. In apparatus for recording varying electric signals, the improvement comprising in combination:

a source of spatially concentrated light;

means for emitting a first part of said light from said source of spatially concentrated light to a first region;

means at said first region for collimating said first part and for reflecting said collimated first part from said first region to a first portion of an elongate second region;

means for emitting a second part of said light from said source to a third region;

means at said third region for collimating said second part and for reflecting said collimated second part from said third region to a second portion of said elongate second region, said second portion being spaced by a third portion from said first portion;

a folded light path including means for emitting a third part of said light from said source to an elongate fourth region in the form of a divergent sheet extending to said collimated first and second parts and means for projecting said third part from said fourth region by reflection to a fifth region and thence by reflection to said third part of said elongate second region and for collimating light from said divergent sheet into a band of light extending over said third portion upon projection from said fourth region; with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region;

means for modulating said continuous band of light with said varying electric signals to provide along said continuous band light outputs varying as a function of said varying electric signals; and means for recording said varying light outputs.

157. Apparatus as claimed in claim 156, wherein:

said modulation means include means for selectively gating with said electric signals different elemental portions of said continuous band of light to provide a light spot shifting as a function of said varying electric signals; and said recording means include means for recording said shifting light spot as an oscillograph trace.

158. Apparatus as claimed in claim 156, wherein:

said means for collimating said first part of said light include means for providing in said first region a first curved reflecting surface for reflecting said first part of said light to said first portion of the elongate second region; and said means for collimating said second part of said light include means for providing in said third region a second curved reflecting surface for reflecting said second part of said light to said second portion of the elongate second region.

159. Apparatus as claimed in claim 156, wherein:

said means for collimating said first part of said light include means for providing in said first region a first concavely curved reflecting surface for reflecting said first part of said light to said first portion of the elongate second region; and said means for collimating said second part of said light include means for providing in said third region a second concavely curved reflecting surface for reflecting said second part of said light to said second portion of the elongate second region.

160. Apparatus as claimed in claim 156, wherein:

said projecting means include means in one of said fourth and fifth regions having a curved reflecting surface for said third part of said light.

161. Apparatus as claimed in claim 156, wherein:

said projecting means include means in one of said fourth and fifth regions having a concavely curved reflecting surface for said third part of said light.

162. Apparatus as claimed in claim 156, wherein:

said fifth region is closer to said source than said fourth region.

163. Apparatus as claimed in claim 156, wherein:

said fifth region is laterally offset from a plane through said source of said spatially concentrated light and a longitudinal dimension of said elongate fourth region.

164. Apparatus as claimed in claim 156, wherein:

said first, second and third regions are in a common plane;

said means for collimating said first part of said light include means for projecting said first part of said light along said common plane from said first region to said first portion of the second region;

said means for collimating said second part of said light include means for projecting said second part of said light along said common plane from said third region to said second portion of the second region; and said means for projecting said third part of said light include means for projecting said third part of said light at least in part along said common plane to said third portion of the second region.

165. In apparatus for reading information perceptible upon illumination, the improvement comprising in combination:

a source of spatially concentrated light;

means for providing a folded light path leading from said source of spatially concentrated light to a spaced elongate first region, hence to an elongate second region located closer to said source than said first region, and thence to an elongate third region;

means for arranging said first, second and third regions in a common plane;

said folded light path providing means including a first transparent plate with partially transparent first reflecting surface along said elongate first region, and a second transparent plate with partially transparent second reflecting surface along said elongate second region, one of said first and second reflecting surfaces being concavely curved and the other of said first and second reflecting surfaces being convexly curved in the direction of elongation of the particular elongate region for collimating light emitted from said source into a band of light;

means for emitting light from said source through said second transparent plate and partially transparent second surface to said elongate first region, hence by reflection by said first reflecting surface to said elongate second region, and thence by reflection by said second reflecting surface through said first transparent plate and partially transparent first surface to said elongate third region;

means for subdividing said band of light into elemental portions;

means for successively gating said elemental portions to said information for successively illuminating elemental areas of said information; and means for reading said illuminated elemental areas.

166. In apparatus for reading information perceptible upon illumination, the improvement comprising in combination:

a source of spatially concentrated light;

means for emitting a first part of said light from said source of spatially concentrated light to a first region;

means at said first region for collimating said first part and for reflecting said collimated first part from said first region to a first portion of an elongate second region;

means for emitting a second part of said light from said source to a third region;

means at said third region for collimating said second part and for reflecting said collimated second part from said third region to a second portion of said elongate second region, said second portion being spaced by a third portion from said first portion;

a folded light path including means for emitting a third part of said light from said source to an elongate fourth region in the form of a divergent sheet extending to said collimated first and second parts and means for projecting said third part from said fourth region to said third part of said elongate second region and for collimating light from said divergent sheet into a band of light extending over said third portion upon projection from said fourth region; with said means for reflecting said collimated first part, said means for reflecting said collimated second part and said means for projecting said third part and collimating light from said divergent sheet jointly constituting a means for providing a continuous band of collimated light extending over said first, second and third portions of said elongate second region;

means for subdividing said continuous band of light into elemental portions;

means for successively gating said elemental portions to said information for successively illuminating elemental areas of said information; and means for reading said illuminated elemental areas.

167. Apparatus as claimed in claim 166, wherein:
said first and third regions extend symmetrically relative to said fourth region.

168. Apparatus as claimed in claim 166, wherein:
said means for collimating said first part of said light include means for providing in said first region a first curved reflecting surface for reflecting said first part of said light to said first portion of the elongate second region; and
said means for collimating said second part of said light include means for providing in said third region a second curved reflecting surface for reflecting said second part of said light to said second portion of the elongate second region.

169. Apparatus as claimed in claim 166, wherein:
said means for collimating said first part of said light include means for providing in said first region a first concavely curved reflecting surface for reflecting said first part of said light to said first portion of the elongate second region; and
said means for collimating said second part of said light include means for providing in said third region a second concavely curved reflecting surface for reflecting said second part of said light to said second portion of the elongate second region.

170. Apparatus as claimed in claim 166, wherein:
said projecting means include means in one of said fourth and fifth regions having a curved reflecting surface for said third part of said light.

171. Apparatus as claimed in claim 166, wherein:
said projecting means include means in one of said fourth and fifth regions having a concavely curved reflecting surface for said third part of said light.

172. Apparatus as claimed in claim 166, wherein:
said fifth region is closer to said source than said fourth region.

173. Apparatus as claimed in claim 166, wherein:
said fifth region is laterally offset from a plane through said source of said spatially concentrated light and a longitudinal dimension of said elongate fourth region.

174. Apparatus as claimed in claim 166, wherein:
said first, second and third regions are in a common plane;
said means for collimating said first part of said light include means for projecting said first part of said light along said common plane from said first region to said first portion of the second region;
said means for collimating said second part of said light include means for projecting said second part of said light along said common plane from said third region to said second portion of the second region; and
said means for projecting said third part of said light include means for projecting said third part of said light at least in part along said common plane to said third portion of the second region.

175. A method as claimed in claim 1, 6, 8, 18, 23. 25, 35, or 37, wherein:
said source of spatially concentrated light is provided by providing a luminous arc having a height; and
said imaging includes the step of anamorphically imaging said height of the luminous arc through said traveling slit onto said surface.

176. Apparatus as claimed in claim 88, 94, 96, 102, 108, 110, 116, 120, 126 or 128, wherein:
said source of spatially concentrated light includes an arc gas discharge lamp for producing a luminous arc having a height; and
said imaging means include means for anamorphically imaging said height of the luminous arc onto said surface.

* * * * *